US012795935B2

(12) United States Patent
Tsutsumi et al.

(10) Patent No.: US 12,795,935 B2
(45) Date of Patent: Nov. 10, 2026

(54) THREE-DIMENSIONAL MEMORY ARRAY WITH DUAL-LEVEL PERIPHERAL CIRCUITS AND METHODS FOR FORMING THE SAME

(71) Applicant: Sandisk Technologies, Inc., Milpitas, CA (US)

(72) Inventors: Masanori Tsutsumi, Yokkaichi (JP); Kazutaka Yoshizawa, Yokkaichi (JP); Hiroyuki Ogawa, Nagoya (JP); Fumiaki Toyama, Cupertino, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 413 days.

(21) Appl. No.: 18/480,855

(22) Filed: Oct. 4, 2023

(65) Prior Publication Data

US 2024/0032299 A1 Jan. 25, 2024

Related U.S. Application Data

(63) Continuation-in-part of application No. 17/498,100, filed on Oct. 11, 2021, now Pat. No. 12,207,459,
(Continued)

(51) Int. Cl.
*H10B 43/40* (2023.01)
*H10B 41/10* (2023.01)
(Continued)

(52) U.S. Cl.
CPC ............. *H10B 43/40* (2023.02); *H10B 41/27* (2023.02); *H10B 41/35* (2023.02); *H10B 41/40* (2023.02); *H10B 43/27* (2023.02); *H10B 43/35* (2023.02); *H10B 43/50* (2023.02); *G11C 16/0483* (2013.01); *H10B 41/10* (2023.02);
(Continued)

(58) Field of Classification Search
CPC .. H10B 41/40; H10B 43/40; H10B 41/00–70; H10B 43/00–50
See application file for complete search history.

(56) References Cited

U.S. PATENT DOCUMENTS 5,915,167 A 6/1999 Leedy
9,530,790 B1 12/2016 Lu et al.
(Continued)

OTHER PUBLICATIONS

USPTO Office Communication, Non-Final Office Action for U.S. Appl. No. 17/347,810, mailed on Dec. 14, 2023, 27 pages.
(Continued)

*Primary Examiner* — Christine S. Kim
*Assistant Examiner* — Tyler J Wiegand
(74) *Attorney, Agent, or Firm* — THE MARBURY LAW GROUP PLLC

(57) ABSTRACT

A bonded assembly includes a memory die containing a three-dimensional memory array, a first logic die bonded to the memory die, a first peripheral circuit located in the logic die and configured to control operation of a first set of electrical nodes of the three-dimensional memory array, and a second peripheral circuit configured to control operation of a second set of electrical nodes of the three-dimensional memory array, where the second peripheral circuit is located at a different vertical level than the first peripheral circuit relative to the three-dimensional-memory array.

8 Claims, 64 Drawing Sheets

Related U.S. Application Data which is a continuation-in-part of application No. 17/347,810, filed on Jun. 15, 2021, now Pat. No. 12,004,348.

(51) Int. Cl.

| | |
|---|---|
| ***H10B 41/27*** | (2023.01) |
| ***H10B 41/35*** | (2023.01) |
| ***H10B 41/40*** | (2023.01) |
| ***H10B 41/43*** | (2023.01) |
| ***H10B 43/10*** | (2023.01) |
| ***H10B 43/27*** | (2023.01) |
| ***H10B 43/35*** | (2023.01) |
| ***H10B 43/50*** | (2023.01) |
| ***H10W 20/41*** | (2026.01) |
| ***H10W 20/42*** | (2026.01) |
| *G11C 16/04* | (2006.01) |

(52) U.S. Cl.

CPC .............. *H10B 41/43* (2023.02); *H10B 43/10* (2023.02); *H10W 20/42* (2026.01); *H10W 20/435* (2026.01)

(56) References Cited

U.S. PATENT DOCUMENTS

| | | | | |
|---|---|---|---|---|
| 9,935,050 | B2 | 4/2018 | Dunga et al. | |
| 10,283,493 | B1 | 5/2019 | Nishida | |
| 10,354,980 | B1 | 7/2019 | Mushiga et al. | |
| 10,354,987 | B1 | 7/2019 | Mushiga et al. | |
| 10,381,322 | B1 | 8/2019 | Azuma et al. | |
| 10,381,362 | B1 | 8/2019 | Cui et al. | |
| 10,453,860 | B1 | 10/2019 | Xiao | |
| 10,629,616 | B1 | 4/2020 | Kai et al. | |
| 10,665,580 | B1 | 5/2020 | Hosoda et al. | |
| 10,665,581 | B1 | 5/2020 | Zhou et al. | |
| 10,700,028 | B2 | 6/2020 | Nishida | |
| 10,734,400 | B1 | 8/2020 | Fukuo et al. | |
| 10,950,626 | B2 | 3/2021 | Kai et al. | |
| 10,957,680 | B2 | 3/2021 | Yada et al. | |
| 10,957,705 | B2 | 3/2021 | Totoki et al. | |
| 11,004,773 | B2 | 5/2021 | Wu et al. | |
| 11,011,506 | B2 | 5/2021 | Hosoda et al. | |
| 11,018,153 | B2 | 5/2021 | Kai et al. | |
| 11,037,908 | B2 | 6/2021 | Wu et al. | |
| 11,355,486 | B2 | 6/2022 | Mizutani et al. | |
| 11,569,259 | B2 | 1/2023 | Mizutani et al. | |
| 11,587,920 | B2 | 2/2023 | Alsmeier et al. | |
| 2005/0217560 | A1 | 10/2005 | Tolchinsky et al. | |
| 2014/0061750 | A1 | 3/2014 | Kwon et al. | |
| 2015/0162343 | A1 | 6/2015 | Park et al. | |
| 2015/0348987 | A1 | 12/2015 | Lee et al. | |
| 2016/0079164 | A1 | 3/2016 | Fukuzumi et al. | |
| 2017/0040338 | A1 | 2/2017 | Lee et al. | |
| 2017/0294377 | A1 | 10/2017 | Dunga et al. | |
| 2018/0277497 | A1 | 9/2018 | Matsuo | |
| 2018/0294270 | A1 | 10/2018 | Lee et al. | |
| 2019/0043836 | A1 | 2/2019 | Fastow et al. | |
| 2019/0221557 | A1* | 7/2019 | Kim | H10B 43/10 |
| 2019/0252361 | A1 | 8/2019 | Nishida | |
| 2020/0258876 | A1* | 8/2020 | Hosoda | G11C 16/08 |
| 2020/0321324 | A1 | 10/2020 | Sano et al. | |
| 2020/0343161 | A1 | 10/2020 | Wu et al. | |
| 2021/0028148 | A1 | 1/2021 | Wu et al. | |
| 2021/0035965 | A1 | 2/2021 | Mizutani et al. | |
| 2021/0159110 | A1 | 5/2021 | Or-Bach et al. | |
| 2021/0225736 | A1 | 7/2021 | Kim et al. | |
| 2021/0383874 | A1 | 12/2021 | Oh et al. | |
| 2022/0028846 | A1 | 1/2022 | Alsmeier et al. | |
| 2022/0045089 | A1 | 2/2022 | Mizutani et al. | |
| 2022/0102334 | A1 | 3/2022 | Kim et al. | |
| 2022/0130846 | A1 | 4/2022 | Kim et al. | |
| 2022/0344361 | A1 | 10/2022 | Jeon et al. | |
| 2022/0399358 | A1 | 12/2022 | Mizutani et al. | |
| 2022/0399362 | A1 | 12/2022 | Mizutani et al. | |
| 2023/0038557 | A1 | 2/2023 | Ogawa et al. | |
| 2023/0041950 | A1 | 2/2023 | Chibvongodze et al. | |
| 2023/0044232 | A1 | 2/2023 | Kai et al. | |
| 2023/0045001 | A1 | 2/2023 | Ogawa et al. | |

OTHER PUBLICATIONS

Chang, L. et al., "CMOS Circuit Performance Enhancement by Surface Orientation Optimization", IEEE Transactions on Electron Devices, vol. 51, No. 10, Oct. 2004. (Abstract Only).

Endoh et al., "Novel Ultra High Density Memory with a Stacked-Surrounding Gate Transistor (S-SGT) Structured Cell," IEDM Proc. (2001) 33-36.

Hopcroft, M. A. et al., "What is the Young's Modulus of Silicon?", IEEE Journal of Microelectromechanical Systems, vol. 19, Issue 2, pp. 229-238, 2010.

Ohmi, T. et al., "Science-based New Silicon Technologies Exhibiting Super High Performance due to Radical-reaction-based Semiconductor Manufacturing", Journal of the Korean Physical Society, vol. 59, No. 2, Aug. 2011, pp. 391-401.

Saito, S. et al., "Origin of Drivability Enhancement in Scaled pMOSFETs with 45• Rotated <100> channels", 2006 Symposium on VLSI Technology. Jun. 2006. (Abstract Only) Available at https://ieeexplore.ieee.org/document/1705261, visited Jan. 7, 2019.

Yang, M. et al., "Performance Dependence of CMOS on Silicon Substrate Orientation for Ultrathin Oxynitride and HfO2 Gate Dielectrics", IEEE Electron Device Letters, vol. 24, No. 5, May 2003.

U.S. Appl. No. 17/822,182, filed Aug. 25, 2022.

U.S. Appl. No. 18/350,573, filed Jul. 11, 2023.

USPTO Office Communication, Non-Final Office Action for U.S. Appl. No. 17/498,100, mailed on Mar. 8, 2024, 29 pages.

* cited by examiner

THREE-DIMENSIONAL MEMORY ARRAY WITH DUAL-LEVEL PERIPHERAL CIRCUITS AND METHODS FOR FORMING THE SAME

RELATED APPLICATIONS

This application is a continuation-in-part (CIP) application of U.S. application Ser. No. 17/498,100 filed on Oct. 11, 2021, which is a CIP application of U.S. application Ser. No. 17/347,810 filed on Jun. 15, 2021, the entire contents of which are incorporated herein by reference.

FIELD

The present disclosure relates generally to the field of semiconductor devices, and particularly to a bonded assembly including a memory die and a logic die including a semiconductor substrate configured to provide enhanced drive current and methods for forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a bonded assembly includes a memory die containing a three-dimensional memory array, a first logic die bonded to the memory die, a first peripheral circuit located in the logic die and configured to control operation of a first set of electrical nodes of the three-dimensional memory array, and a second peripheral circuit configured to control operation of a second set of electrical nodes of the three-dimensional memory array, where the second peripheral circuit is located at a different vertical level than the first peripheral circuit relative to the three-dimensional-memory array.

According to another aspect of the present disclosure, a method of forming a bonded assembly comprises providing a memory die comprising a three-dimensional memory array located over a memory-side silicon substrate; providing a first logic die comprising a first peripheral circuit configured to control operation of a first set of electrical nodes of the three-dimensional memory array and located over a first logic-side silicon substrate; and bonding the memory die to the first logic die to form the bonded assembly in which a second peripheral circuit configured to control operation of a second set of electrical nodes of the three-dimensional memory array is located at a different vertical level than the first peripheral circuit relative to the three-dimensional memory array.

According to an aspect of the present disclosure, a bonded assembly comprises a backside peripheral circuit, a memory die and a first logic die. The memory die comprises: a doped semiconductor material layer; a three-dimensional memory array comprising a two-dimensional array of memory stack structures vertically extending through an alternating stack of insulating layers and electrically conductive layers that is located on a first side of the doped semiconductor material layer, memory-side dielectric material layers located on a first side of the three-dimensional memory array, and memory-side metal interconnect structures and first memory-side bonding pads embedded in the memory-side dielectric material layers. The first logic die that comprises: a logic-side peripheral circuit comprising a first subset of logic devices configured to control operation of the three-dimensional memory array and located on a logic-side substrate, logic-side dielectric material layers located between the logic-side substrate and the memory die, and logic-side metal interconnect structures and first logic-side bonding pads that are bonded to a respective one of the first memory-side bonding pads embedded in the logic-side dielectric material layers. The backside peripheral circuit comprises a second subset of the logic devices configured to control operation of the three-dimensional memory array located on a second side of the doped semiconductor material layer that is an opposite side of the first side of the doped semiconductor material layer.

According to another aspect of the present disclosure, a method of forming a semiconductor structure is provided, which comprises: providing a memory die, wherein the memory die comprises vertical stacks of memory elements vertically extending through an alternating stack of insulating layers and spacer material layers located on a first side of a doped semiconductor material layer, and memory-side dielectric material layers embedding memory-side metal interconnect structures and first memory-side bonding pads; providing a first logic die that includes a logic-side peripheral circuit comprising a first subset of logic devices configured to control operation of the three-dimensional memory array and located on a logic-side substrate, and logic-side dielectric material layers embedding logic-side metal interconnect structures and first logic-side bonding pads; bonding the first logic-side bonding pads with the first memory-side bonding pads; and providing a backside peripheral circuit comprising a second subset of the logic devices configured to control operation of the three-dimensional memory array on a backside surface of the doped semiconductor material layer, wherein the backside peripheral circuit is electrically connected to electrical nodes of the three-dimensional memory array.

According to an aspect of the present disclosure, a bonded assembly comprising a memory die that is bonded to a logic die is provided. The memory die comprises: a three-dimensional memory array located on a memory-side substrate; memory-side dielectric material layers located on a first side of a combination of three-dimensional memory array and the memory-side substrate; memory-side metal interconnect structures and memory-side bonding pads embedded in the memory-side dielectric material layers; a backside peripheral circuit comprising a first subset of logic devices configured to control operation of the three-dimensional memory array and located on a backside surface of the memory-side substrate; and backside dielectric material layers located on a second side of the combination of three-dimensional memory array and the memory-side substrate that is an opposite side of the first side; and backside metal interconnect structures that provide electrical connection between the three-dimensional memory array and the backside peripheral circuit embedded in the backside dielectric material layers. The logic die comprises: a logic-side peripheral circuit comprising a second subset of the logic devices configured to control operation of the three-dimensional memory array and located on a logic-side substrate; logic-side dielectric material layers located between the logic-side substrate and the memory die; and logic-side metal interconnect structures and logic-side bonding pads that are bonded to a respective one of the memory-side bonding pads embedded in the logic-side dielectric material layers.

According to another aspect of the present disclosure, a method of forming a semiconductor structure is provided, which comprises: forming a three-dimensional memory array over a memory-side substrate; forming memory-side dielectric material layers embedding memory-side metal interconnect structures and memory-side bonding pads over the three-dimensional memory array to form a memory die; providing a logic die that includes a logic-side peripheral circuit comprising a first subset of logic devices configured to control operation of the three-dimensional memory array and located on a logic-side substrate, and logic-side dielectric material layers embedding logic-side metal interconnect structures and logic-side bonding pads; bonding the logic-side bonding pads with the memory-side bonding pads; forming a backside peripheral circuit comprising a second subset of the logic devices configured to control operation of the three-dimensional memory array on a backside surface of the memory-side substrate; and forming backside dielectric material layers embedding backside metal interconnect structures over the backside peripheral circuit, wherein the backside metal interconnect structures provide electrically conductive paths between the backside peripheral circuit and electrical nodes of the three-dimensional memory array.

DETAILED DESCRIPTION

Figure 1:
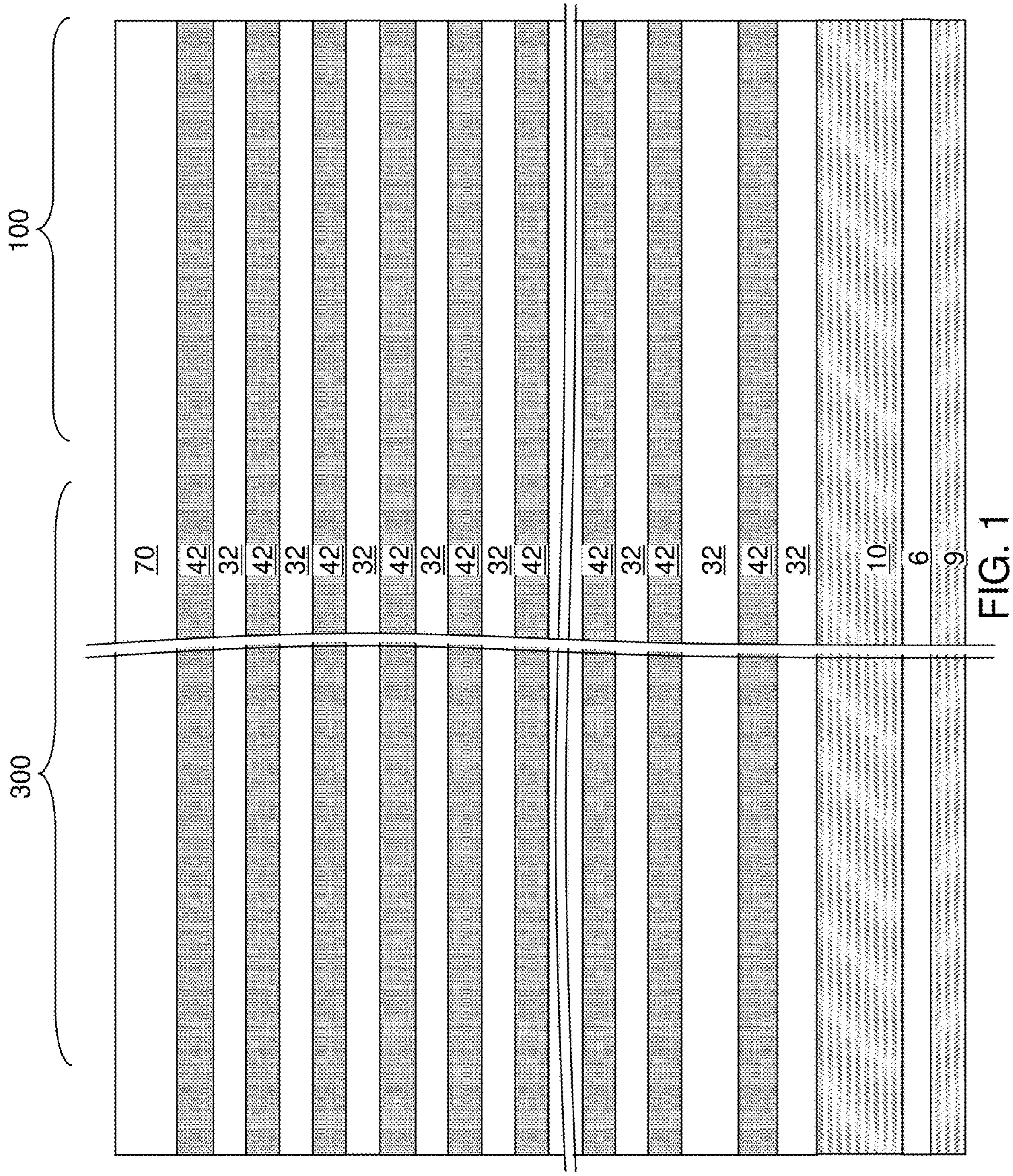
FIG. 1 is a schematic vertical cross-sectional view of a first exemplary structure after formation of an alternating stack of insulating layers and sacrificial material layers according to an embodiment of the present disclosure.

As discussed above, the present disclosure is directed to a three-dimensional memory device comprising a backside peripheral circuit and a bonded peripheral circuit and methods for forming the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to an embodiment of the present disclosure is illustrated, which comprises a substrate for forming a memory die. The substrate is herein referred to as a memory-side substrate (9, 6, 10). The memory-side substrate may comprise a semiconductor material layer 9 (which is also referred to as a substrate semiconductor layer) including a single crystalline semiconductor material (such as single crystalline silicon), a backside insulating layer 6, such as a silicon oxide layer, located on a top surface of the semiconductor material layer 9, and a doped semiconductor material layer 10 located on a top surface of the backside insulating layer 6. In one embodiment, the memory-side substrate (9, 6, 10) may comprise a commercially available silicon-on-insulator (SOI) substrate. In this case, the semiconductor material layer 9 may have a thickness in a range from 60 microns to 1 mm, the backside insulating layer 6 may have a thickness in a range from 50 nm to 1,000 nm, and the doped semiconductor material layer 10 may have a thickness in a range from 100 nm to 1,000 nm, although lesser and greater thicknesses may be employed for each layer within the memory-side substrate (9, 6, 10). Alternatively, the doped semiconductor material layer 10 may include a polycrystalline semiconductor material (such as polysilicon), and may be formed by deposition of the polycrystalline semiconductor material, for example, by chemical vapor deposition.

Depending on the configuration of semiconductor devices to be subsequently formed thereupon, the doped semiconductor material layer 10 may have a same type of doping as, or may have a doping of an opposite conductivity type from, vertical semiconductor channels to be subsequently formed. In one embodiment, the vertical semiconductor channels may be formed with a doping of a first conductivity type (which may be p-type or n-type), and the doped semiconductor material layer 10 may be formed with a doping of the first conductivity type and may include horizontally-extending semiconductor channels. In another embodiment, the vertical semiconductor channels may be formed with a doping of a first conductivity type (which may be p-type or n-type), and the doped semiconductor material layer 10 may be formed with a doping of a second conductivity type that is the opposite of the first conductivity type, and may be employed as a source layer. The first exemplary structure may comprise a memory array region 100 in which a three-dimensional array of memory elements is subsequently formed, and a contact region 300 in which contact via structures are subsequently formed.

A stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. For example, the spacer material layers 42 may comprise heavily doped polysilicon layers which function as word lines and select gate electrodes of the memory device. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2A:
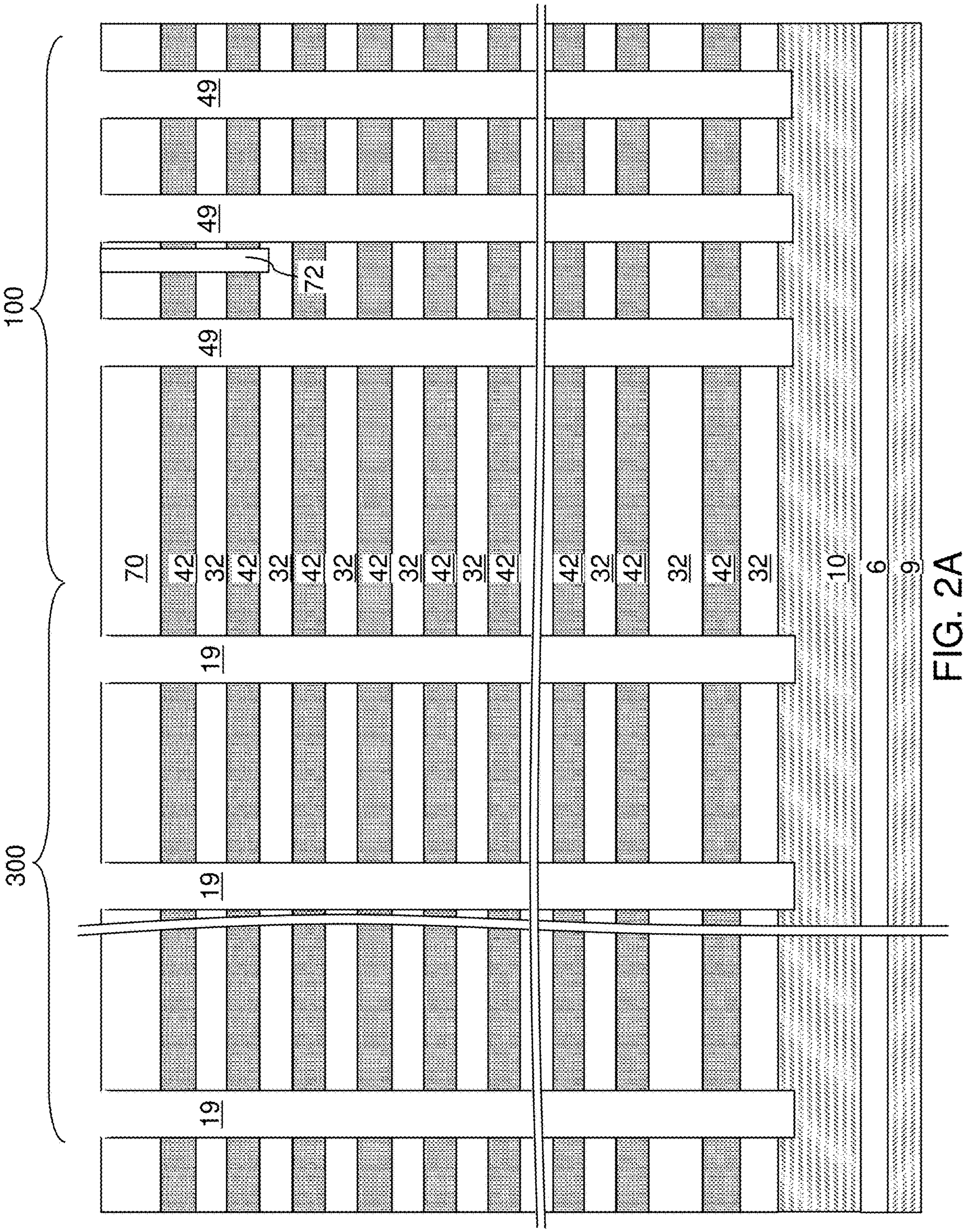
FIG. 2A is a schematic vertical cross-sectional view of the first exemplary structure after formation of memory openings and support openings according to an embodiment of the present disclosure.
Figure 2B:
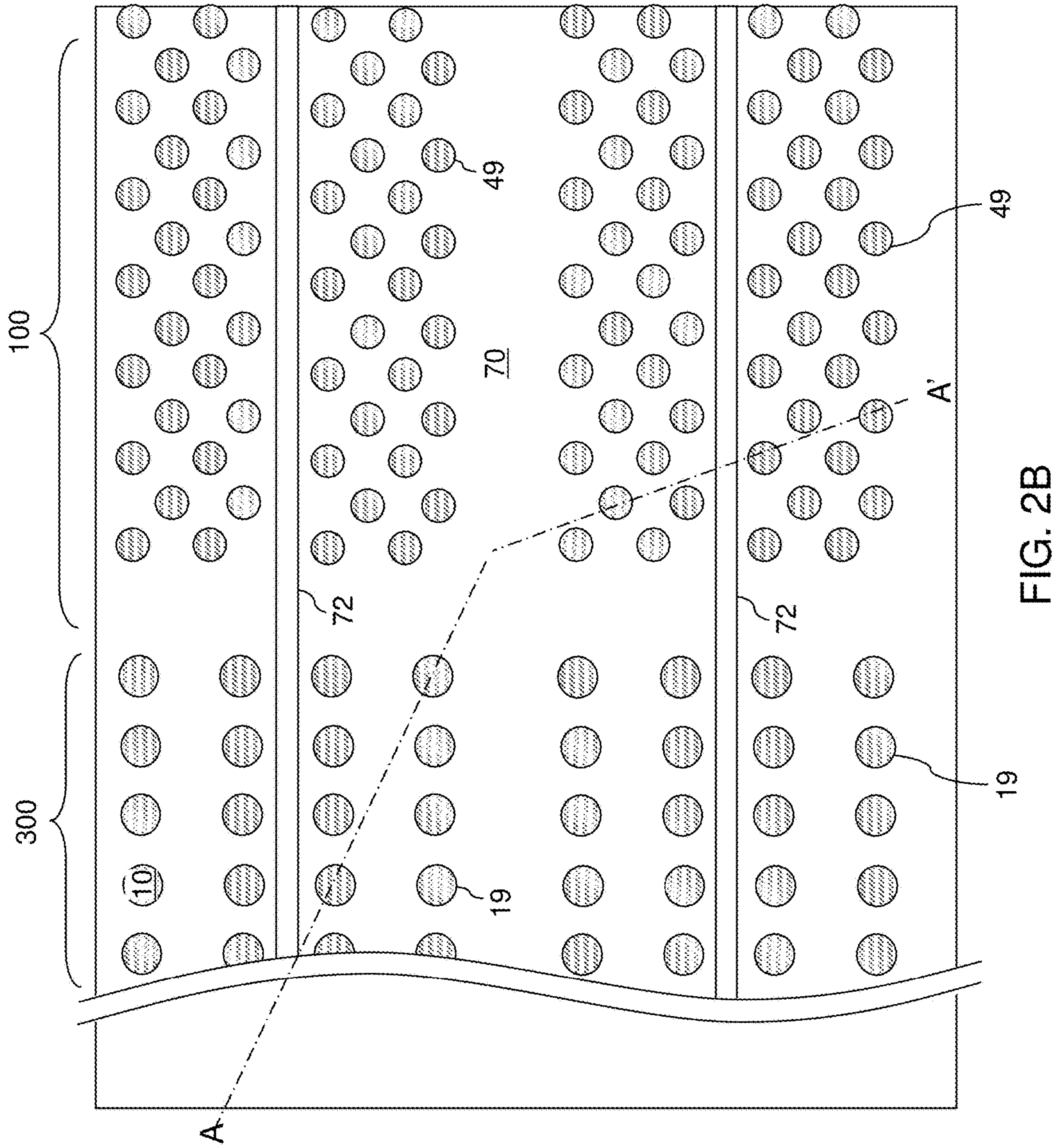
FIG. 2B is a top-down view of the first exemplary structure of FIG. 2A. The vertical plane A-A' is the plane of the cross-section for FIG. 2A.

Referring to FIGS. 2A and 2B, a lithographic material stack (not shown) including at least a photoresist layer can be formed over the insulating cap layer 70, and can be lithographically patterned to form openings therein. The openings include a first set of openings formed over the memory array region 100 and a second set of openings formed over the contact region 300. The pattern in the lithographic material stack can be transferred through the insulating cap layer 70 and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed in the memory array region 100 in which a three-dimensional array of memory elements is subsequently formed, and the support openings 19 are formed in the contact region 300.

The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the doped semiconductor material layer 10. In one embodiment, an overetch into the doped semiconductor material layer 10 may be optionally performed after the top surface of the doped semiconductor material layer 10 is physically exposed at a bottom of each memory opening 49 and each support opening 19. The overetch may be performed prior to, or after, removal of the lithographic material stack. In other words, the recessed surfaces of the doped semiconductor material layer 10 may be vertically offset from the un-recessed top surfaces of the doped semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the doped semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300.

FIGS. 3A-3H illustrate structural changes in a memory opening 49, which is one of the memory openings 49 in the first exemplary structure of FIGS. 2A and 2B. The same structural change occurs simultaneously in each of the other memory openings 49 and in each support opening 19.

Figure 3A:
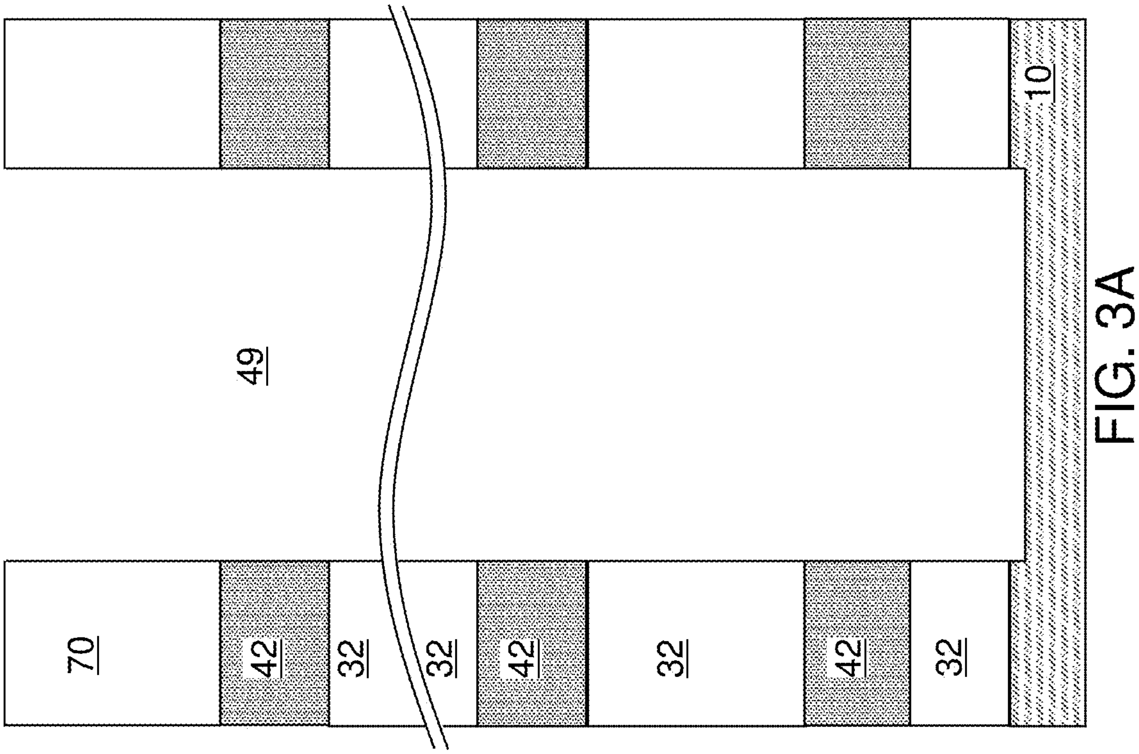
FIGS. 3A-3H are sequential schematic vertical cross-sectional views of a memory opening within the first exemplary structure during formation of a memory stack structure, an optional dielectric core, and a drain region therein according to an embodiment of the present disclosure.

Referring to FIG. 3A, a memory opening 49 in the exemplary device structure of FIGS. 2A and 2B is illustrated. The memory opening 49 extends through the insulating cap layer 70, the alternating stack (32, 42), and optionally into an upper portion of the doped semiconductor material layer 10. The recess depth of the bottom surface of each memory opening with respect to the top surface of the doped semiconductor material layer 10 can be in a range from 0 nm to 30 nm, although greater recess depths can also be employed. Optionally, the sacrificial material layers 42 can be laterally recessed partially to form backside recesses (not shown), for example, by an isotropic etch.

Figure 3B:
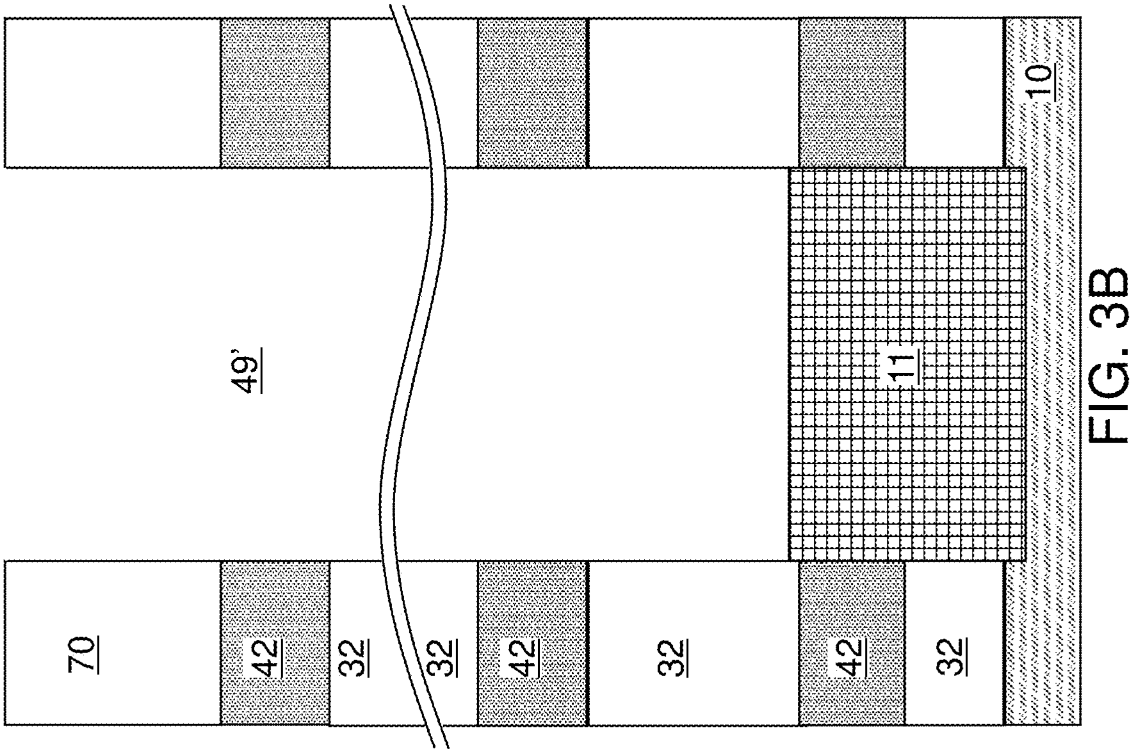

Referring to FIG. 3B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the doped semiconductor material layer 10. In one embodiment, the pedestal channel portion 11 can be doped with electrical dopants of the same conductivity type as the doped semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of a first conductivity type, which may be p-type or n-type.

Figure 3D:
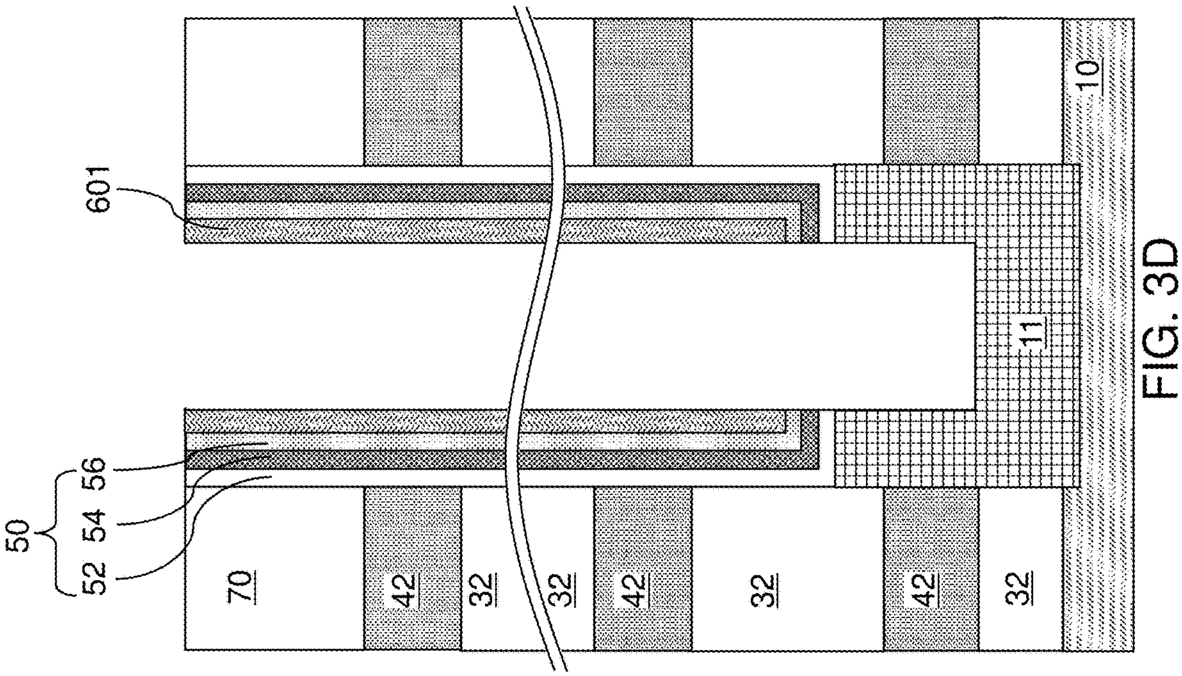
Figure 3C:
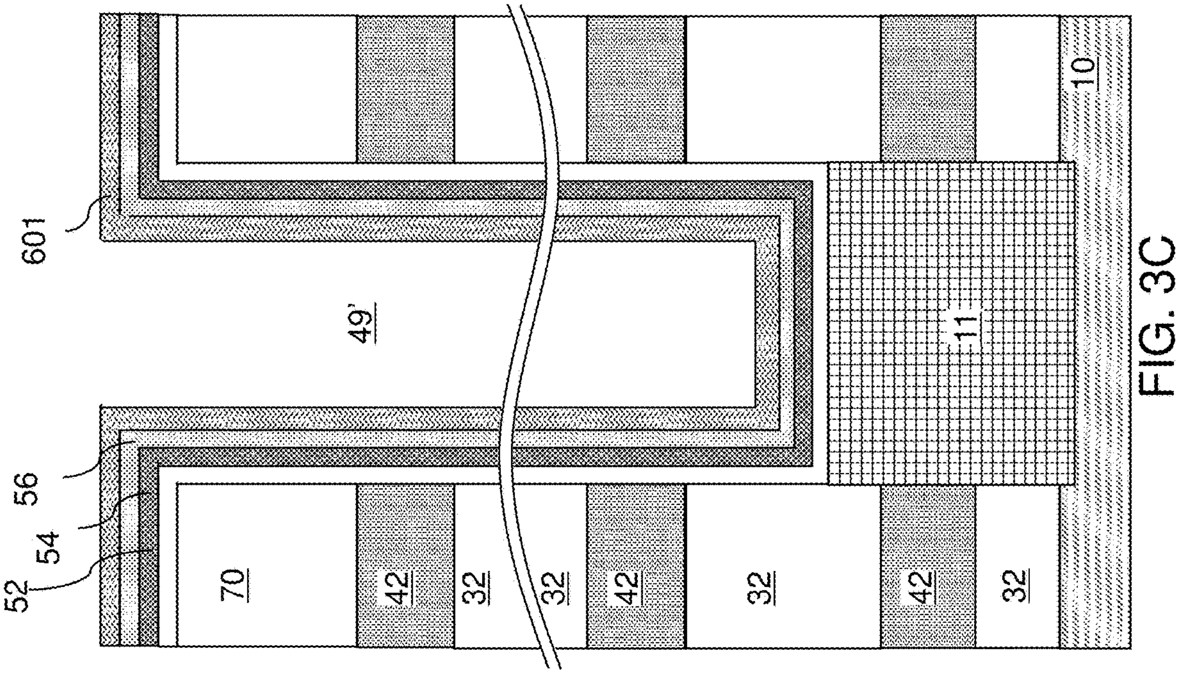

Referring to FIG. 3C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The optional blocking dielectric layer 52 can include a single dielectric material layer or a stack of a plurality of dielectric material layers. The blocking dielectric layer 52 can be formed employing a conformal deposition process. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be deposited as a continuous material layer by a conformal deposition process such as a chemical vapor deposition process or an atomic layer deposition process. The memory material layer 54 includes a memory material, i.e., a material that can store data by selecting a state of the material. For example, the memory material layer 54 may include a charge storage material such as silicon nitride, polysilicon, or a metallic material, a ferroelectric material that can store information in the form of a ferroelectric polarization direction, or any other memory material that can store data by altering electrical resistivity.

The memory material layer 54 can be formed as a single memory material layer of homogeneous composition, or can include a stack of multiple memory material layers. In one embodiment, the memory material layer 54 may comprise an insulating charge trapping material, such as one or more silicon nitride segments. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 includes a dielectric material. The dielectric material liner 56 can be formed on the memory material layer 54 employing a conformal deposition process. In one embodiment, the dielectric material liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 3D, the optional sacrificial cover material layer 601, the dielectric material liner 56, the memory material layer 54, and the blocking dielectric layer 52 overlying the insulating cap layer 70 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, or a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the doped semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the doped semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising portions of the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Figure 3F:
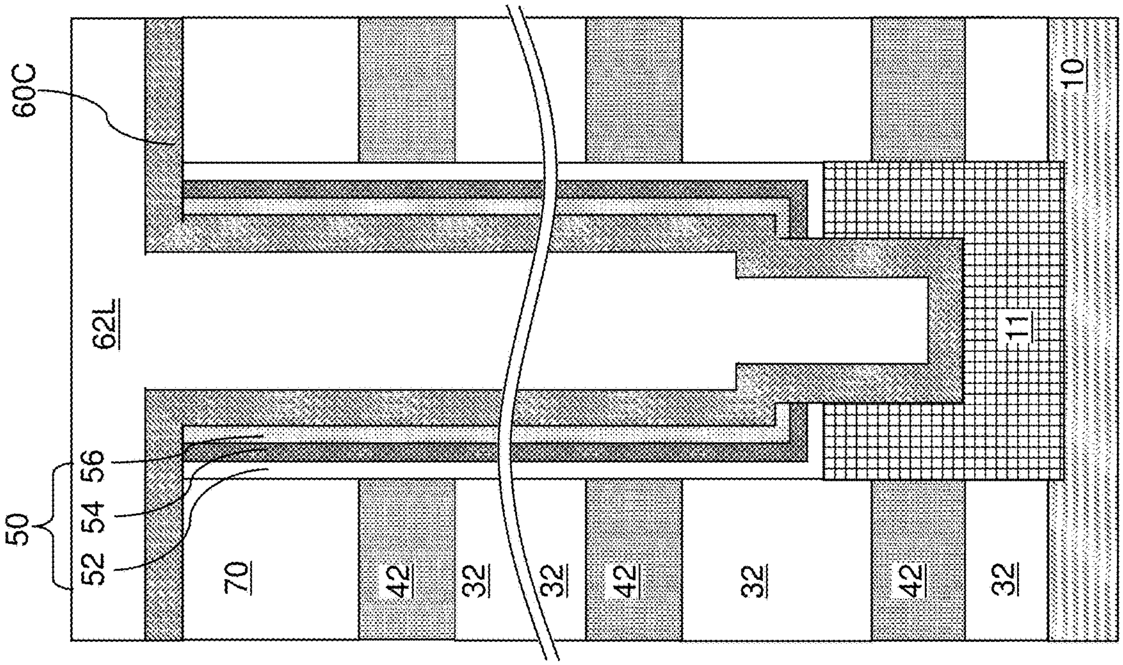
Figure 3E:
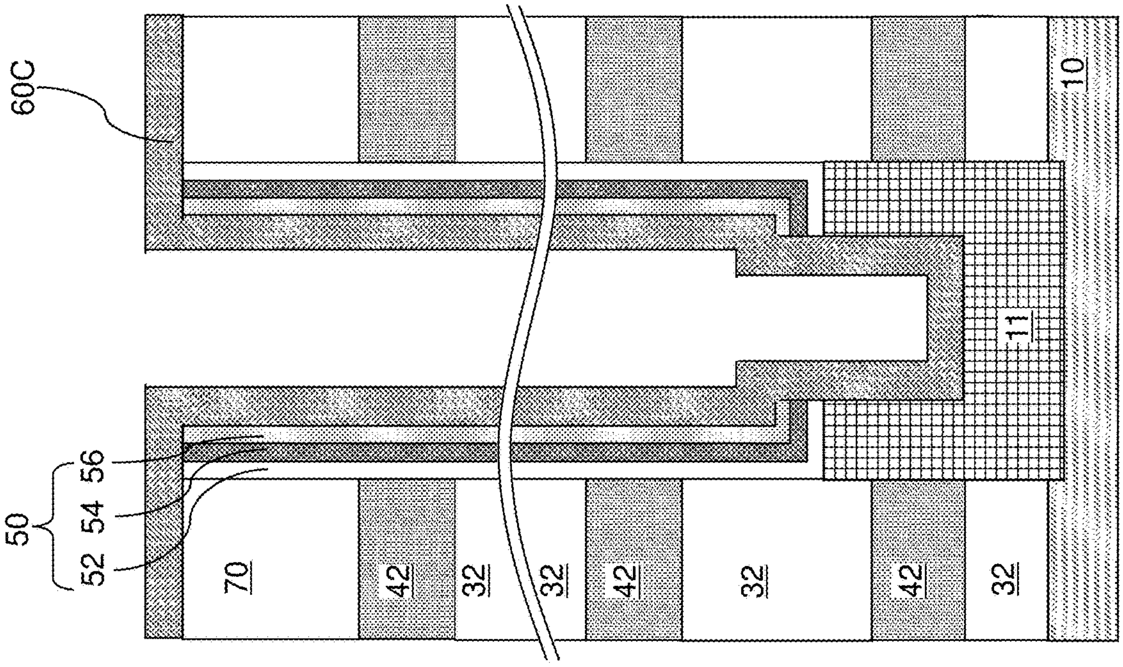

Referring to FIG. 3E, a semiconductor channel layer 60L can be deposited directly on the semiconductor surface of the pedestal channel portion 11 or the doped semiconductor material layer 10 if the pedestal channel portion 11 is omitted, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the doped semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 3F, in case the memory cavity 49' in each memory opening is not completely filled by the semiconductor channel layer 60L, a dielectric core layer 62C can be deposited in the memory cavity 49' to fill any remaining portion of the memory cavity 49' within each memory opening. The dielectric core layer 62C includes a dielectric material such as silicon oxide or organosilicate glass. The dielectric core layer 62C can be deposited by a conformal deposition method such as low pressure chemical vapor deposition (LPCVD), or by a self-planarizing deposition process such as spin coating.

Figure 3H:
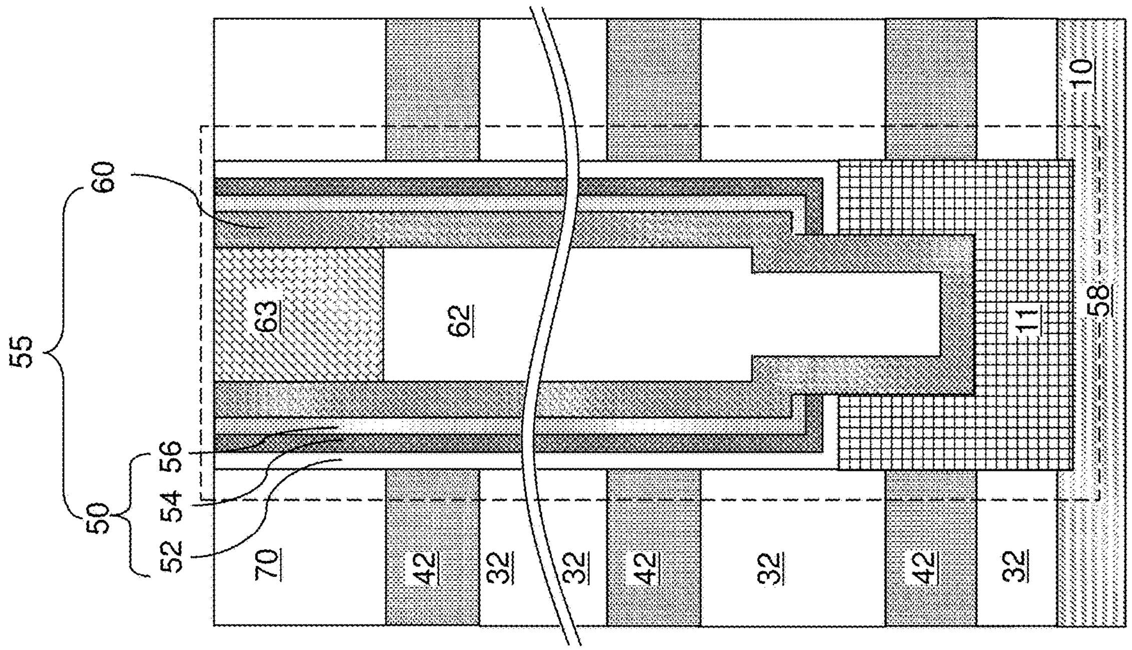
Figure 3G:
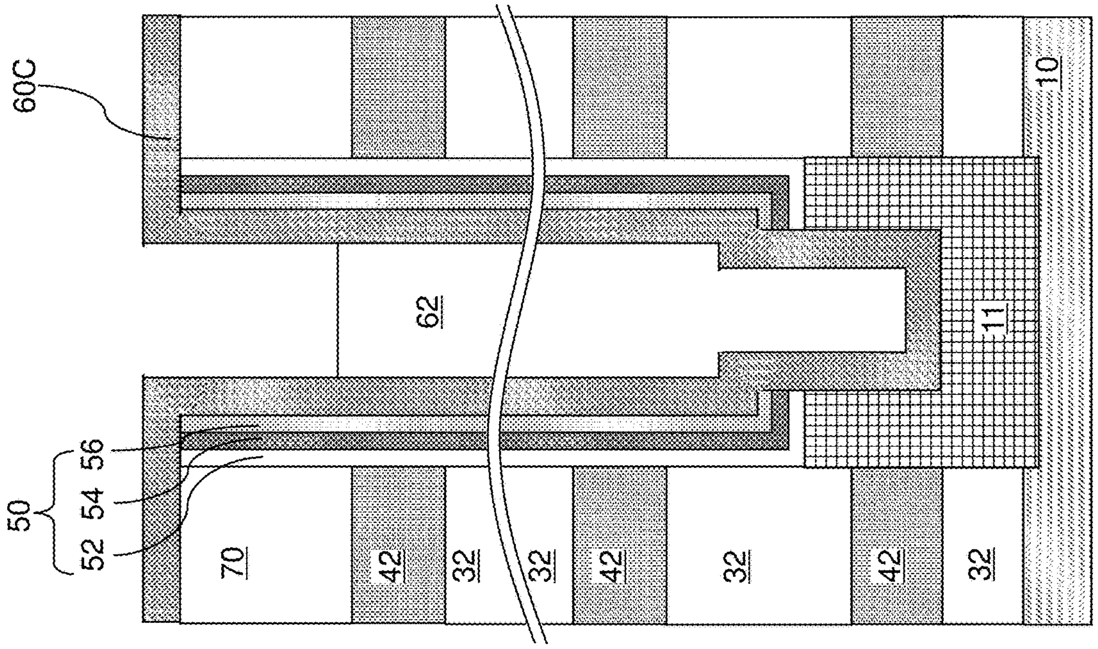

Referring to FIG. 3G, the horizontal portion of the dielectric core layer 62C can be removed, for example, by a recess etch process such that each remaining portions of the dielectric core layer 62C is located within a respective memory opening 49 and has a respective top surface below the horizontal plane including the top surface of the insulating cap layer 70. Each remaining portion of the dielectric core layer 62C constitutes a dielectric core 62.

Referring to FIG. 3H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or electrical polarization with a macroscopic retention time. In some embodiments, a blocking dielectric layer 52 may not be present in the memory film 50 at this step, and a backside blocking dielectric layer may be subsequently formed after formation of backside recesses. Furthermore, if a ferroelectric memory material layer is used as a memory material layer 54, then the tunneling dielectric layer 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements comprising portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Figure 3I:
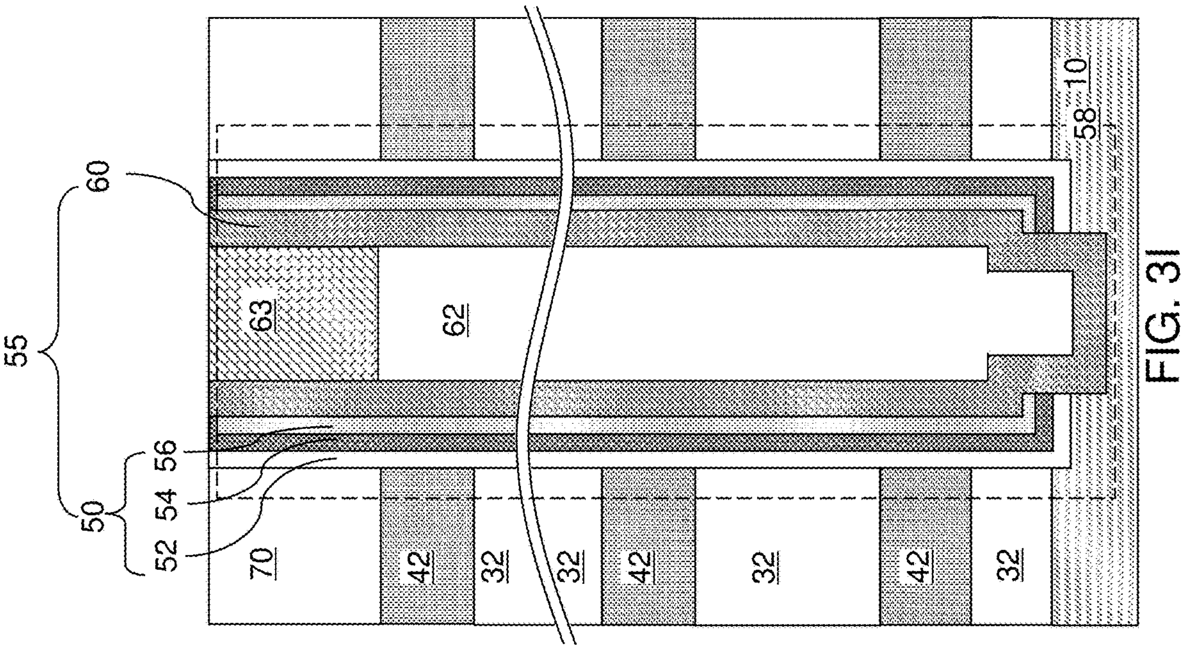
FIG. 3I is a vertical cross-sectional view of an alternative embodiment of a memory opening fill structure according to an embodiment of the present disclosure.

Referring to FIG. 3I, an alternative configuration of a memory opening fill structure 58 is illustrated, which can be derived from the memory opening fill structure illustrated in FIG. 3H by omitting formation of a pedestal channel portion 11. In this case, the vertical semiconductor channel 60 may directly contact the doped semiconductor material layer 10.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. A dielectric material liner 56 may laterally surround the vertical semiconductor channel 60. The memory material layer 54 can laterally surround the dielectric material liner 56.

In case a blocking dielectric layer 52 is present in each memory opening fill structure 58, the blocking dielectric layer 52 may be formed on a sidewall of a memory opening 49, and the vertical stack of memory elements (which may comprise portions of the memory material layer 54) may be formed on the blocking dielectric layer 52. In one embodiment, the vertical stack of memory elements comprises portions of a charge storage layer (comprising portions of the memory material layer 54) located at the levels of the sacrificial material layers 42. In case a dielectric material liner 56 is present in each memory opening fill structure 58, the dielectric material liner 56 may be formed on the vertical stack of memory elements. In on embodiment, the dielectric material liner 56 may comprise a tunneling dielectric layer. In this case, the vertical semiconductor channel 60 can be formed on the tunneling dielectric layer. The blocking dielectric layer 52 laterally surrounds the charge storage layer and the tunneling dielectric layer can be located between the charge storage layer and the vertical semiconductor channel 60. A vertical NAND string can be formed through each memory opening upon subsequent replacement of the sacrificial material layers 42 with electrically conductive layers.

Figure 4:
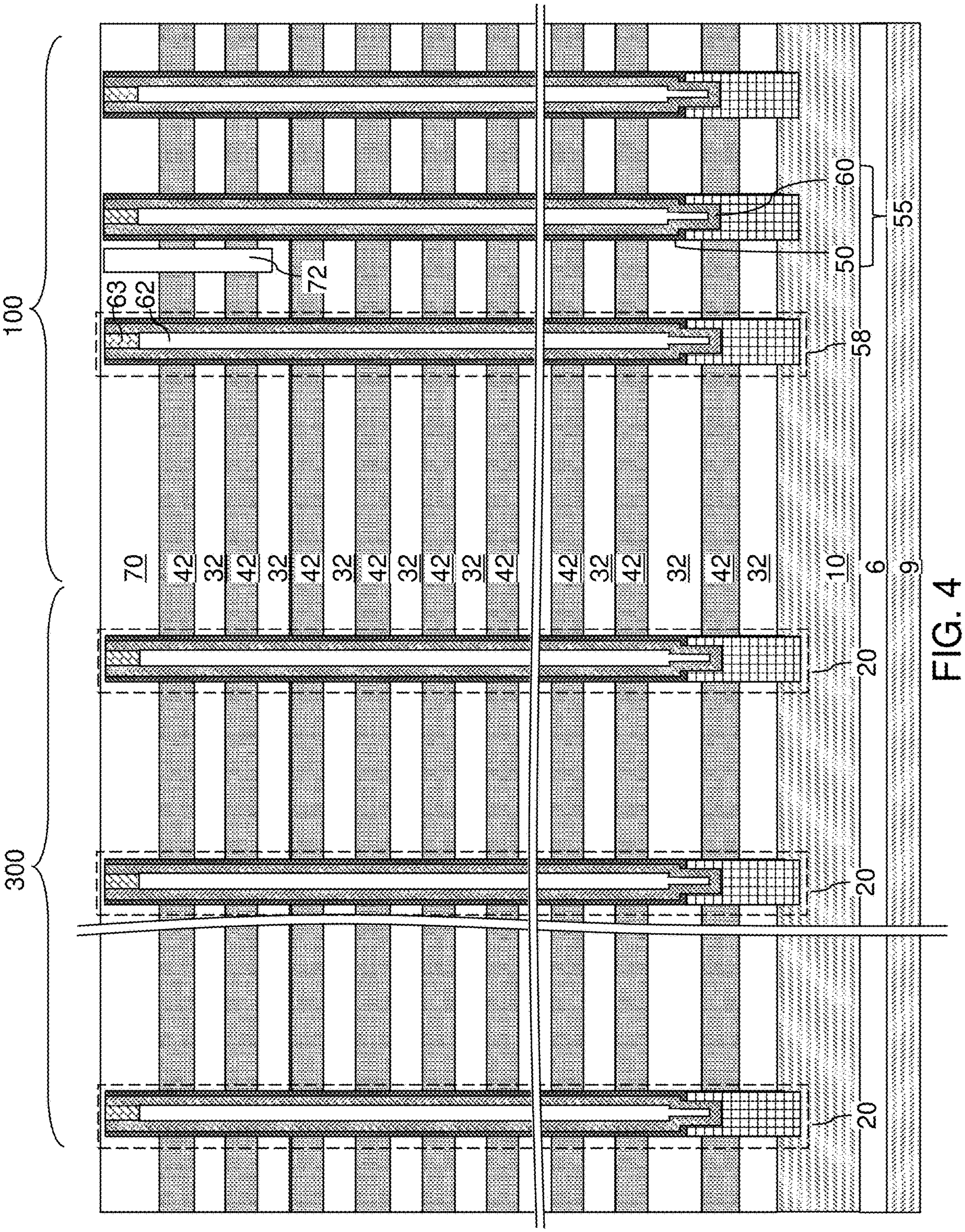
FIG. 4 is a schematic vertical cross-sectional view of the first exemplary structure after formation of memory stack structures and support pillar structures according to an embodiment of the present disclosure.

Referring to FIG. 4, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 2A and 2B. An instance of the support pillar structure 20 can be formed within each support opening 19 of the structure of FIGS. 2A and 2B.

Each memory stack structure 55 includes a vertical semiconductor channel 60 and a memory film 50. The memory film 50 may comprise a dielectric material liner 56 laterally surrounding the vertical semiconductor channel 60, a vertical stack of charge storage regions (comprising portions of memory material layer 54) laterally surrounding the dielectric material liner 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

In one embodiment, each of the memory opening fill structures 58 comprises a respective vertical semiconductor channel 60 located in proximity to the respective vertical stack of memory elements (which may comprise portions of a memory material layer 54 that are located at levels of the sacrificial material layers 42) and having a doping of a first conductivity type. In one embodiment, the pedestal channel portions 11 may be omitted, and the doped semiconductor material layer 10 may be in contact with each of the vertical semiconductor channels 60.

In one embodiment, the doped semiconductor material layer 10 may comprise a single crystalline semiconductor material layer, and each of the memory opening fill structures 58 comprises a respective pedestal channel portion 11 comprising a single crystalline semiconductor material portion having a single crystalline lattice structure in epitaxial alignment with a single crystalline semiconductor material of the doped semiconductor material layer 10.

Figure 5A:
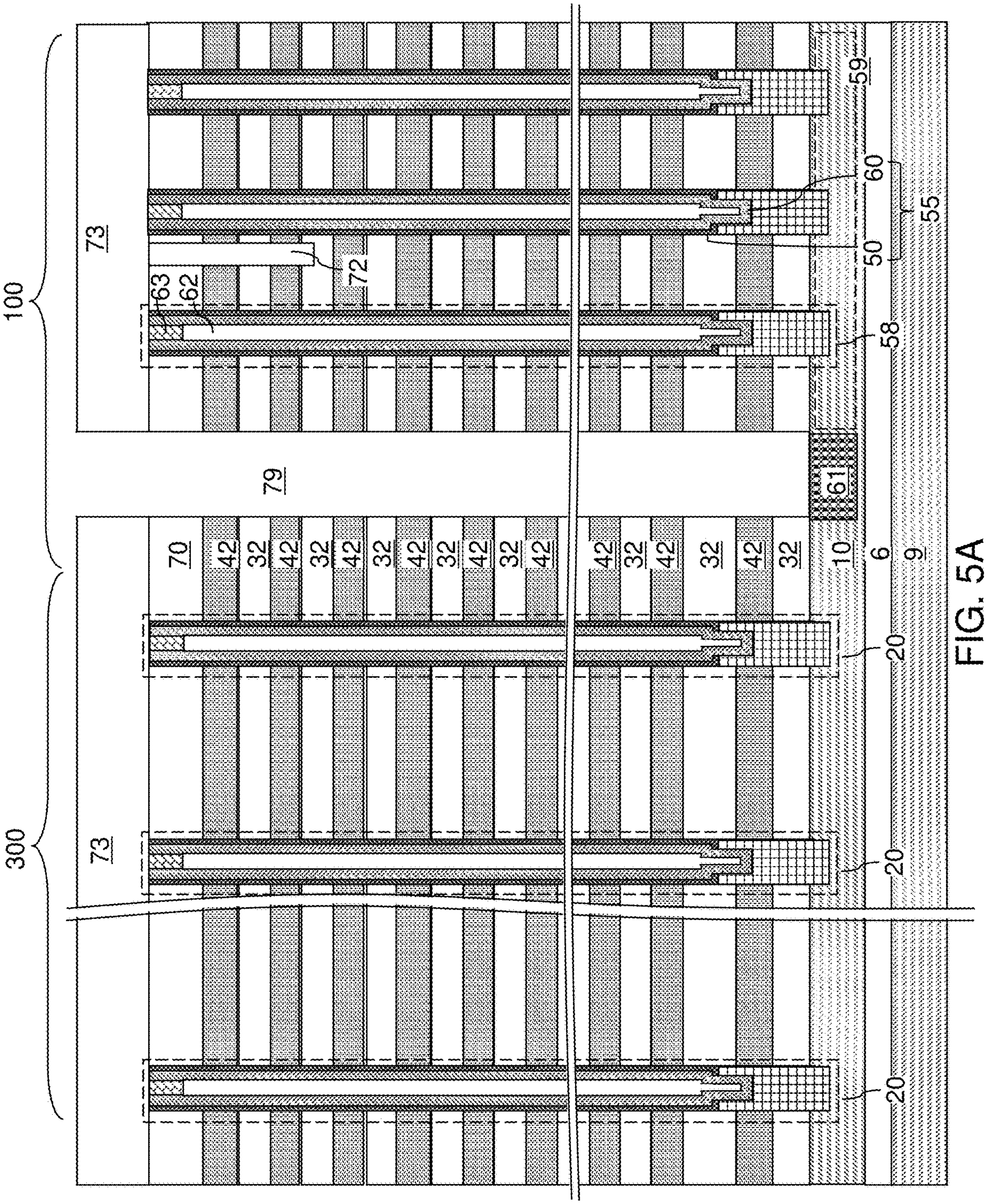
FIG. 5A is a schematic vertical cross-sectional view of the first exemplary structure after formation of backside trenches according to an embodiment of the present disclosure.
Figure 5B:
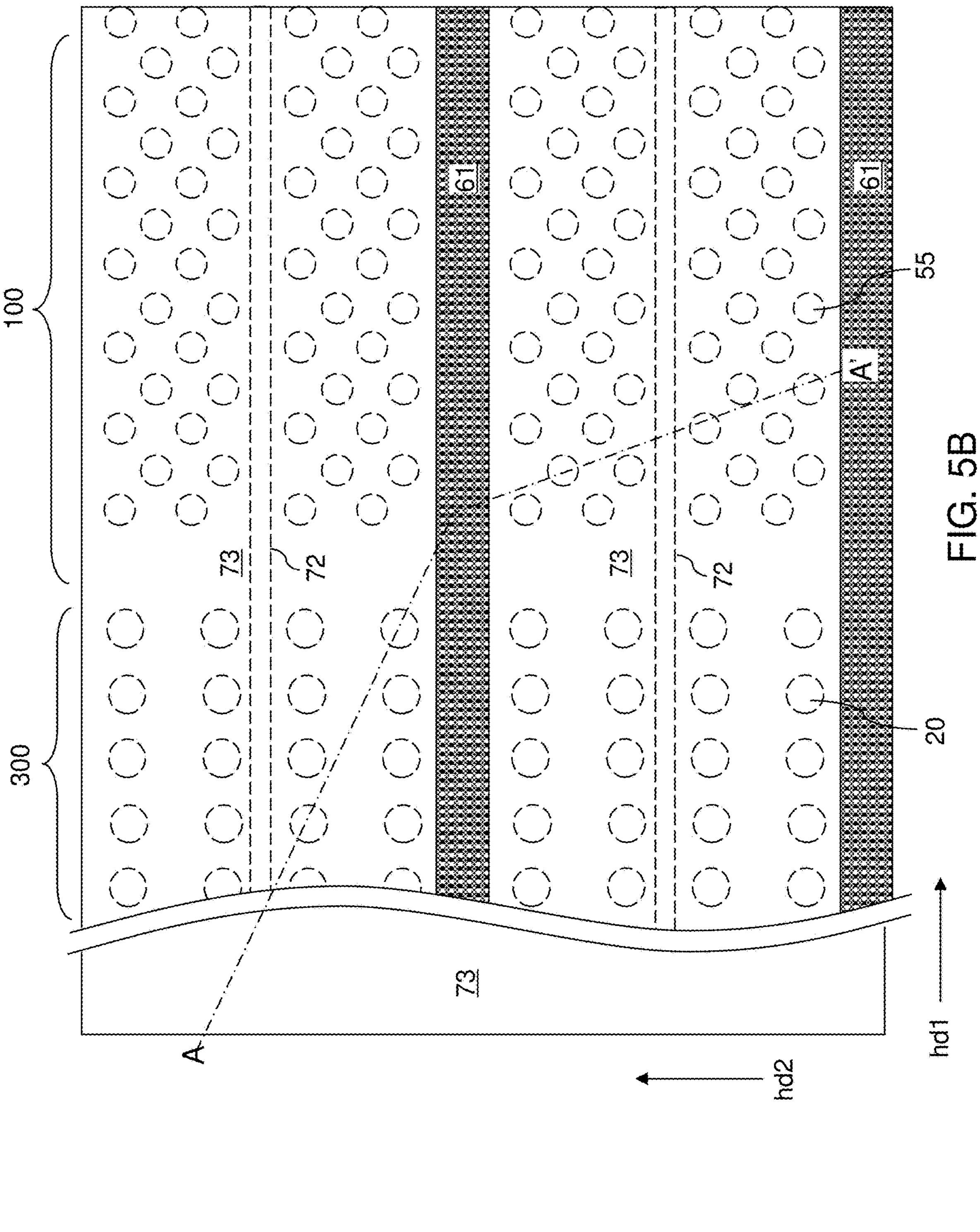
FIG. 5B is a partial see-through top-down view of the first exemplary structure of FIG. 5A. The vertical plane A-A' is the plane of the schematic vertical cross-sectional view of FIG. 5A.

Referring to FIGS. 5A and 5B, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73 and the alternating stack (32, 42) employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

In one embodiment, a source region 61 can be formed at a surface portion of the doped semiconductor material layer 10 under each backside trench 79 by implantation of electrical dopants into physically exposed surface portions of the doped semiconductor material layer 10. An upper portion of the doped semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 6:
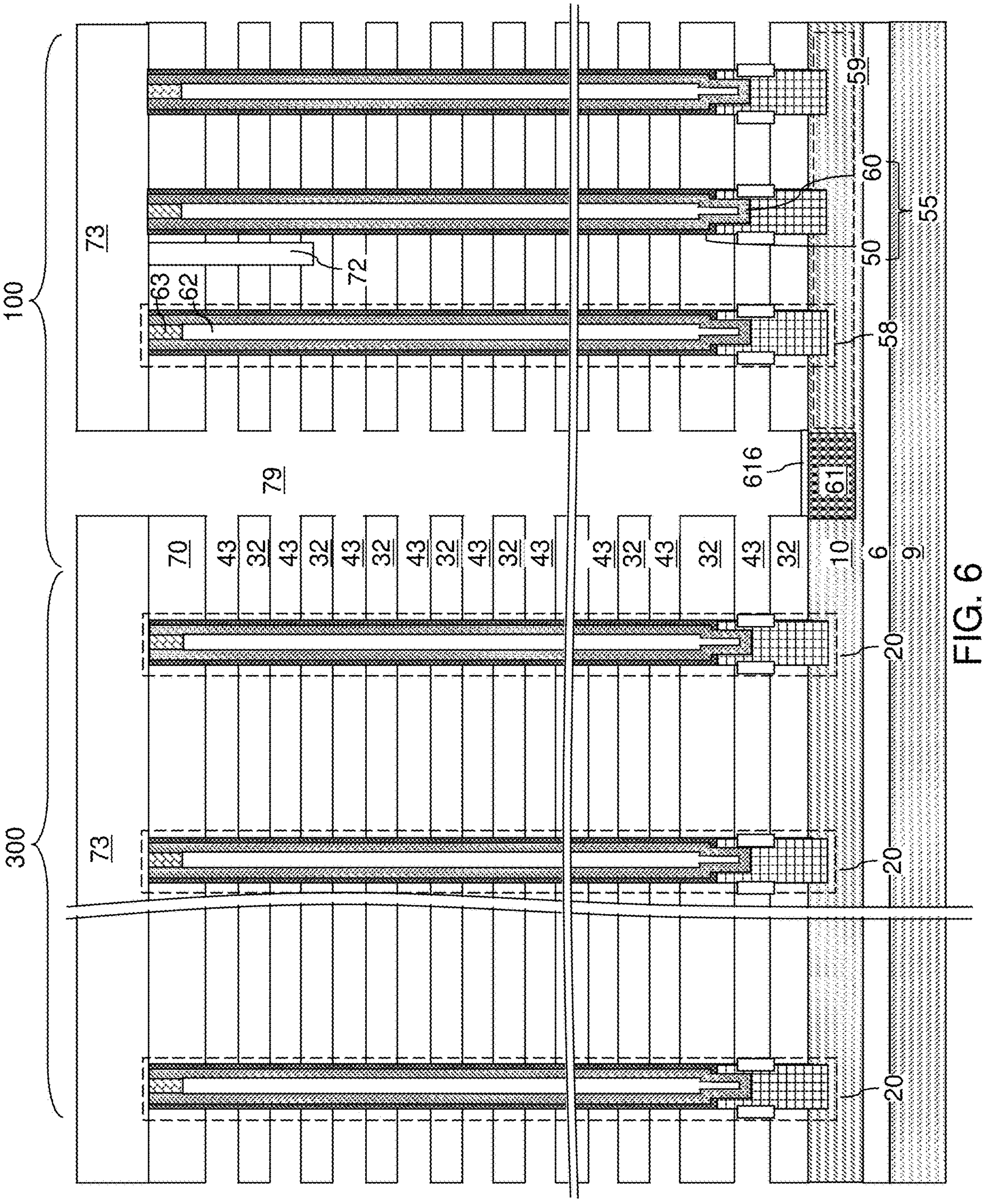
FIG. 6 is a schematic vertical cross-sectional view of the first exemplary structure after formation of backside recesses according to an embodiment of the present disclosure.

Referring to FIG. 6, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the semiconductor material of the doped semiconductor material layer 10, and the material of the outermost layer of the memory films 50. In one embodiment, the sacrificial material layers 42 can include silicon nitride, and the materials of the insulating layers 32 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20 and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the doped semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the doped semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the doped semiconductor material layer 10.

Figure 7:
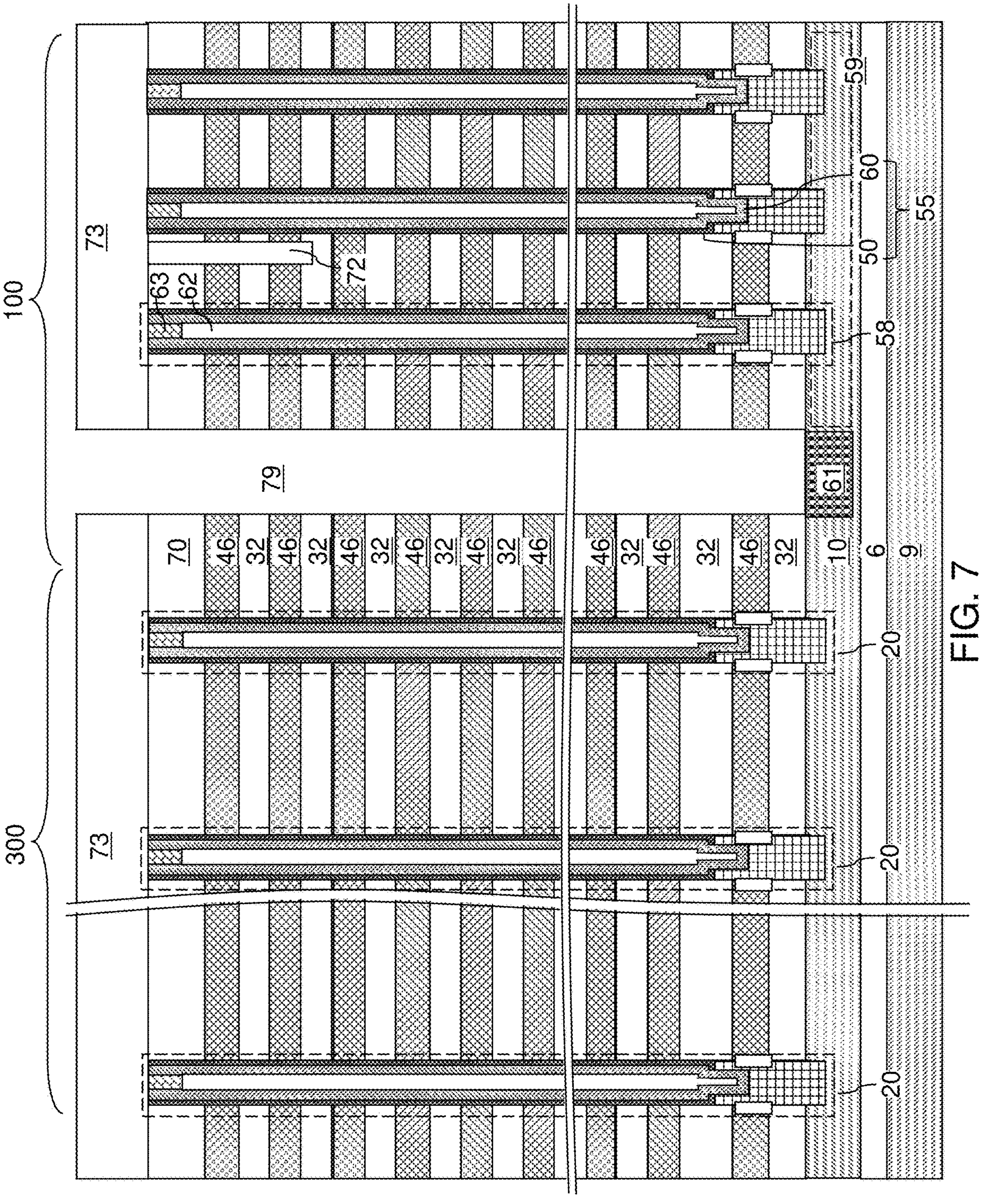
FIG. 7 is a schematic vertical cross-sectional view of the first exemplary structure after formation of electrically conductive layers according to an embodiment of the present disclosure.

Referring to FIG. 7, a backside blocking dielectric layer (not shown) can be optionally formed. The backside blocking dielectric layer, if present, comprises a dielectric material that functions as a control gate dielectric for the control gates to be subsequently formed in the backside recesses.

At least one conductive material can be deposited in the backside recesses 43. For example, a combination of a metallic barrier layer and a metallic fill material can be deposited in the backside recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material can be subsequently deposited in the plurality of backside recesses 43, on the sidewalls of the at least one the backside trench 79, and over the top surface of the contact-level dielectric layer 73 to form a metallic fill material layer (not illustrated). The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the contact-level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the backside trenches 79 or above the contact-level dielectric layer 73.

Each sacrificial material layer 42 can be replaced with an electrically conductive layer 46. A backside cavity is present in the portion of each backside trench 79 that is not filled with the continuous metallic material layer. A tubular dielectric spacer 116 laterally surrounds a pedestal channel portion 11. A bottommost electrically conductive layer 46 laterally surrounds each tubular dielectric spacer 116 upon formation of the electrically conductive layers 46.

The deposited metallic material of the continuous electrically conductive material layer is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer can be selective to the material of the backside blocking dielectric layer. In this case, a horizontal portion of the backside blocking dielectric layer can be present at the bottom of each backside trench 79. In another embodiment, the removal of the continuous electrically conductive material layer may not be selective to the material of the backside blocking dielectric layer or, the backside blocking dielectric layer may not be employed. The planar dielectric portions 616 can be removed during removal of the continuous electrically conductive material layer. A backside cavity is present within each backside trench 79.

A bottommost electrically conductive layer 46 provided upon formation of the electrically conductive layers 46 within the alternating stack (32, 46) can comprise a source side select gate electrode for the NAND strings. At least one topmost electrically conductive layer 46 provided upon formation of the electrically conductive layers 46 within the alternating stack (32, 46) can comprise a drain side select gate electrode for the NAND strings.

Each source region 61 is formed in an upper portion of the doped semiconductor material layer 10. Semiconductor channels (59, 11, 60) extend between each source region 61 and a respective set of drain regions 63. The semiconductor channels (59, 11, 60) include the vertical semiconductor channels 60 of the memory stack structures 55.

In an alternative configuration, the doped semiconductor material layer 10 may have a doping of a second conductivity type that is the opposite of the first conductivity type, and may be employed as a source layer. In another alternative configuration, the alternating stack formed in the step of FIG. 1 includes insulating layers 32 and electrically conductive layers 46, such as heavily doped polysilicon layers. In this alternative configuration, the steps shown in FIGS. 5A to 7 may be omitted.

Figure 8:
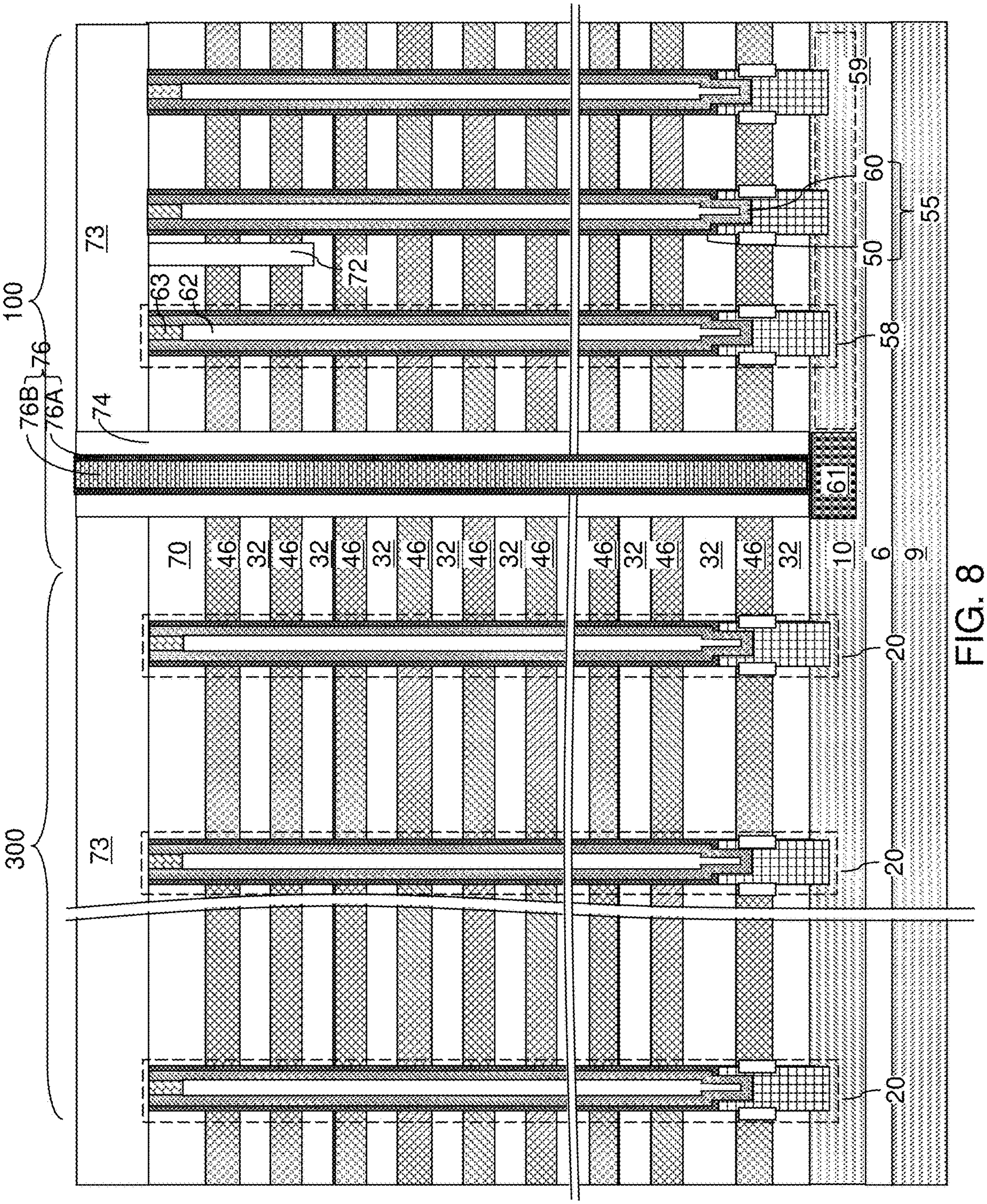
FIG. 8 is a schematic vertical cross-sectional view of the first exemplary structure after formation of an insulating spacer and a backside contact structure according to an embodiment of the present disclosure.

Referring to FIG. 8, an insulating material layer can be formed in the backside trenches 79 and over the contact-level dielectric layer 73 by a conformal deposition process. Exemplary conformal deposition processes include, but are not limited to, chemical vapor deposition and atomic layer deposition.

The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74. A top surface of the doped semiconductor material layer 10 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

Generally, a three-dimensional memory array can be formed over a memory-side substrate (9, 6, 10) including a doped semiconductor material layer 10. The three-dimensional memory array may be formed by forming an alternating stack of insulating layers 32 and spacer material layers over the memory-side substrate (9, 6, 10). The spacer material layers are formed as, or are subsequently replaced with, electrically conductive layers 46. Memory openings 49 vertically extending through the alternating stack {(32, 42) or (32, 46)} can be formed. Memory opening fill structures 58 are formed in the memory openings 49. Each of the memory opening fill structures 58 comprises a respective vertical stack of memory elements, which may comprise portions of a memory material layer 54 located at levels of the electrically conductive layers 46. Optional backside trenches 79 can be formed such that they laterally extend along the first horizontal direction hd1 and vertically extend through the alternating stack (32, 46) and extends to the memory-side substrate (9, 6, 10). Backside trench fill structures (74, 76) can be located within the backside trenches 79. The backside trench fill structures (74, 76) can comprise dielectric surfaces that contact sidewalls of the alternating stack (32, 46) and the memory-side substrate.

Figure 9:
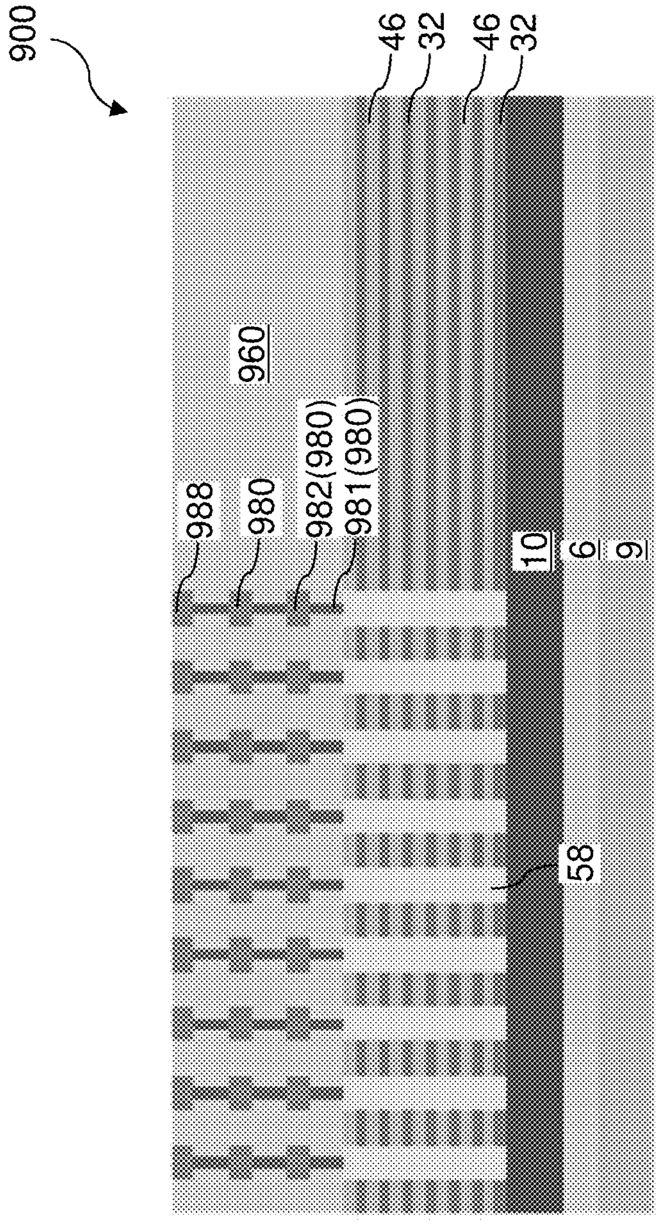
FIG. 9 is a schematic vertical cross-sectional view of the first exemplary structure after formation of a memory die according to an embodiment of the present disclosure.

Referring to FIG. 9, memory-side dielectric material layers 960 embedding memory-side metal interconnect structures 980 and memory-side bonding pads 988 can be formed over the three-dimensional memory array to form a memory die 900. For example, the memory-side dielectric material layers 960 can be formed directly on the contact-level dielectric layer 73. The memory-side dielectric material layers 960 may comprise various via-level dielectric material layers and various line-level dielectric material layers.

The memory-side metal interconnect structures 980 may comprise various metal via structures and various metal line structures. For example, drain contact via structures 981 can be formed on a respective one of the drain regions 63, and bit lines 982 can be formed on a respective subset of the drain contact via structures 981. The memory-side bonding pads 988 can be formed in the topmost layer of the memory-side dielectric material layers 960, and can be electrically connected to a respective one or more of the electrical nodes (e.g., bit lines 982 and drain regions 63) of the three-dimensional memory array.

Generally, the memory-side dielectric material layers 960 can be formed on a first side of a combination of a three-dimensional memory array and the memory-side substrate (9, 6, 10), and can embed memory-side metal interconnect structures 980 and memory-side bonding pads 988. The three-dimensional memory array may be more proximal to the memory-side dielectric material layers 960 than the memory-side substrate (9, 6, 10) is to the memory-side dielectric material layers 960. In one embodiment, a subset of the memory-side bonding pads 988 can be electrically connected to a respective one of the bit lines 982 and to a respective subset of the drain regions 63 in the three-dimensional memory array.

In one embodiment, a two-dimensional array of memory dies 900 can be formed such that each of the memory dies 900 comprises a respective portion of the memory-side substrate (9, 6, 10) in case the memory-side substrate (9, 6, 10) has an area that is larger than the area of a single memory die 900, which may be the case when the memory-side substrate (9, 6, 10) comprises a commercially available semiconductor substrate.

Figure 10:
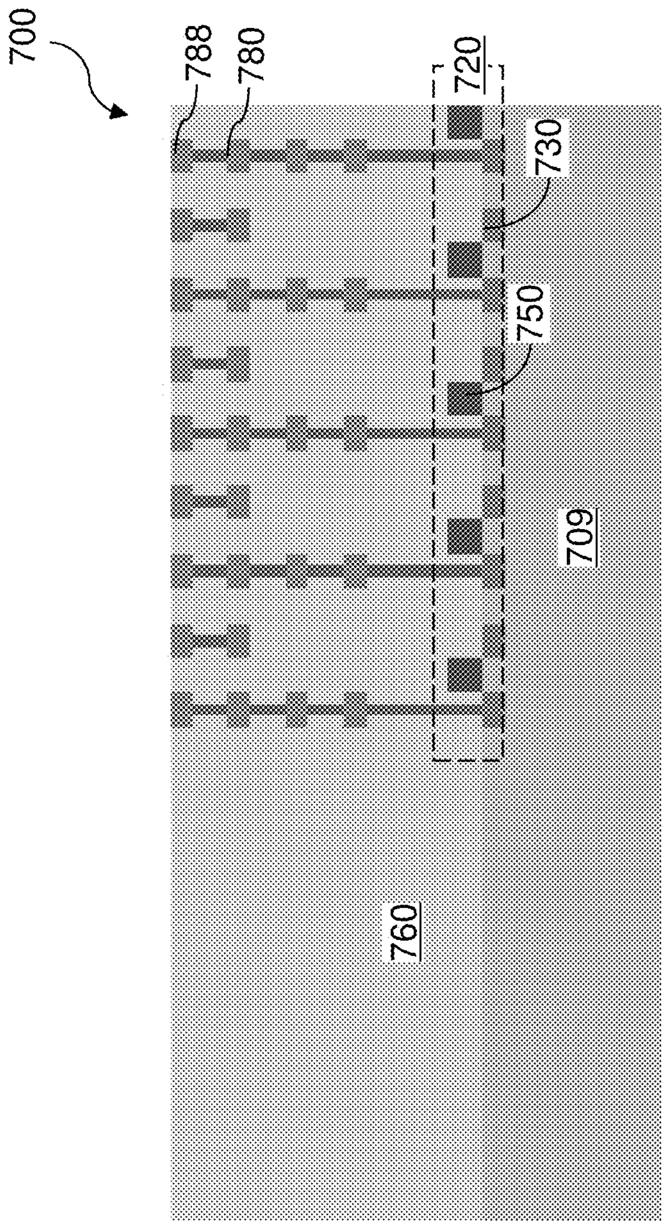
FIG. 10 is a schematic vertical cross-sectional view of a logic die according to an embodiment of the present disclosure.

FIG. 10 illustrates a logic die 700 according to an embodiment of the present disclosure. The logic die 700 comprises a logic-side substrate 709, which may comprise a commercially available semiconductor substrate, such as a single crystalline silicon wafer.

According to an aspect of the present disclosure, a logic-side peripheral circuit 720 (e.g., a driver circuit) can be formed on the top surface of the logic-side substrate 709. The logic-side peripheral circuit 720 comprises a first subset of logic (e.g., driver) devices configured to control operation of the three-dimensional memory array of the memory die 900.

In one embodiment the logic-side peripheral circuit 720 comprises a bit line driver circuit which includes sense amplifier devices and other bit line driver devices. In one embodiment, the logic die 700 lacks any word line driver circuit devices, such as word line switching transistors.

The logic-side peripheral circuit 720 may comprise complementary metal oxide semiconductor (CMOS) field effect transistors that form a CMOS circuit. Each of the CMOS field effect transistors may comprise a gate structure 750 and active regions 730. Each gate structure 750 may include a stack of a gate dielectric and a gate electrode. The active regions 730 may include doped source regions and doped drain regions separated by a semiconductor channel.

Logic-side dielectric material layers 760 embedding logic-side metal interconnect structures 780 and logic-side bonding pads 788 can be formed over the logic-side peripheral circuit 720. The logic-side metal interconnect structures 780 comprise various metal via structures and various metal line structures that provide electrical interconnection between the various components (such as the field effect transistors and other passive components, such as resistors and/or capacitors) of the logic-side peripheral circuit 720. The logic-side bonding pads 788 can be formed in the topmost layer of the logic-side dielectric material layers 760, and can be arranged in a pattern that is a mirror image pattern of the memory-side bonding pads 988 of the memory die 900. Each of the logic-side bonding pads 788 can be electrically connected to a respective electrical node of the logic-side peripheral circuit 720.

In one embodiment, the memory-side metal interconnect structures 980 in the memory die 900 comprise bit lines 982 of the three-dimensional memory array, and the logic-side peripheral circuit 720 may comprise a first subset of logic devices for controlling operation of the three-dimensional memory array. In one embodiment, the first subset of logic devices may comprise bit line drivers configured to drive the bit lines 982.

Figure 11:
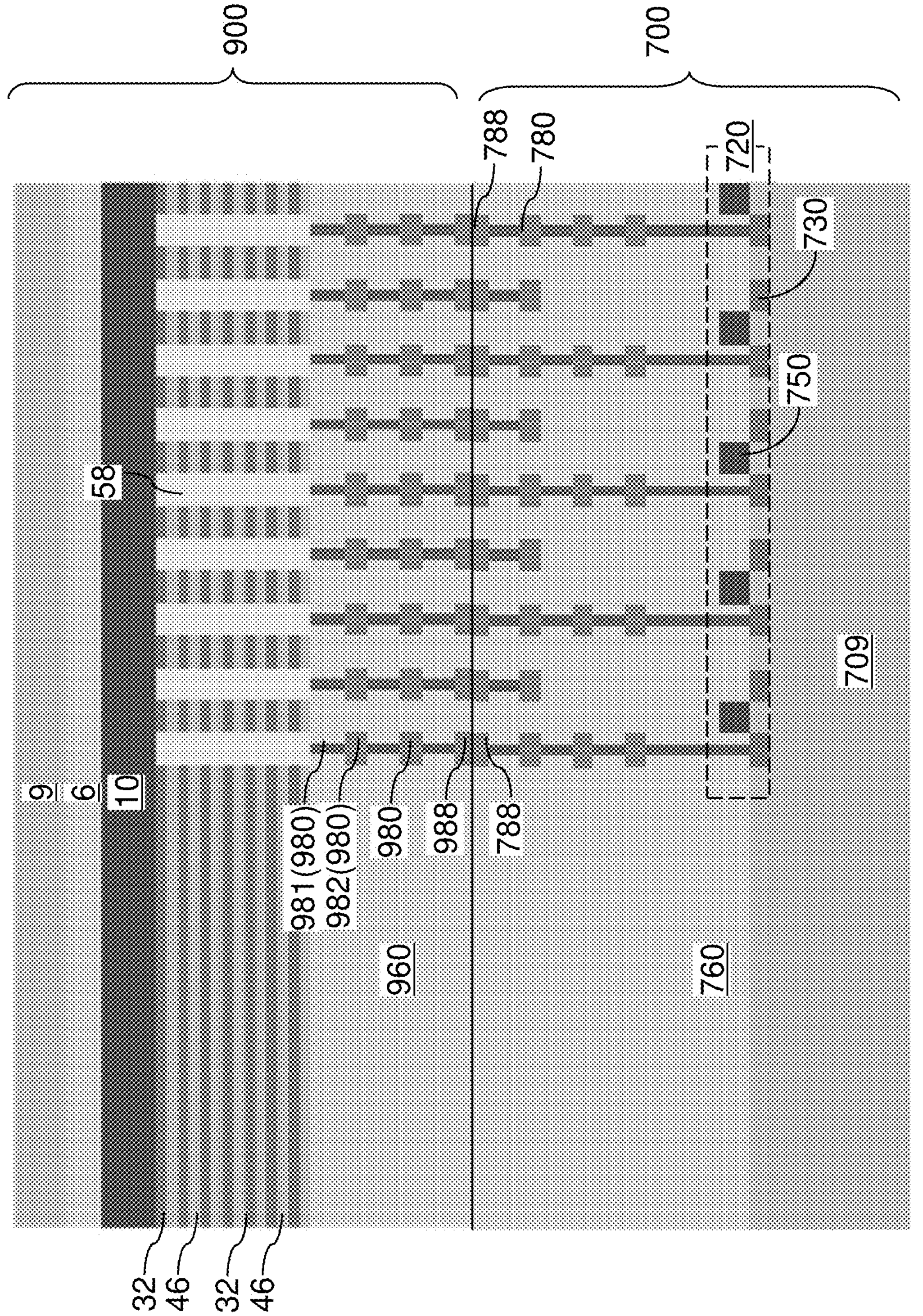
FIG. 11 is a schematic vertical cross-sectional view of the first exemplary structure after bonding the logic die with the memory die according to an embodiment of the present disclosure.

Referring to FIG. 11, the logic die 700 can be bonded with the memory die 900 to form a bonded assembly. In one embodiment, metal-to-metal bonding between the memory-side bonding pads 988 and the logic-side bonding pads 788 may be performed to bond the logic die 700 to the memory die 900. Metal-to-metal bonding provides the benefit of allowing subsequent high temperature processing on the bonded assembly at processing temperatures above the temperature range of solder materials.

In one embodiment, the memory-side metal interconnect structures 980 comprise bit lines 982 of the three-dimensional memory array, and the first subset of logic devices (comprising portions of the logic-side peripheral circuit 720) in the logic die 700 comprises bit line drivers configured to drive the bit lines 982. In this case, the memory-side metal interconnect structures 980, the logic-side metal interconnect structures 780, the memory-side bonding pads 988, and the logic-side bonding pads 788 comprise electrically conductive paths that provide electrical connection between the bit lines 982 and the bit line drivers. Generally, the logic-side peripheral circuit 720 comprises a subset of the logic devices configured to control operation of the three-dimensional memory array and located on the logic-side substrate 709.

Figure 12:
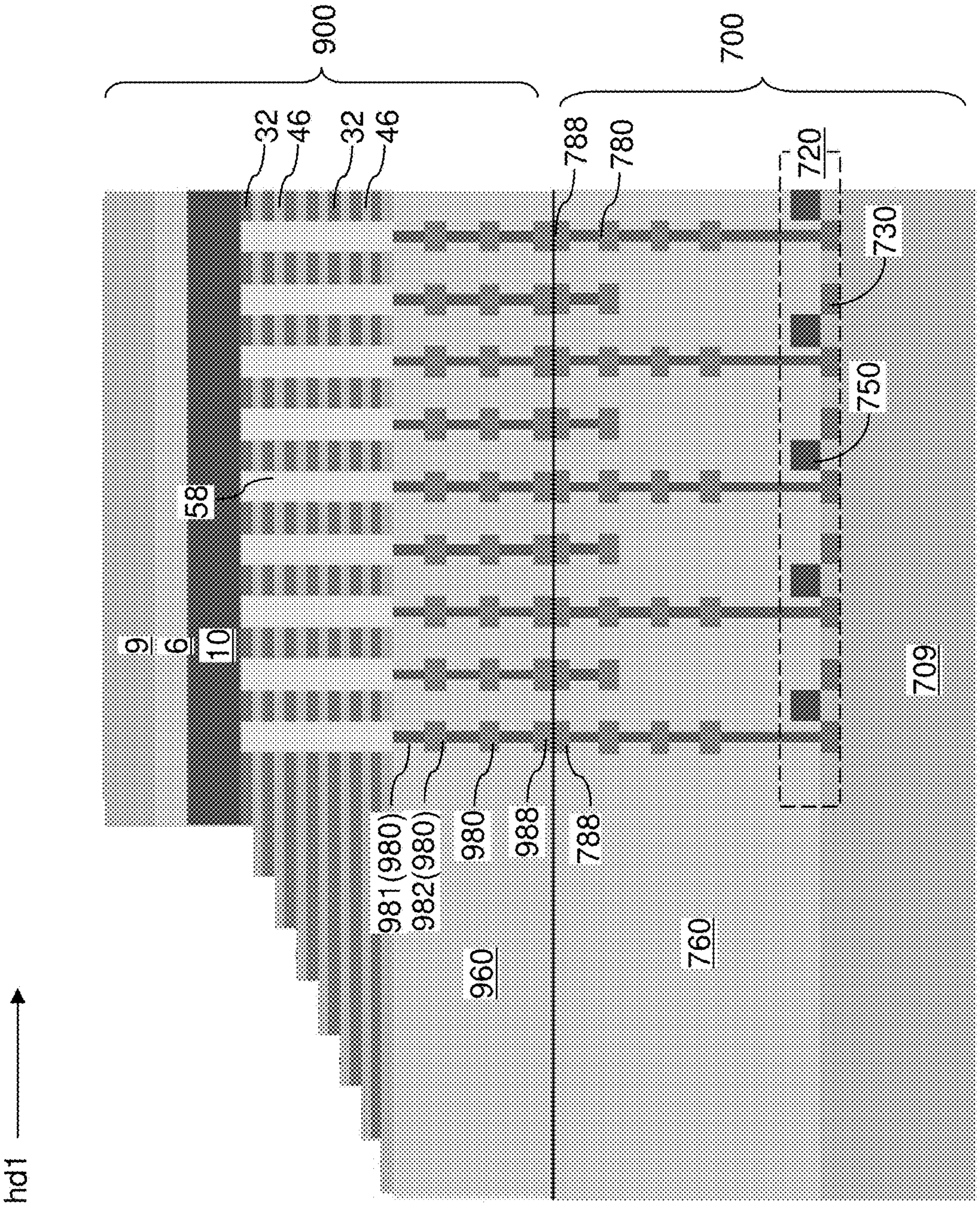
FIG. 12 is a schematic vertical cross-sectional view of the first exemplary structure after patterning a memory-side substrate and an alternating stack of insulating layers and electrically conductive layers according to an embodiment of the present disclosure.

Referring to FIG. 12, the semiconductor material layer 9 of the memory-side substrate (9, 6, 10) can be subsequently thinned, for example, by grinding, polishing, an anisotropic etch process, and/or an isotropic etch process. The thickness of the semiconductor material layer 9 may be in a range from 0.5 micron to 100 microns, such as from 1 micron to 30 microns, after thinning, although lesser and greater thicknesses may also be employed.

The memory-side substrate (9, 6, 10) cam be subsequently patterned, for example, by covering the area of the memory array region 100 while not covering the area of the contact region 300 with a patterned photoresist layer (not shown), and can be removing unmasked portions of the memory-side substrate (9, 6, 10) employing an etch process such as an anisotropic etch process. A portion of a backside surface of the alternating stack (32, 46) is physically exposed in the contact region 300.

Unmasked regions of the alternating stack (32, 46) of the insulating layers 32 and the electrically conductive layers 46 can be subsequently patterned to form stepped surfaces. Specifically, the stepped surfaces can be formed by patterning the alternating stack (32, 46) within an area from which the memory-side substrate (9, 16, 10) is removed. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 46) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the horizontal plane including the bonding interface between the memory die 900 and the logic die 700. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure. The lateral extent of the electrically conductive layers 46 decreases stepwise with a vertical distance from the horizontal plane including the bonding interface between the memory die 900 and the logic die 700. In other words, the lateral extent of the electrically conductive layers 46 increases stepwise with a vertical distance from the doped semiconductor material layer 10. In this case, the alternating stack (32, 46) comprises a staircase region in which the electrically conductive layers 46 have variable lateral extents that decrease with a vertical distance from the horizontal plane including bonding surfaces of the memory-side bonding pads 988 and the logic-side bonding pads 788.

Figure 13:
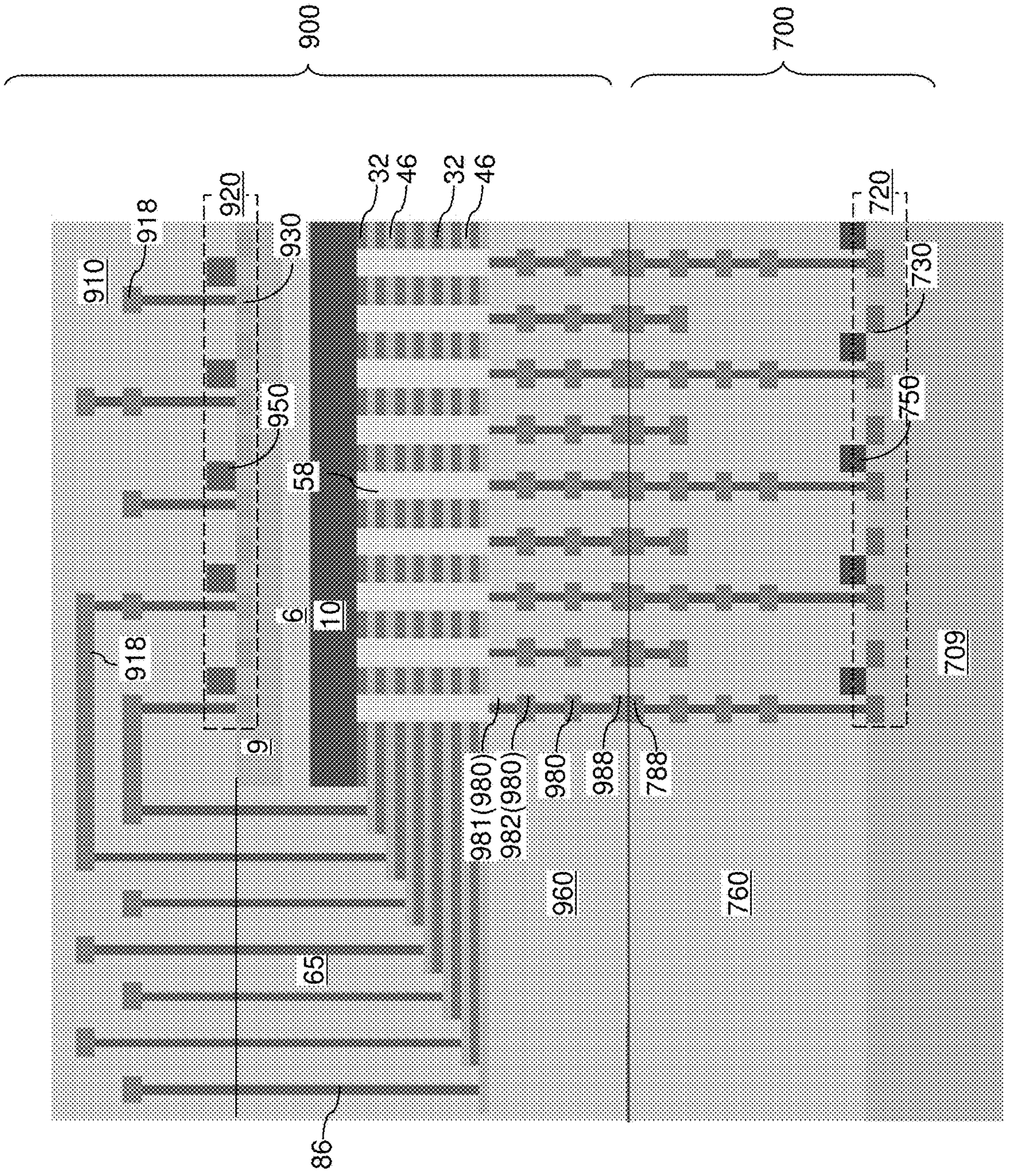
FIG. 13 is a schematic vertical cross-sectional view of the first exemplary structure after formation of a backside peripheral circuit and backside metal interconnect structures according to an embodiment of the present disclosure.

Referring to FIG. 13, a dielectric material such as doped or undoped silicate glass can be deposited in the stepped cavity over the stepped surfaces of the alternating stack (32, 46). The deposited dielectric material can be planarized by removing portions of the deposited dielectric material from above the horizontal plane including the topmost surface (i.e., the backside surface) of the semiconductor material layer 9. A remaining portion of the dielectric material that fills the stepped cavity constitutes a stepped dielectric material portion 65.

Layer contact via structures 86 can be formed in via openings which extend through the stepped dielectric material portion 65. Each of the electrically conductive layers 46 may be contacted by a respective one of the layer contact via structures 86. In one embodiment, top surfaces of the layer contact via structures 86 may be formed within the horizontal plane including the backside surface of the semiconductor material layer 9.

According to an aspect of the present disclosure, a backside peripheral circuit 920 can be formed on the physically exposed surface, i.e., the backside surface, of the semiconductor material layer 9 of the memory-side substrate (9, 6, 10). The backside peripheral circuit 920 comprises a second subset of logic devices configured to control operation of the three-dimensional memory array of the memory die 900. The backside peripheral circuit 920 may comprise complementary metal oxide semiconductor (CMOS) field effect transistors that form a CMOS circuit. Each of the CMOS field effect transistors may comprise a gate structure 950 and active regions 930. Each gate structure 950 may include a stack of a gate dielectric and a gate electrode. The active regions 930 may include doped source regions and doped drain regions separated by a semiconductor channel.

Backside dielectric material layers 910 embedding backside metal interconnect structures 918 can be formed over the backside peripheral circuit 920. The backside metal interconnect structures 918 comprise various metal via structures and various metal line structures that provide electrical interconnection between the various components (such as the field effect transistors and other passive components) of the backside peripheral circuit 920. Further, the backside metal interconnect structures 918 provide electrical connection between the layer contact via structures 86 and the backside peripheral circuit 920. The electrically conductive layers 46 can be electrically connected to the backside peripheral circuit 920 via the layer contact via structures 86 and the backside metal interconnect structures 918.

In one embodiment, at least a portion of the electrically conductive layers 46 may comprise word lines for the three-dimensional memory array, and the second subset of logic devices for controlling operation of the three-dimensional memory array may comprise word line drivers, such as word line switching transistors configured to apply control voltages (e.g., word line on and off switching voltages) to the electrically conductive layers 46.

In one embodiment, the layer contact via structures 86 contact horizontal surfaces of a respective one of the electrically conductive layers 46 within the staircase region, vertically extend from the respective one of the electrically conductive layers 46 along a vertical direction away from a bonding interface between the memory die 900 and the logic die 700, and are electrically connected to a respective one of the backside metal interconnect structures 918.

In one embodiment, the doped semiconductor material layer 10 within the memory-side substrate (9, 6, 10) comprises a single crystalline semiconductor material, and the second subset of logic devices within the backside peripheral circuit 920 comprises field effect transistors including source regions and drain regions that are doped portions of the single crystalline semiconductor material. Gate electrodes of the field effect transistors are more distal from the logic die 700 than the source regions and the drain regions of the first field effect transistors are from the logic die 700.

Generally, the backside dielectric material layers 910 can be formed on the backside, i.e., a second side, of the combination of three-dimensional memory array and the memory-side substrate (9, 6, 10) that is an opposite side of the first side. The backside dielectric material layers 910 embed backside metal interconnect structures 918 that provide electrical connection between the three-dimensional memory array and the backside peripheral circuit 920.

Figure 14:
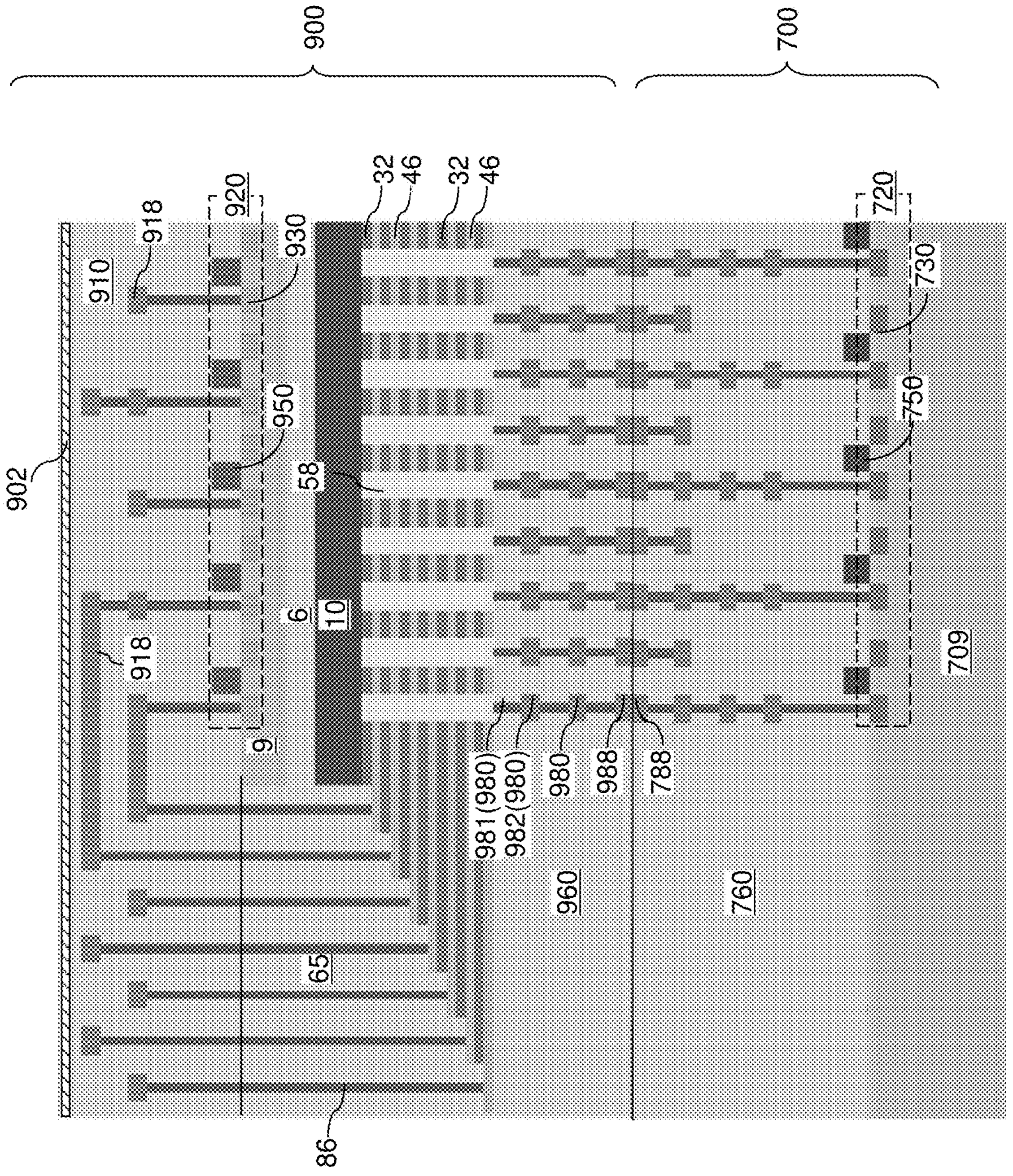
FIG. 14 is a schematic vertical cross-sectional view of the first exemplary structure after forming at least one backside metal structure according to an embodiment of the present disclosure.

Referring to FIG. 14, at least one backside metal structure 902 may be formed over and/or embedded in the backside dielectric material layers 910.

Figure 15A:
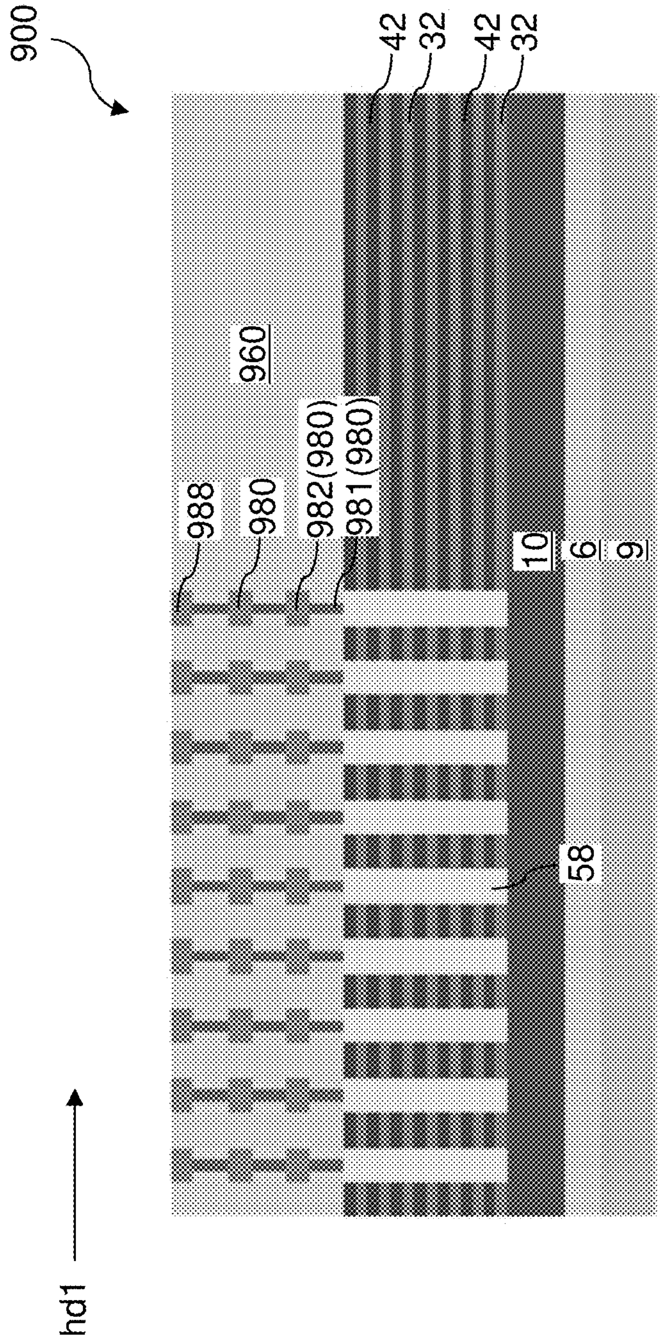
FIG. 15A is a vertical cross-sectional view of a second exemplary structure including a memory die according to an embodiment of the present disclosure.
Figure 15B:
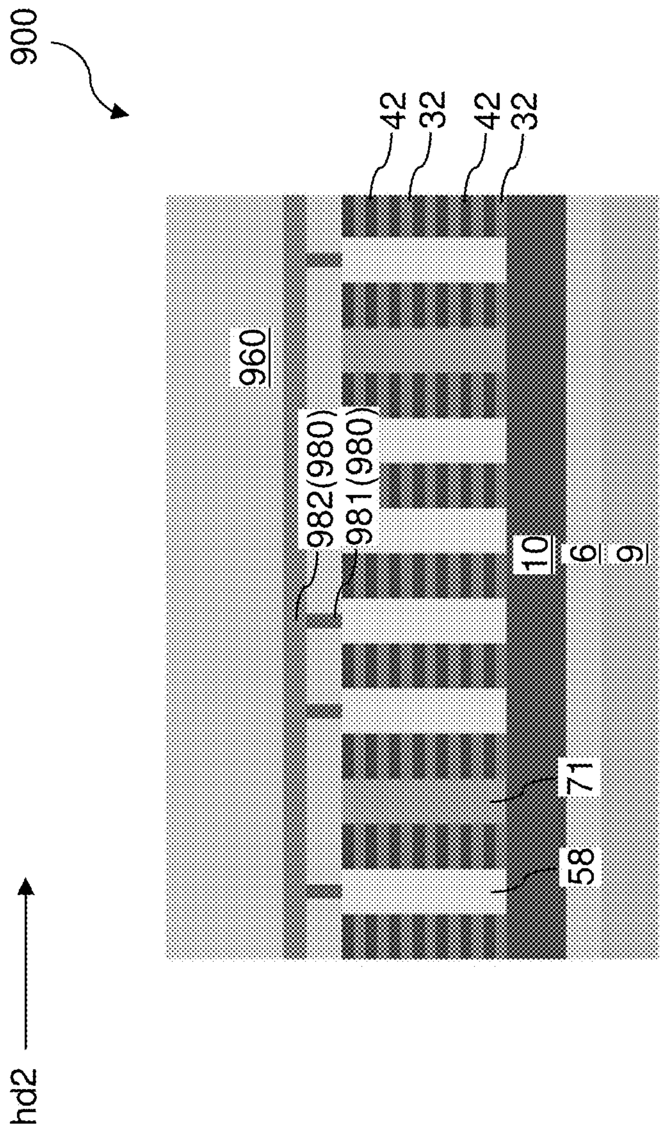
FIG. 15B is another vertical cross-sectional view of the second exemplary structure of FIG. 15A.

Referring to FIGS. 15A and 15B, a second exemplary structure which includes a memory die 900 according to a second embodiment of the present disclosure is illustrated. The memory die 900 of the second exemplary structure can be derived from the memory die 900 of the first exemplary structure illustrated in FIG. 9 by omitting the sacrificial material layer 42 replacement steps of FIGS. 6 and 7, and by forming a sacrificial backside trench fill structure 71 within each backside trench 79 at the processing steps of FIG. 8, and subsequently performing the processing steps of FIG. 9. In other words, the memory die 900 of the second exemplary structure includes sacrificial material layers 42 in lieu of the electrically conductive layers 46 within the memory die 900 of FIG. 9, and includes sacrificial backside trench fill structures 71 in lieu of backside trench fill structures (74, 76) within the memory die 900 of FIG. 9.

The sacrificial backside trench fill structures 71 can be formed by depositing a sacrificial fill material within the backside trenches 79 and by removing excess portions of the sacrificial fill material from outside the backside trenches 79 by performing a planarization process such as a chemical mechanical polishing process. The sacrificial fill material of the sacrificial backside trench fill structures 71 may include amorphous silicon, a silicon-germanium alloy, borosilicate glass, organosilicate glass, amorphous carbon, diamond-like carbon (DLC), a polymer material, or another suitable material that may be removed selective to the materials of the insulating layers 32, the sacrificial material layers 42, the doped semiconductor material layer 10, and the dielectric materials of the memory-side dielectric material layers 960.

In the second exemplary structure, the three-dimensional memory array can be formed by forming an alternating stack of insulating layers 32 and sacrificial material layers 42 over the memory-side substrate (9, 6, 10). Memory openings 49 vertically extending through the alternating stack (32, 42) are formed, and memory opening fill structures 58 are formed in the memory openings 49. Each of the memory opening fill structures 58 comprises a respective vertical stack of memory elements.

Figure 16:
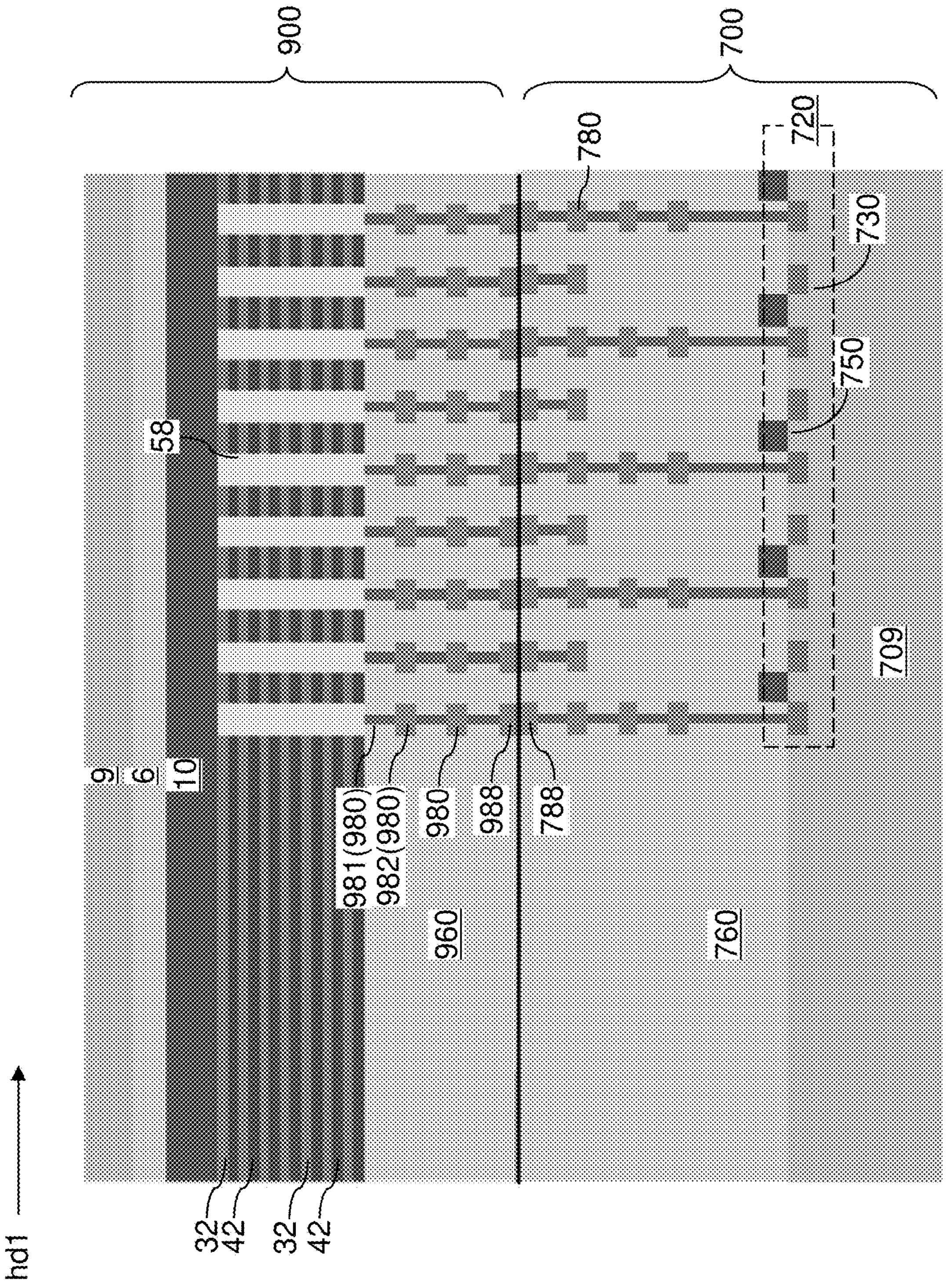
FIG. 16 is a schematic vertical cross-sectional view of the second exemplary structure after bonding the logic die with the memory die according to an embodiment of the present disclosure.

Referring to FIG. 16, the memory die 900 of the second exemplary structure can be bonded to the logic die 700 of FIG. 10. In one embodiment, metal-to-metal bonding between the memory-side bonding pads 988 and the logic-side bonding pads 788 may be performed to bond the logic die 700 to the memory die 900. Metal-to-metal bonding provides the benefit of allowing subsequent high temperature processing on the bonded assembly at processing temperatures above the temperature range of solder materials.

In one embodiment, the memory-side metal interconnect structures 980 comprise bit lines 982 of the three-dimensional memory array, and the first subset of logic devices (comprising portions of the logic-side peripheral circuit 720) in the logic die 700 comprises bit line drivers configured to drive the bit lines 982. In this case, the memory-side metal interconnect structures 980, the logic-side metal interconnect structures 780, the memory-side bonding pads 988, and the logic-side bonding pads 788 comprise electrically conductive paths that provide electrical connected between the bit lines 982 and the bit line drivers. Generally, the logic-side peripheral circuit 720 comprises a subset of the logic devices configured to control operation of the three-dimensional memory array and located on the logic-side substrate 709.

Figure 17:
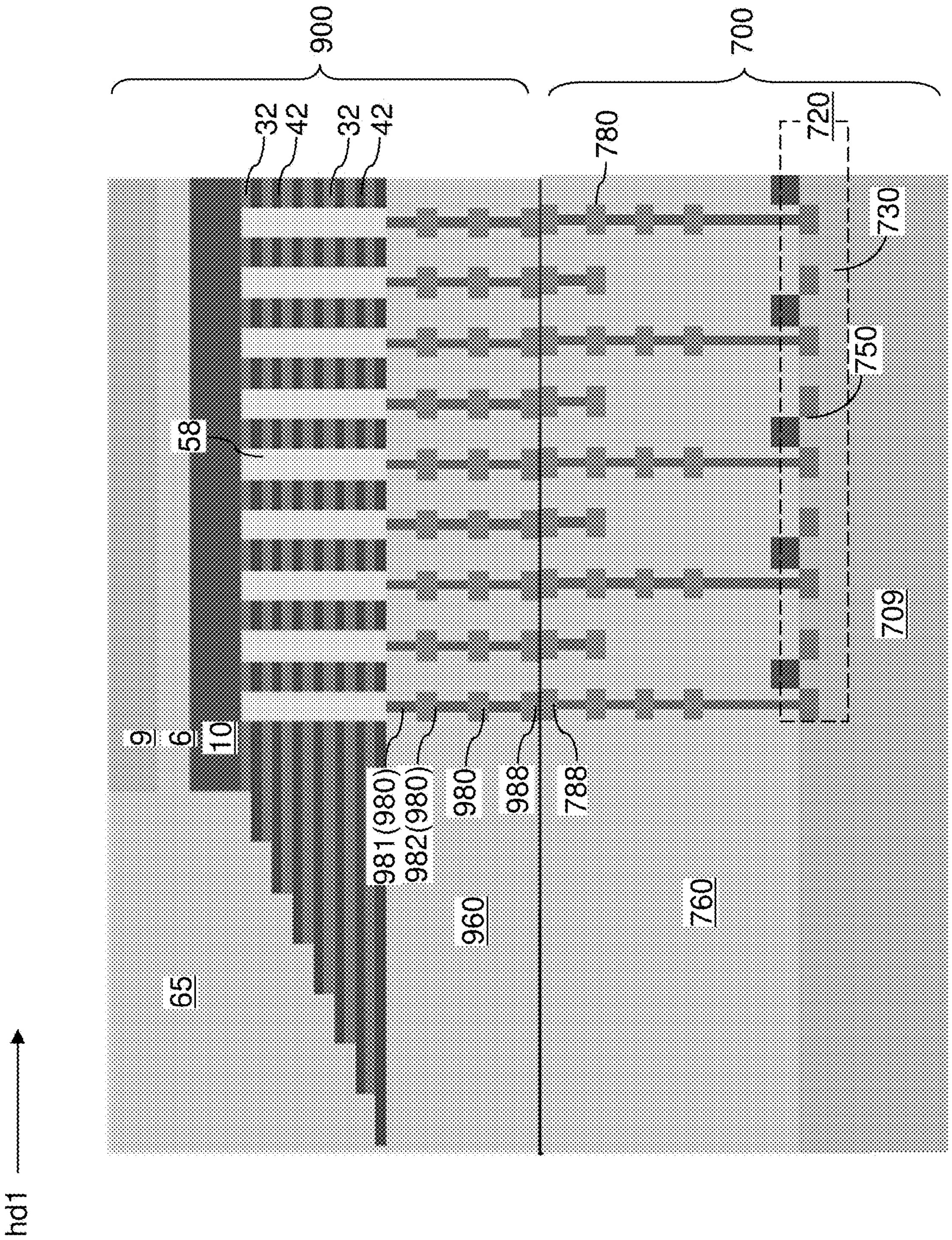
FIG. 17 is a schematic vertical cross-sectional view of the second exemplary structure after patterning a memory-side substrate and an alternating stack of insulating layers and electrically conductive layers and after formation of a stepped dielectric material portion according to an embodiment of the present disclosure.

Referring to FIG. 17, the processing steps of FIG. 12 can be performed to thin the semiconductor material layer 9 of the memory-side substrate (9, 6, 10), and to pattern the thinned memory-side substrate (9, 6, 10). Generally, the memory-side substrate (9, 6, 10) can be patterned after bonding the logic-side bonding pads 788 to the memory-side bonding pads 988. A portion of a backside surface of the alternating stack (32, 42) is physically exposed.

Further, the alternating stack (32, 42) of the insulating layers 32 and the sacrificial material layers 42 can be patterned to form a stepped cavity in regions (such as the contact region 300) from which the thinned memory-side substrate (9, 6, 10) is removed. Stepped surfaces can be formed by patterning the alternating stack (32, 42) within an area from which the memory-side substrate (9, 6, 10) is removed. The sacrificial material layers 42 have variable lateral extents that decrease with a vertical distance from a horizontal plane including bonding surfaces of the memory-side bonding pads 988 and the logic-side bonding pads 788.

A dielectric material such as doped or undoped silicate glass can be deposited in the stepped cavity over the stepped surfaces of the alternating stack (32, 42). The deposited dielectric material can be planarized by removing portions of the deposited dielectric material from above the horizontal plane including the topmost surface (i.e., the backside surface) of the semiconductor material layer 9. A remaining portion of the dielectric material that fills the stepped cavity constitutes a stepped dielectric material portion 65.

FIGS. 18A-18D are schematic sequential vertical cross-sectional views of the second exemplary structure during replacement of sacrificial material layers 42 with electrically conductive layers 46.

Figure 18B:
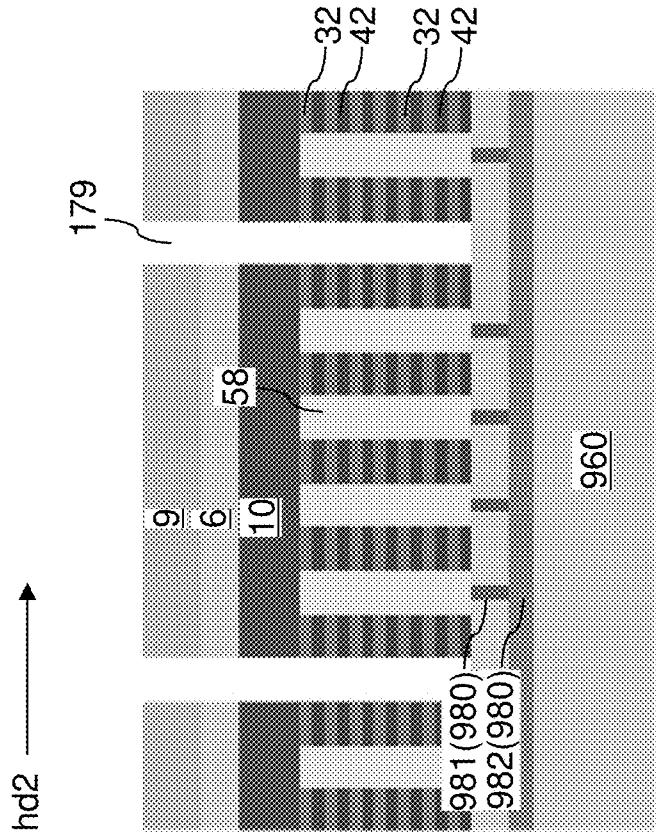
FIGS. 18A-18D are schematic sequential vertical cross-sectional views of the second exemplary structure during replacement of sacrificial material layers with electrically conductive layers according to an embodiment of the present disclosure.
Figure 18A:
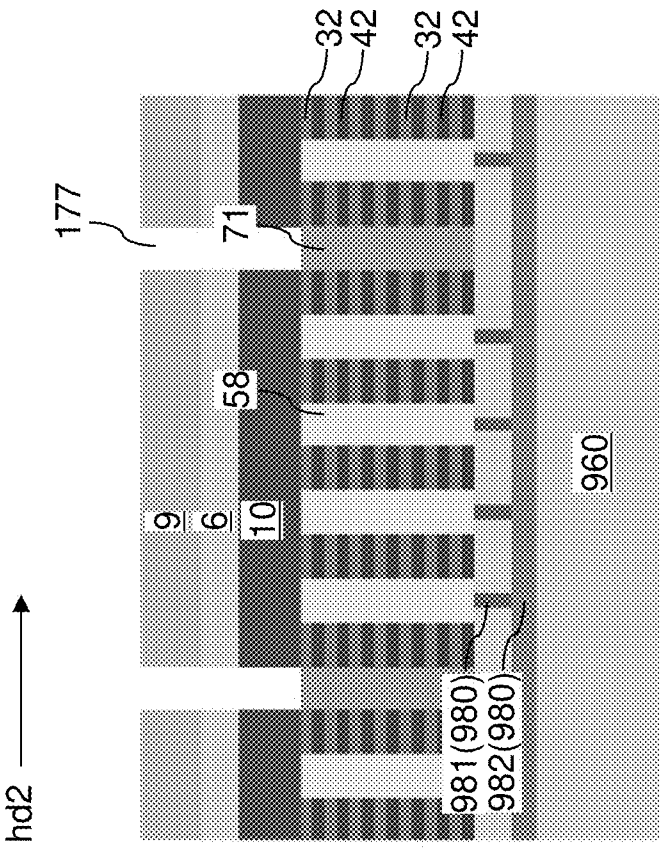

Referring to FIG. 18A, through-substrate trenches 177 can be formed through the memory-side substrate (9, 6, 10). For example, a photoresist layer (not shown) can be applied over the backside surface of the semiconductor material layer 9 of the memory-side substrate (9, 6, 10), and can be lithographically patterned with the pattern of the underlying sacrificial backside trench fill structures 71. An anisotropic etch process can be performed to etch through unmasked portions of the memory-side substrate (9, 6, 10) to form the through-substrate trenches 177. A planar surface of a sacrificial backside trench fill structure 71 can be physically exposed at the bottom of each through-substrate trench 177. The photoresist layer can be subsequently removed, for example, by ashing.

Referring to FIG. 18B, the sacrificial backside trench fill structures 71 can be removed selective to the materials of the alternating stack (32, 42) and the memory-side substrate (9, 6, 10). For example, if the sacrificial backside trench fill structures 71 comprise amorphous carbon, an ashing process may be employed to remove the sacrificial backside trench fill structures 71. Backside trenches 179 are formed, which include the volumes of the through-substrate trenches 177 and the volumes of the backside trenches 79 as formed at the processing steps of FIGS. 5A and 5B. Thus, the backside trenches 179 vertically extend from the physically exposed backside surface of the semiconductor material layer 9 of the memory-side substrate (9, 6, 10) to horizontal surfaces of the memory-side dielectric material layers 960. Generally, the backside trenches 179 vertically extend through the memory-side substrate (9, 6, 10) and the alternating stack (32, 42).

Figure 18D:
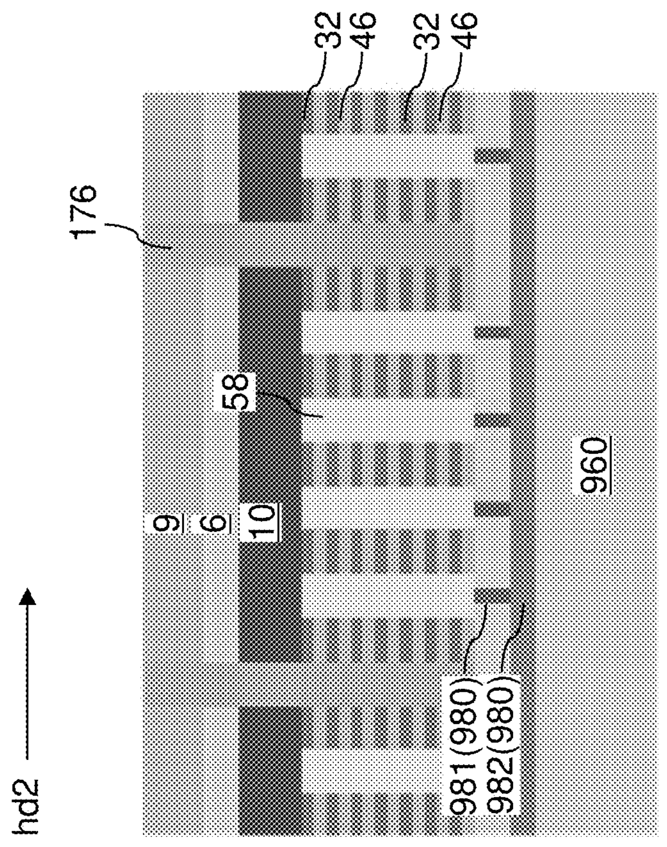
Figure 18C:
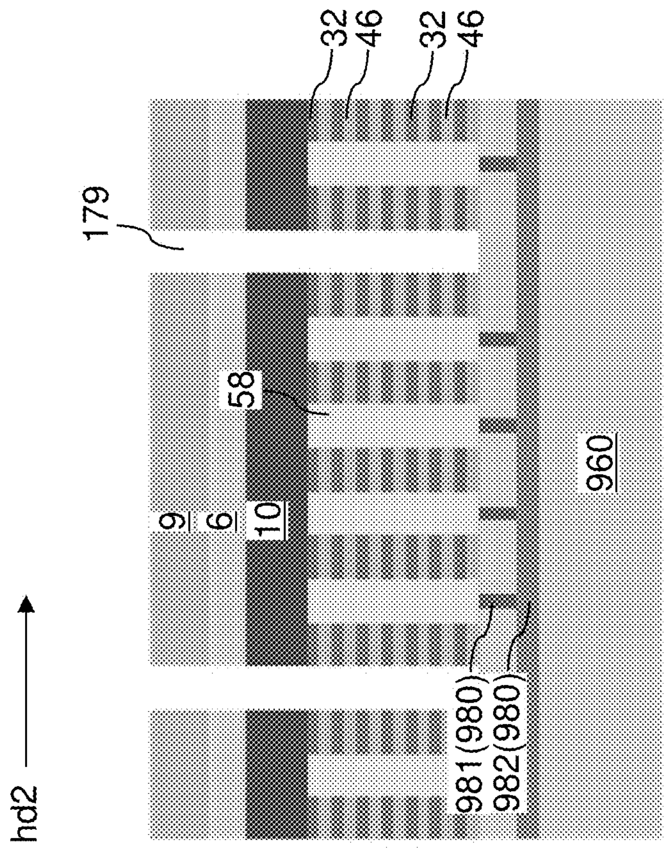

Referring to FIG. 18C, the processing steps of FIGS. 6 and 7 may be performed with any necessary changes to replace the sacrificial material layers 42 with electrically conductive layers 46. In this case, backside recesses 43 can be formed by removing the sacrificial material layers 42 selective to the insulating layers 32 by providing an isotropic etchant into the backside trenches 179. The electrically conductive layers 46 can be formed in the backside recesses 43 by providing a metal-containing reactant into the backside recesses 43 through the backside trenches 179. Metallic material portions deposited in the backside trenches 179 can be subsequently removed by performing at least one etch process, which may include an isotropic etch process or an anisotropic etch process.

Referring to FIG. 18D, a dielectric fill material can be deposited in the backside trenches 179 to form backside trench fill structures 176. The dielectric fill material may include undoped silicate glass, a doped silicate glass, silicon oxynitride, silicon nitride, and/or a dielectric metal oxide material. In one embodiment, the backside trench fill structures 176 may include silicon oxide. Dielectric surfaces of the backside trench fill structures 176 may contact sidewalls of the electrically conductive layers 46, sidewalls of the insulating layers 32, and the memory-side substrate (9, 6, 10). In one embodiment, the backside trenches 179 laterally extend along a horizontal direction and vertically extend through an alternating stack of the insulating layers 32 and the electrically conductive layers 46, and to, and through, the memory-side substrate (9, 6, 10).

Figure 19:
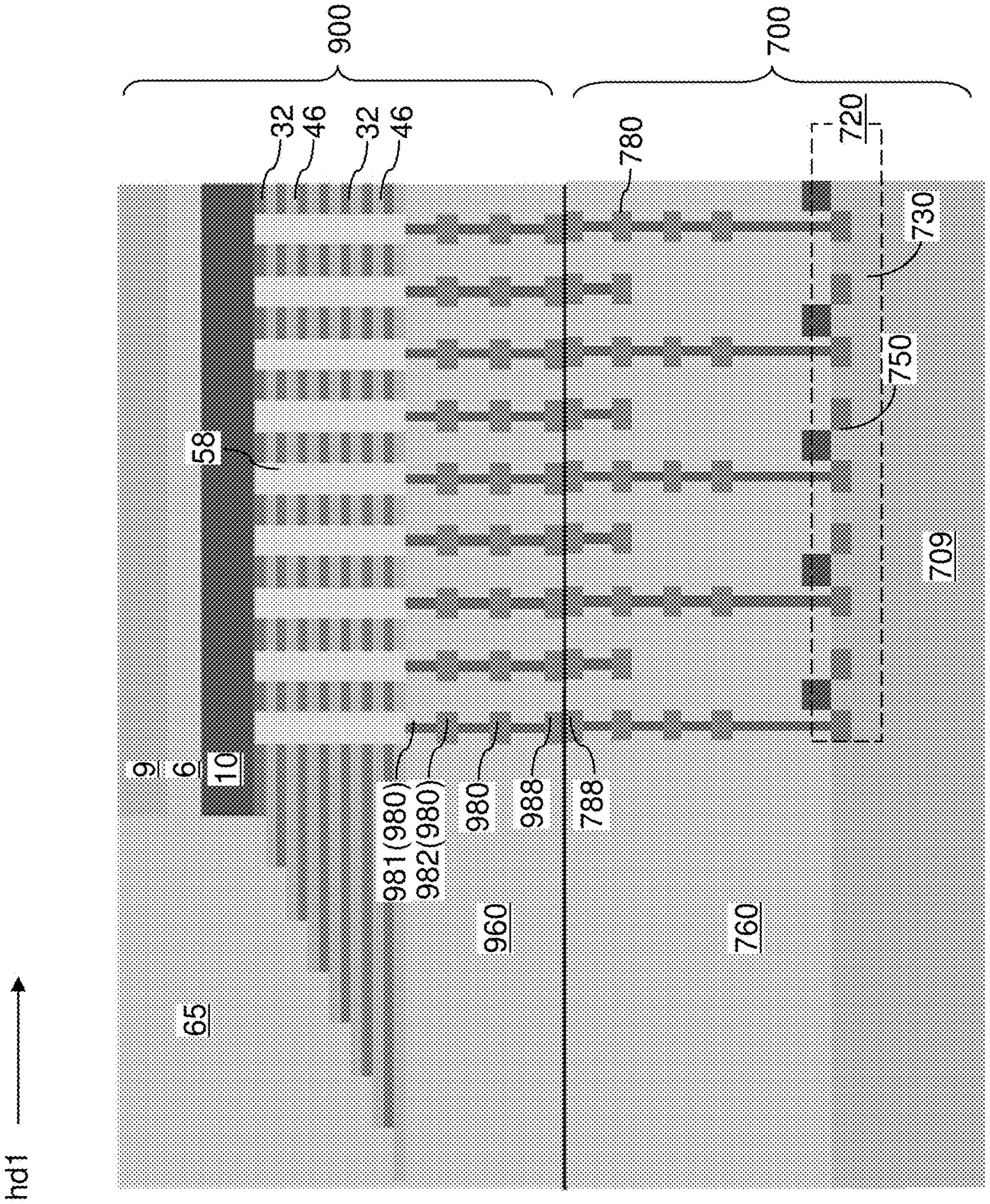
FIG. 19 is a schematic sequential vertical cross-sectional view of the second exemplary structure after replacement of sacrificial material layers with electrically conductive layers according to an embodiment of the present disclosure.

Referring to FIG. 19, the second exemplary structure is illustrated after the processing steps of FIG. 18D.

Figure 20:
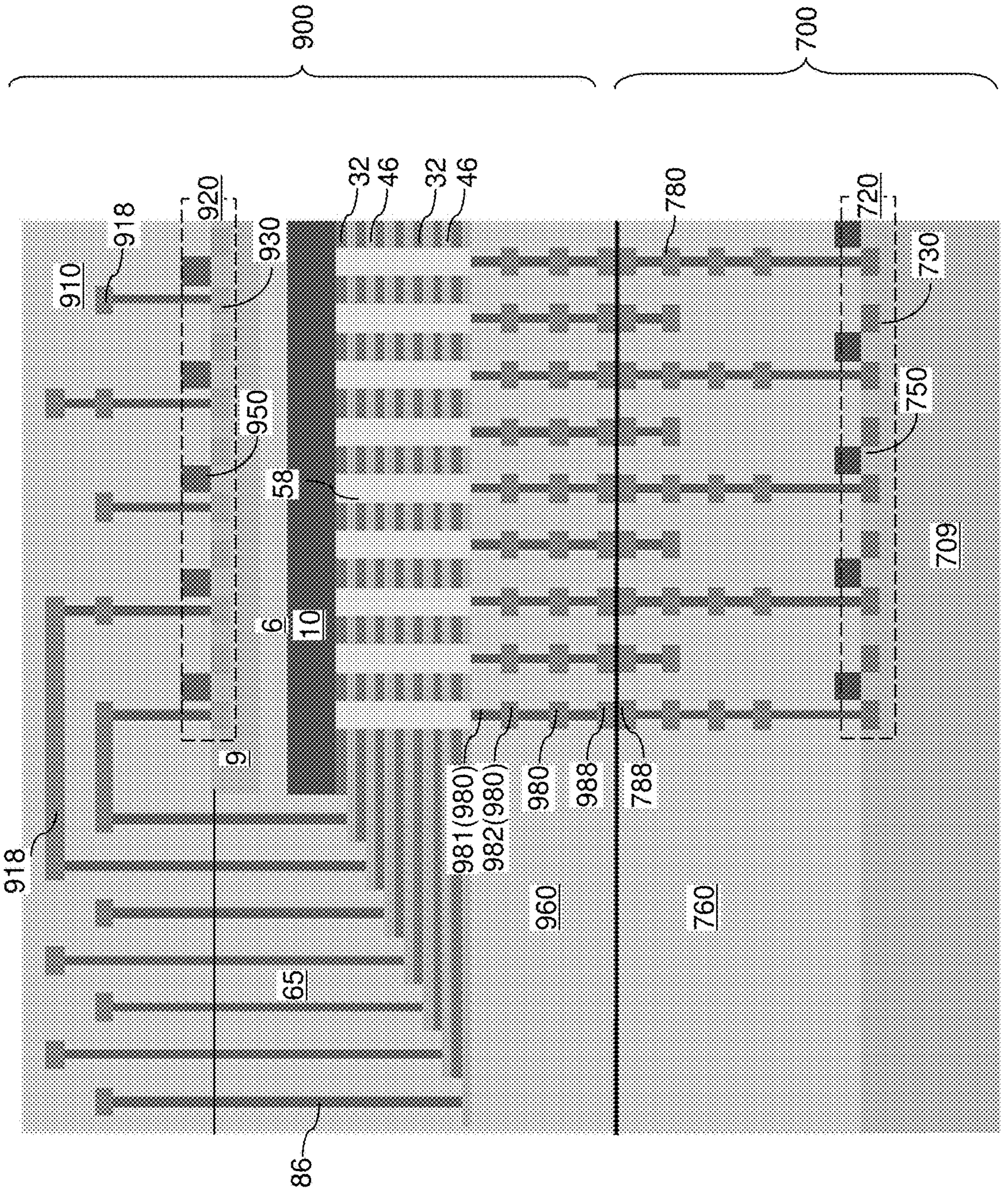
FIG. 20 is a schematic vertical cross-sectional view of the second exemplary structure after formation of a backside peripheral circuit and backside metal interconnect structures according to an embodiment of the present disclosure.

Referring to FIG. 20, the layer contact via structures 86 can be formed through the stepped dielectric material portion 65. Each of the electrically conductive layers 46 may be contacted by a respective one of the layer contact via structures 86. In one embodiment, top surfaces of the layer contact via structures 86 may be formed within the horizontal plane including the backside surface of the semiconductor material layer 9.

Subsequently, the backside peripheral circuit 920 described above with respect to the first embodiment is formed on the physically exposed surface, i.e., the backside surface, of the semiconductor material layer 9 of the memory-side substrate (9, 6, 10). The backside dielectric material layers 910 embedding backside metal interconnect structures 918 are then formed over the backside peripheral circuit 920, as described above with respect to the first embodiment. The backside metal interconnect structures 918 provide electrical connection between the layer contact via structures 86 and the backside peripheral circuit 920. The electrically conductive layers 46 can be electrically connected to the backside peripheral circuit 920 via the layer contact via structures 86 and the backside metal interconnect structures 918. In one embodiment, the electrically conductive layers 46 may comprise word lines for the three-dimensional memory array, and the second subset of logic devices for controlling operation of the three-dimensional memory array may comprise word line drivers configured to apply control voltages to the electrically conductive layers 46.

Generally, the backside dielectric material layers 910 can be formed on the backside, i.e., a second side, of the combination of three-dimensional memory array and the memory-side substrate (9, 6, 10) that is an opposite side of the first side. The backside dielectric material layers 910 embed backside metal interconnect structures 918 that provide electrical connection between the three-dimensional memory array and the backside peripheral circuit 920. At least one backside metal structure may be formed over and/or embedded in the backside dielectric material layers 910, as described above with respect to FIG. 14.

Referring to FIGS. 1-20 and according to various embodiments of the present disclosure, a bonded assembly comprising a memory die 900 that is bonded to a logic die 700 is provided. The memory die 900 comprises: a three-dimensional memory array located on a memory-side substrate (9, 6, 10); memory-side dielectric material layers 960 located on a first side of a combination of three-dimensional memory array and the memory-side substrate (9, 6, 10); memory-side metal interconnect structures 980 and memory-side bonding pads 988 embedded in the memory-side dielectric material layers; a backside peripheral circuit 920 comprising a first subset of logic devices configured to control operation of the three-dimensional memory array and located on a backside surface of the memory-side substrate; backside dielectric material layers 910 located on a second side of the combination of three-dimensional memory array and the memory-side substrate (9, 6, 10) that is an opposite side of the first side; and backside metal interconnect structures 918 that provide electrical connection between the three-dimensional memory array and the backside peripheral circuit 920 embedded in the backside dielectric material layers. The logic die 700 comprises: a logic-side peripheral circuit 720 comprising a second subset of the logic devices configured to control operation of the three-dimensional memory array and located on a logic-side substrate 709; logic-side dielectric material layers 760 located between the logic-side substrate 709 and the memory die 900; and logic-side metal interconnect structures 780 and logic-side bonding pads 788 that are bonded to a respective one of the memory-side bonding pads 988 embedded in the logic-side dielectric material layers.

In one embodiment, the three-dimensional memory array comprises an alternating stack of insulating layers 32 and electrically conductive layers 46, memory openings 49 vertically extending through the alternating stack (32, 46), and memory opening fill structures 58 located within the memory openings 49 and comprising a respective vertical stack of memory elements (which may comprise portions of a memory material layer 54 located at levels of the electrically conductive layers 46).

In one embodiment, the alternating stack (32, 46) further comprises a staircase region in which the electrically conductive layers 46 having variable lateral extents that decrease with a vertical distance from a horizontal plane including bonding surfaces of the memory-side bonding pads 988. Each of the memory opening fill structures 58 further comprises a vertical semiconductor channel 60.

In one embodiment, layer contact via structures 86 can contact horizontal surfaces of a respective one of the electrically conductive layers 46 within the stair case region, can vertically extend from the respective one of the electrically conductive layers 46 along a vertical direction away from a bonding interface between the memory die 900 and the logic die 700, and are electrically connected to a respective one of the backside metal interconnect structures 918 and the backside peripheral circuit 920.

In one embodiment, the first subset of logic devices comprises word line drivers configured to apply control voltages to the electrically conductive layers 46; and the electrically conductive layers 46 comprise word lines of the three-dimensional memory array.

In one embodiment, the memory-side metal interconnect structures 980 comprise bit lines 982 of the three-dimensional memory array; the second subset of logic devices in the logic die 700 comprises bit line drivers configured to drive the bit lines 982; and the memory-side metal interconnect structures 980, the logic-side metal interconnect structures 780, the memory-side bonding pads 988, and the logic-side bonding pads 788 comprise electrically conductive paths that provide electrical connected between the bit lines 982 and the bit line drivers.

In one embodiment, the memory-side substrate (9, 6, 10) comprises a single crystalline semiconductor material (e.g., the semiconductor material layer 9); the first subset of logic devices within the backside peripheral circuit 920 comprises first field effect transistors including source regions and drain regions that are doped portions of the single crystalline semiconductor material; and gate electrodes of the first field effect transistors are more distal from the logic die 700 than the source regions and the drain regions of the first field effect transistors are from the logic die 700. The additional subset of logic devices within the logic-side peripheral circuit 720 comprise second field effect transistors including source regions and drain regions that are doped portions of a single crystalline semiconductor material of a logic-side substrate 709; and gate electrodes of the second field effect transistors are more proximal to the memory die 900 than the source regions and the drain regions of the second field effect transistors are to the memory die 900.

In one embodiment, the memory-side substrate (9, 6, 10) comprises: a backside insulating layer 6 in contact with the single crystalline semiconductor material (e.g., the material of the semiconductor material layer 9); and a doped semiconductor material layer 10 in contact with the memory opening fill structures 58.

In one embodiment illustrated in FIG. 3I, each of the memory opening fill structures 58 further comprises a respective vertical semiconductor channel 60 located in proximity to the respective vertical stack of memory elements and having a doping of a first conductivity type; and the doped semiconductor material layer 10 is in contact with each of the vertical semiconductor channels 60.

In another embodiment illustrated in FIG. 3H, the doped semiconductor material layer 10 comprises a single crystalline semiconductor material layer; and each of the memory opening fill structures 58 comprises a respective pedestal channel portion 11 comprising a single crystalline semiconductor material portion having a single crystalline lattice structure in epitaxial alignment with a single crystalline semiconductor material of the doped semiconductor material layer 10.

In one embodiment, the bonded assembly comprises: backside trenches (79 or 179) laterally extending along a horizontal direction and vertically extending through the alternating stack (32, 46) and extending to, and/or through, the memory-side substrate (9, 6, 10); and backside trench fill structures {(74, 76) or 176} located within the backside trenches (79 or 179) and comprising dielectric surfaces that contact sidewalls of the alternating stack (32, 46) and the memory-side substrate (9, 6, 10).

The various embodiments of the present disclosure may be employed to provide the peripheral circuitry at two levels of a bonded assembly. Specifically, a logic-side peripheral circuit 720 (e.g., bit line driver) can be provided in a logic die 700, and a backside peripheral circuit 920 (e.g., word line driver) can be provided on the backside of a memory die 900. Metallic via structures for the connecting word lines 46 with the word line driver circuitry 920 which vertically extending through the levels of the alternating stack (32, 46) of insulating layers 32 and electrically conductive layers 46 can be eliminated, or can be minimized. This simplifies the device manufacturing and reduces process cost. Further, the lateral electrical wiring to electrically connect various nodes of a three-dimensional memory array to devices of the peripheral circuitry can be reduced by forming the peripheral circuitry at two levels, i.e., at the level of the logic-side peripheral circuit 720 and at the level of the backside support circuit 920. Thus, the overall area of the bonded assembly can be reduced to provide a more compact semiconductor device. In other words, the CMOS driver circuit area may be doubled with no corresponding die size increase. The CMOS devices do not need to stick out from the memory array region 100. Thus, the die size can be reduced, packaging is improved and device performance can be improved with additional memory planes.

Figure 21:
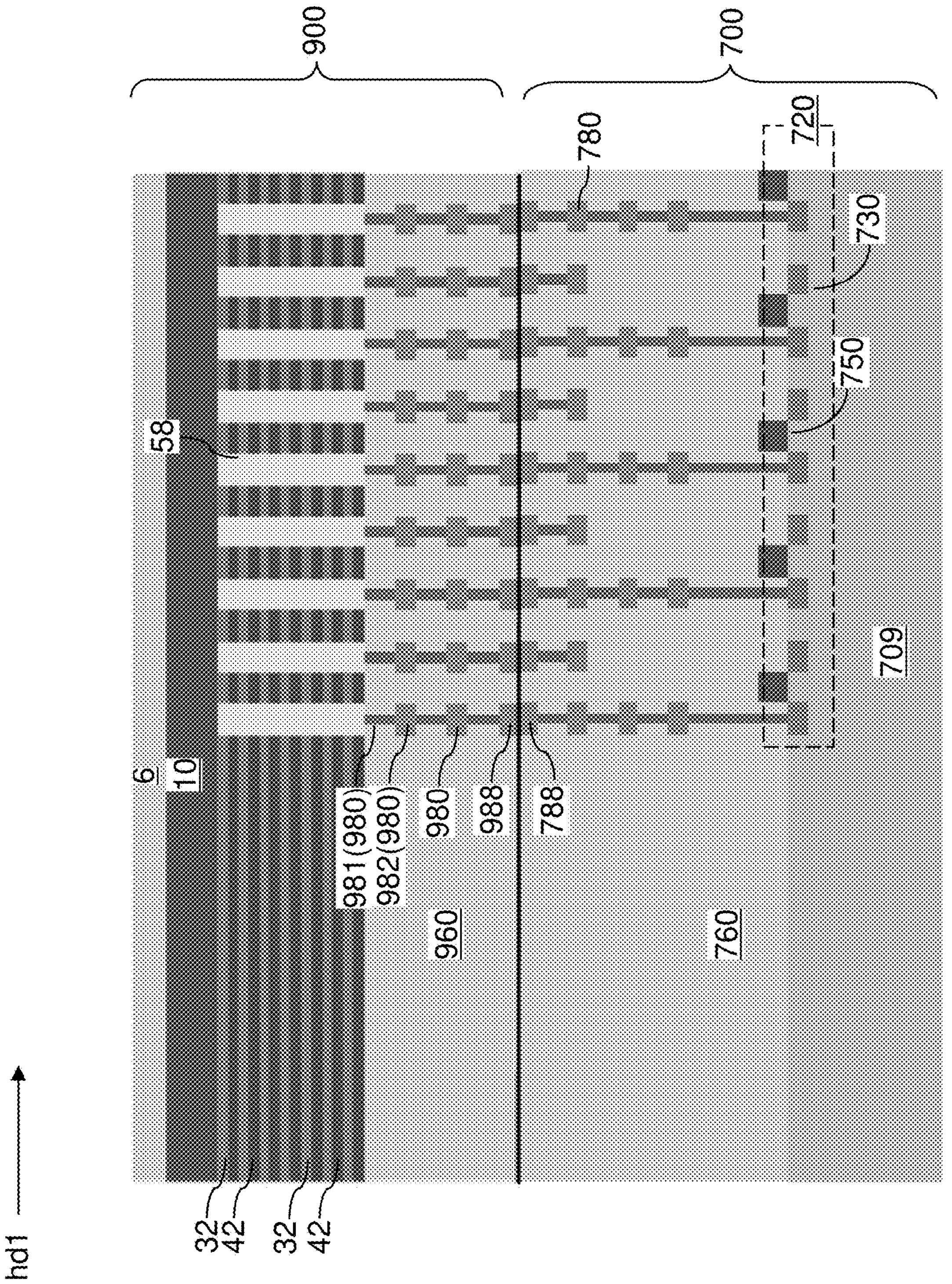
FIG. 21 is a schematic vertical cross-sectional view of a third exemplary structure after bonding a first logic die with the memory die according to an embodiment of the present disclosure.

Referring to FIG. 21, a third exemplary structure according to an embodiment of the present disclosure can be derived from the second exemplary structure illustrated in FIG. 16 by removing the semiconductor material layer 9 after bonding the memory die 900 to the logic die 700, which is hereafter referred to as a first logic die 700. In one embodiment, the semiconductor material layer 9 may comprise a semiconductor wafer or a portion of a semiconductor wafer having a thickness in a range from 100 microns to 1 mm. In this case, the semiconductor material layer 9 can be removed by grinding, polishing, an isotropic etch process, and/or an anisotropic etch process. In one embodiment, the last step of at least one process that removes the semiconductor material layer 9 may be selective to the material of the backside insulating layer 6.

Generally, the memory die 900 can be prepared by forming an alternating stack of insulating layers 32 and spacer material layers on a first side of the doped semiconductor material layer 10, which may be provide on a top surface of a backside insulating layer 6 that overlies a semiconductor material layer 9. The spacer material layers are formed as, or are subsequently replaced with, electrically conductive layers. In one embodiment, the spacer material layers can be formed as sacrificial material layers 42. Memory openings 49 can be formed through the alternating stack, and memory opening fill structures 58 can be formed in the memory openings 49. Each of the memory opening fill structures 58 comprises a vertical semiconductor channel 60 and a respective vertical stack of memory elements (e.g., portions of the memory film). A three-dimensional memory array can be provided on the first side of a doped semiconductor material layer 10. Subsequently, memory-side dielectric material layers 960 embedding memory-side metal interconnect structures 980 and first memory-side bonding pads 988 can be formed over the three-dimensional memory array. In one embodiment, the memory-side metal interconnect structures 980 comprise bit lines 982 of the three-dimensional memory array and drain contact via structures 981 that contact drain regions 63 of the memory opening fill structures 58. The semiconductor material layer 9 can be subsequently removed to provide the memory die 900 illustrated in FIG. 21.

The first logic die 700 includes a first logic-side peripheral circuit 720 comprising a first subset of logic devices configured to control operation of the three-dimensional memory array in the memory die 900. For example, the first logic-side peripheral circuit 720 may control the bit lines 982 and may include bit line drivers, such as a sense amplifier circuit. The first logic-side peripheral circuit 720 may be located on a first logic-side substrate 709, and may include logic-side dielectric material layers 760 embedding logic-side metal interconnect structures 780 and first logic-side bonding pads 788. In one embodiment, the first logic-side substrate 709 comprises a first single crystalline semiconductor material layer, and the first subset of the logic devices within the first logic-side peripheral circuit 720 comprises first field effect transistors including first source/drain regions 730 (which include first source regions and first drain regions) that are doped portions of the first single crystalline semiconductor material layer. In one embodiment, the first subset of the logic devices in the first logic-side peripheral circuit 720 comprises bit line drivers configured to drive the bit lines 982.

The first logic die 700 and the memory die 900 can be bonded to each other by bonding the first logic-side bonding pads 788 with the first memory-side bonding pads 988. Generally, the memory-side metal interconnect structures 980, the logic-side metal interconnect structures 780, the first memory-side bonding pads 988, and the first logic-side bonding pads 788 comprise electrically conductive paths that provide electrical connection between the bit lines 982 and the bit line drivers within the first logic-side peripheral circuit 720.

In one embodiment, first gate electrodes 750 of the first field effect transistors are more proximal to a horizontal plane including a bonding interface between the first logic die 700 and the memory die 900 than the first source regions and the first drain regions of the first field effect transistors are from the bonding interface. In one embodiment, the memory die 900 comprises a backside insulating layer 6 in contact with a backside surface of the doped semiconductor material layer 10.

Figure 22:
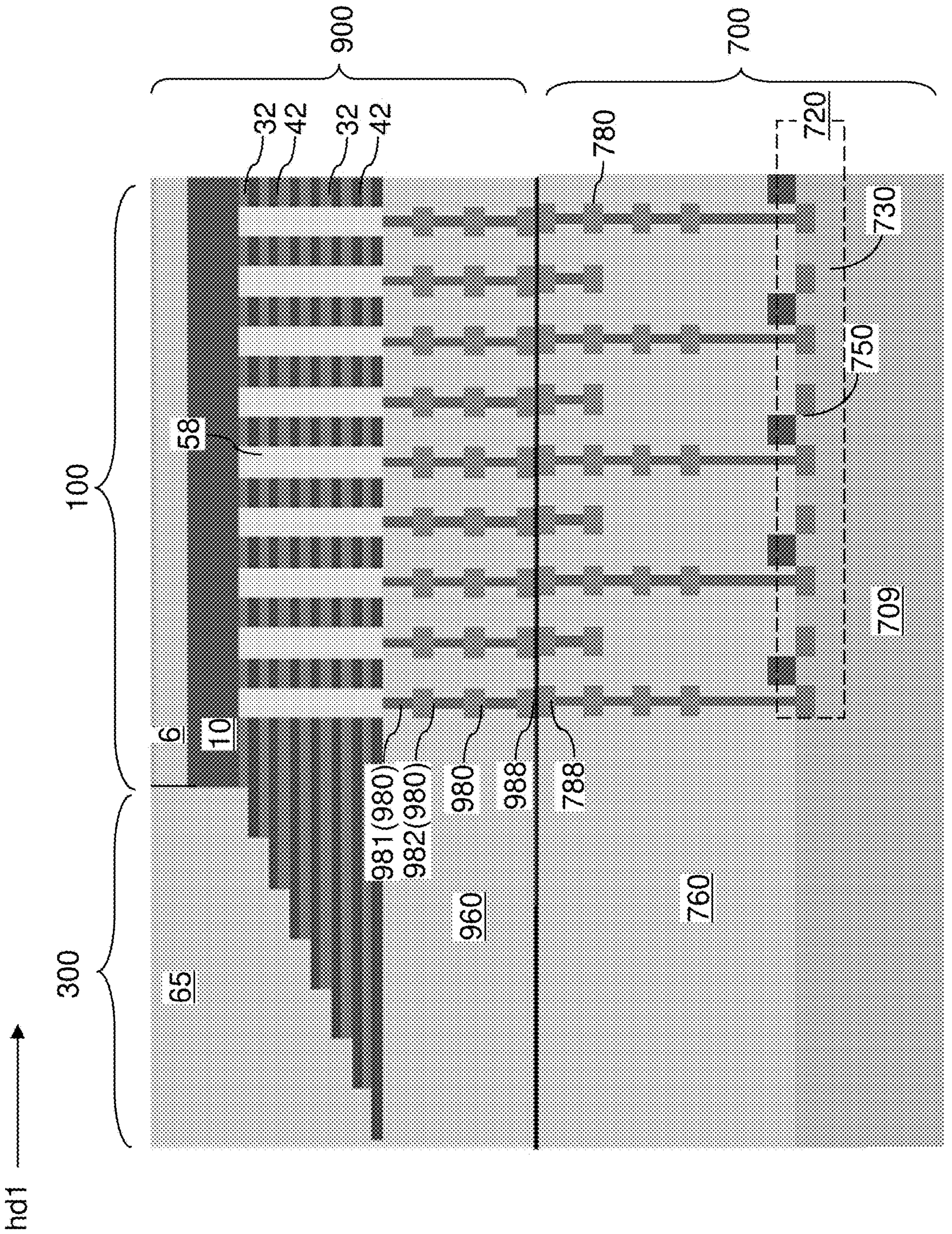
FIG. 22 is a schematic vertical cross-sectional view of the third exemplary structure after formation of a stepped dielectric material portion according to an embodiment of the present disclosure.

Referring to FIG. 22, the backside insulating layer 6 and the doped semiconductor material layer 10 can be patterned after bonding the first logic-side bonding pads 788 to the first memory-side bonding pads 988. Generally, the doped semiconductor material layer 10 can be patterned after bonding the first logic-side bonding pads 788 with the first memory-side bonding pads 988. A portion of a backside surface of the alternating stack (32, 42) is physically exposed.

Subsequently, the alternating stack (32, 42) of the insulating layers 32 and the sacrificial material layers 42 can be patterned to form a stepped cavity in regions (such as the contact region 300) from which portions of the backside insulating layer 6 and the doped semiconductor material layer 10 are removed. Stepped surfaces can be formed by patterning the alternating stack (32, 42) within an area from which the backside insulating layer 6 and the doped semiconductor material layer 10 are removed. The sacrificial material layers 42 have variable lateral extents that decrease with a vertical distance from a horizontal plane including bonding surfaces of the first memory-side bonding pads 988 and the first logic-side bonding pads 788.

A dielectric material such as doped or undoped silicate glass can be deposited in the stepped cavity over the stepped surfaces of the alternating stack (32, 42). The deposited dielectric material can be planarized by removing portions of the deposited dielectric material from above the horizontal plane including the topmost surface (i.e., the backside surface) of the backside insulating layer 6. A remaining portion of the dielectric material that fills the stepped cavity constitutes a stepped dielectric material portion 65 over the stepped surfaces of the alternating stack (32, 42).

FIGS. 23A-23D are schematic sequential vertical cross-sectional views of the third exemplary structure during replacement of sacrificial material layers 42 with electrically conductive layers 46 according to an embodiment of the present disclosure.

Figure 23A:
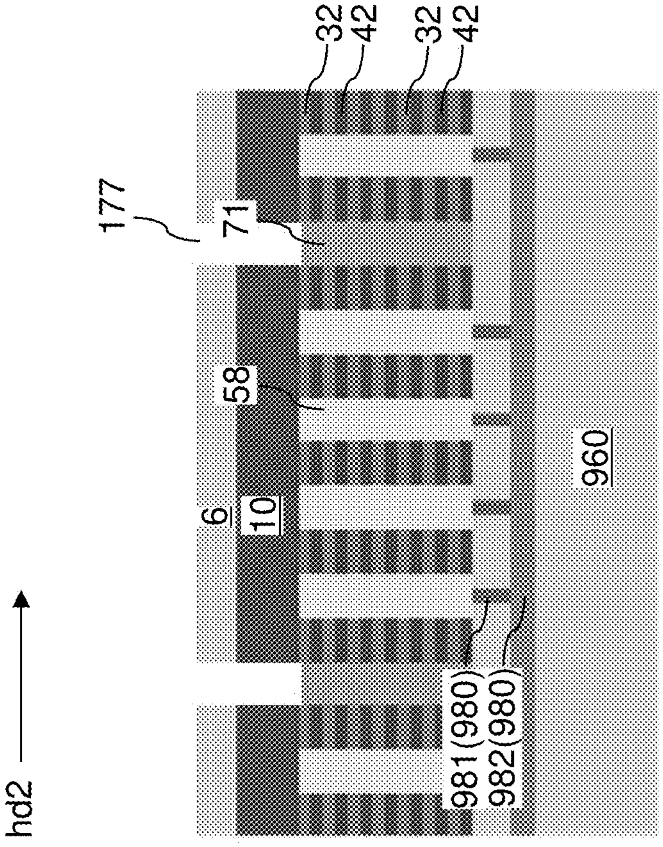
FIGS. 23A-23D are schematic sequential vertical cross-sectional views of the third exemplary structure during replacement of sacrificial material layers with electrically conductive layers according to an embodiment of the present disclosure.

Referring to FIG. 23A, through-substrate trenches 177 can be formed through the backside insulating layer 6 and the doped semiconductor material layer 10. For example, a photoresist layer (not shown) can be applied over the backside surface of the backside insulating layer 6, and can be lithographically patterned with the pattern of the underlying sacrificial backside trench fill structures 71. An anisotropic etch process can be performed to etch through unmasked portions of the backside insulating layer 6 and the doped semiconductor material layer 10 to form the through-substrate trenches 177. A planar surface of a sacrificial backside trench fill structure 71 can be physically exposed at the bottom of each through-substrate trench 177. The photoresist layer can be subsequently removed, for example, by ashing.

Figure 23B:
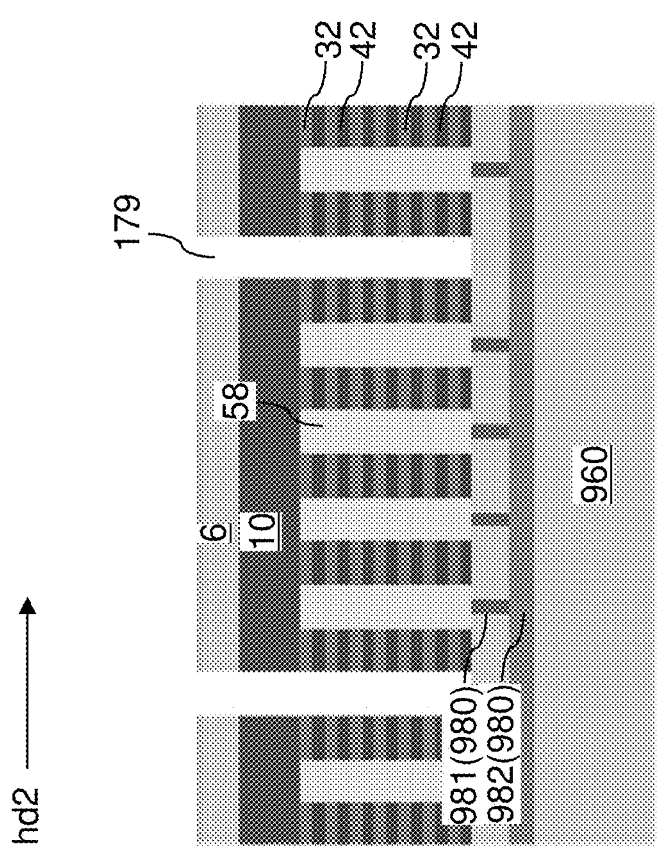

Referring to FIG. 23B, the sacrificial backside trench fill structures 71 can be removed selective to the materials of the alternating stack (32, 42), the backside insulating layer 6 and the doped semiconductor material layer 10. For example, if the sacrificial backside trench fill structures 71 comprise amorphous carbon, an ashing process may be employed to remove the sacrificial backside trench fill structures 71. Backside trenches 179 are formed, which include the volumes of the through-substrate trenches 177 and the volumes of the backside trenches 79 as formed at the processing steps of FIGS. 5A and 5B. Thus, the backside trenches 179 vertically extend from the physically exposed backside surface of the backside insulating layer 6 to horizontal surfaces of the memory-side dielectric material layers 960. Generally, the backside trenches 179 vertically extend through the backside insulating layer 6 and the doped semiconductor material layer 10 and the alternating stack (32, 42).

Figure 23C:
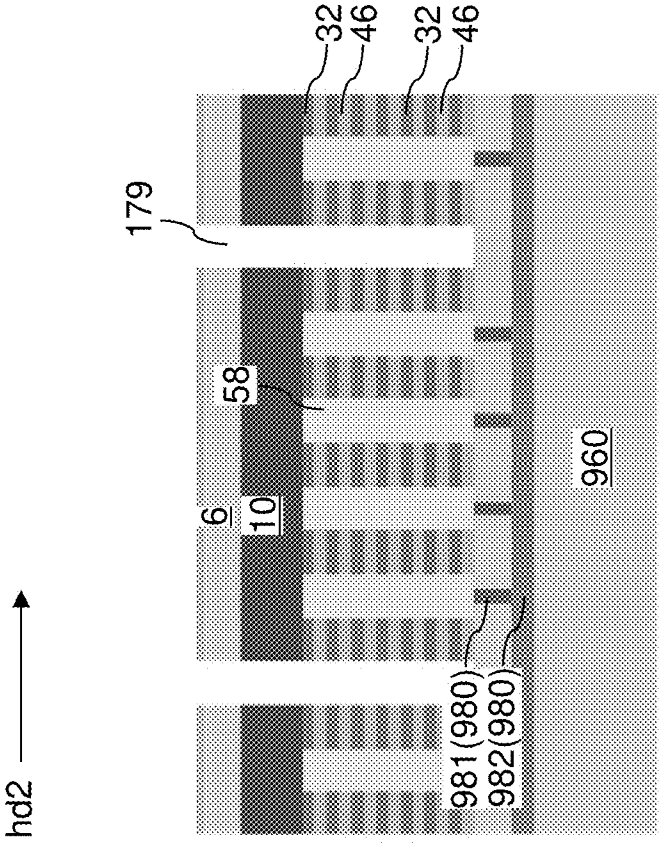

Referring to FIG. 23C, the processing steps of FIGS. 6 and 7 may be performed with any necessary changes to replace the sacrificial material layers 42 with electrically conductive layers 46. In this case, backside recesses 43 can be formed by removing the sacrificial material layers 42 selective to the insulating layers 32 by providing an isotropic etchant into the backside trenches 179. The electrically conductive layers 46 can be formed in the backside recesses 43 by providing a metal-containing reactant into the backside recesses 43 through the backside trenches 179. Metallic material portions deposited in the backside trenches 179 can be subsequently removed by performing at least one etch process, which may include an isotropic etch process or an anisotropic etch process.

Figure 23D:
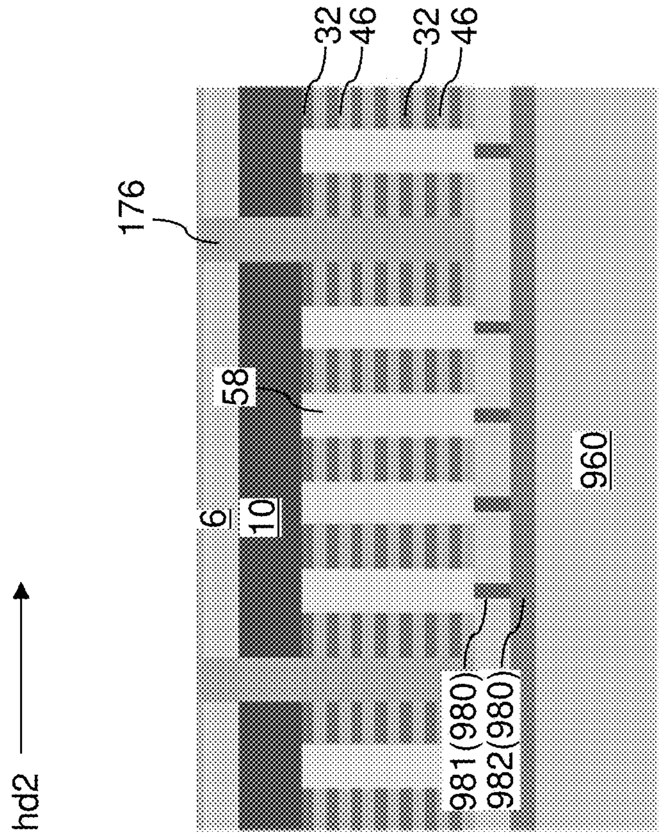

Referring to FIG. 23D, a dielectric fill material can be deposited in the backside trenches 179 to form backside trench fill structures 176. The dielectric fill material may include undoped silicate glass, a doped silicate glass, silicon oxynitride, silicon nitride, and/or a dielectric metal oxide material. In one embodiment, the backside trench fill structures 176 may include silicon oxide. Dielectric surfaces of the backside trench fill structures 176 may contact sidewalls of the electrically conductive layers 46, sidewalls of the insulating layers 32, and the backside insulating layer 6 and the doped semiconductor material layer 10. In one embodiment, the backside trenches 179 laterally extend along a horizontal direction and vertically extend through an alternating stack of the insulating layers 32 and the electrically conductive layers 46, and to, and through, the memory-side substrate (9, 6, 10).

Figure 24:
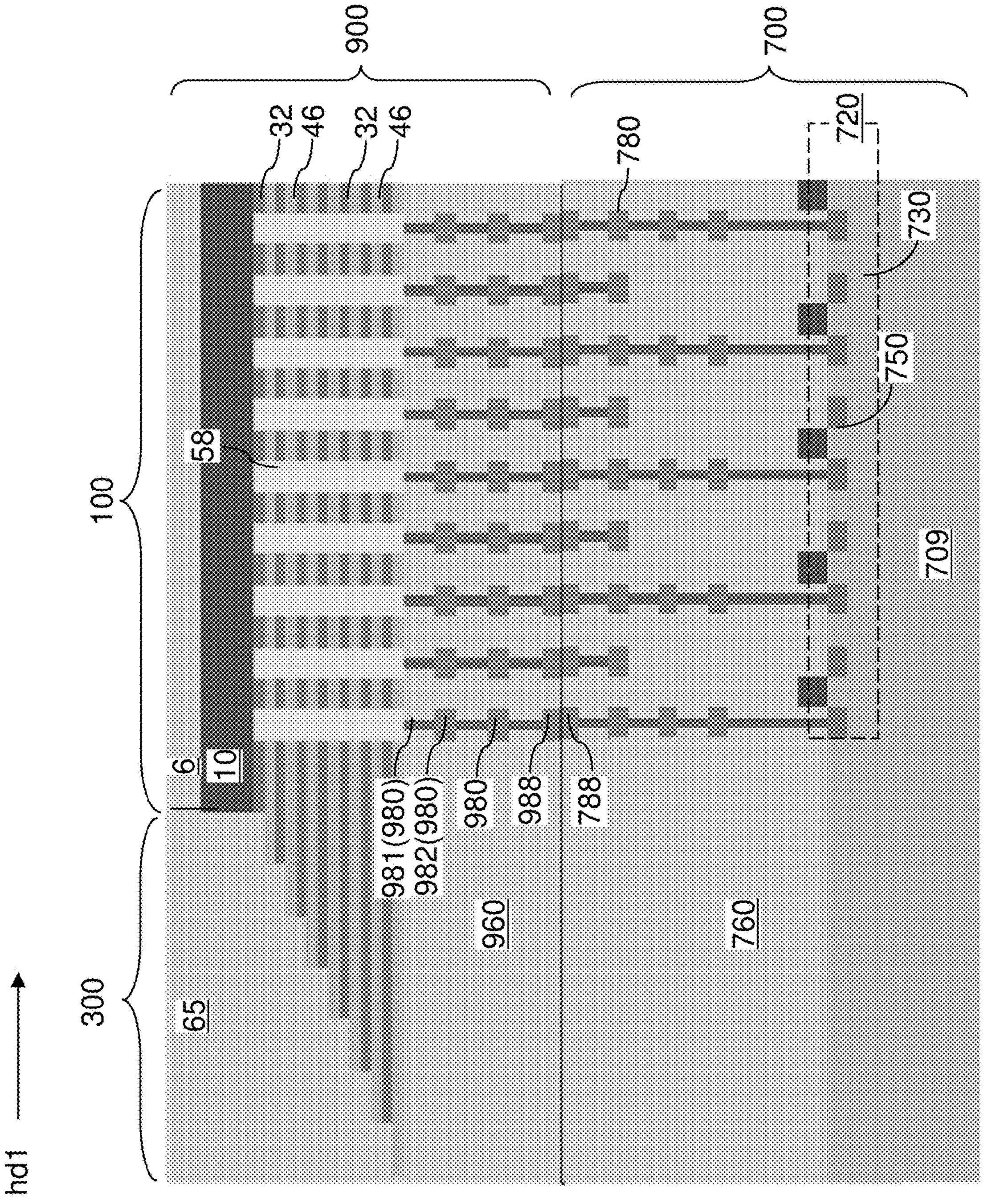
FIG. 24 is a schematic sequential vertical cross-sectional view of the third exemplary structure after replacement of sacrificial material layers with electrically conductive layers according to an embodiment of the present disclosure.

Referring to FIG. 24, the second exemplary structure is illustrated after the processing steps of FIG. 23D. An alternating stack of insulating layers 32 and electrically conductive layers 46 is formed in the memory die 900. The alternating stack (32, 46) comprises a contact region (e.g., staircase region) 300 in which the electrically conductive layers 46 have variable lateral extents that decrease with increasing vertical distance from a horizontal plane including bonding surfaces of the first memory-side bonding pads 988, i.e., the horizontal plane including the bonding interfaces between the memory die 900 and the first logic die 700. In one embodiment, the electrically conductive layers 46 comprise word lines of the three-dimensional memory array.

Generally, the memory die 900 can comprise a two-dimensional array of memory openings 49 vertically extending through the alternating stack (32, 46), and a two-dimensional array of memory opening fill structures 58 located in the two-dimensional array of memory openings 49. Each of the memory opening fill structures 58 comprises a respective one of the memory stack structures 55. In one embodiment, each of the memory stack structures 55 comprises a respective vertical semiconductor channel 60 and a respective vertical stack of memory elements (such as portions of a memory material layer 54 located at levels of the electrically conductive layers 46), and the doped semiconductor material layer 10 is in contact with each of the vertical semiconductor channels 60.

Figure 25:
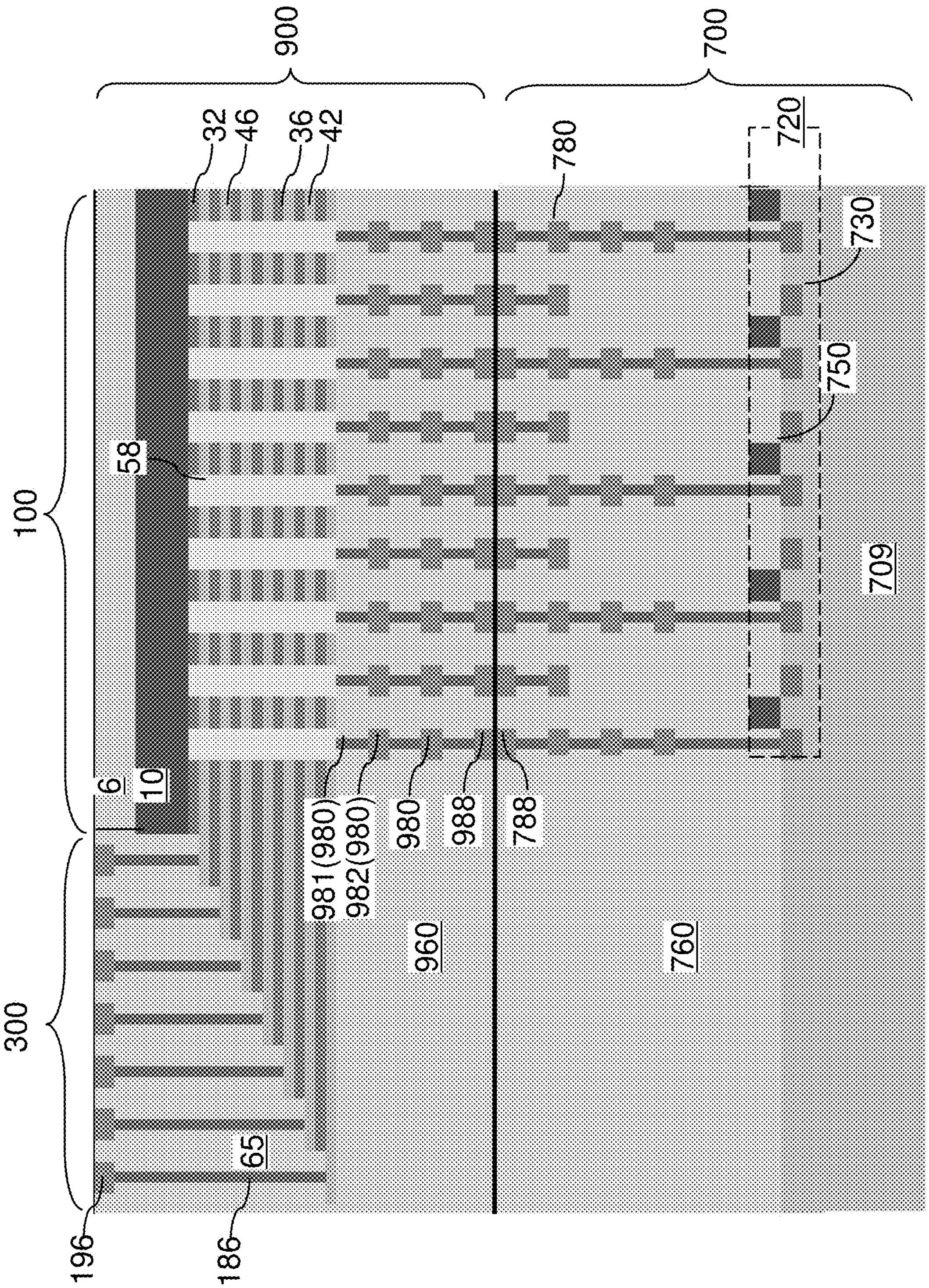
FIG. 25 is a schematic sequential vertical cross-sectional view of the third exemplary structure after formation word-line contact via structures and second memory-side bonding pads according to an embodiment of the present disclosure.

Referring to FIG. 25, layer contact via structures (i.e., word line contact structures) 186 can be formed through the stepped dielectric material portion 65. In one embodiment, contact via cavities can be formed through the stepped dielectric material portion 65 to a horizontal surface of a respective one of the electrically conductive layers 46, and can be filled with at least one conductive material (such as at least one metallic material) to form the layer contact via structures 186. Generally, the layer contact via structures 186 can contact horizontal surfaces of a respective one of the electrically conductive layers 46 within the staircase region, can vertically extend from the respective one of the electrically conductive layers 46 along a vertical direction away from the horizontal plane including the bonding surfaces of the first memory-side bonding pads 988. A subset of the electrically conductive layers 46 may comprise word lines of the three-dimensional memory array, and a subset of the layer contact via structures 186 that contact the word lines comprise word-line contact via structures.

Second memory-side bonding pads 196 can be formed on, or around, a respective one of the layer contact via structures 186. The layer contact via structures 186 and the second memory-side bonding pads 196 may be formed sequentially or simultaneously. The second memory-side bonding pads 196 can be formed on an opposite side of the first memory-side bonding pads 988 within the memory die 900. Generally, the memory die 900 can comprises second memory-side bonding pads 196 that are located on the second side of the doped semiconductor material layer 10 that is an opposite side of the first side of the doped semiconductor material layer 10. In one embodiment, the physically exposed surfaces of the second memory-side bonding pads 196 may be coplanar with the backside surface of the backside insulating layer 6 and a backside surface of the stepped dielectric material portion 65.

Figure 26:
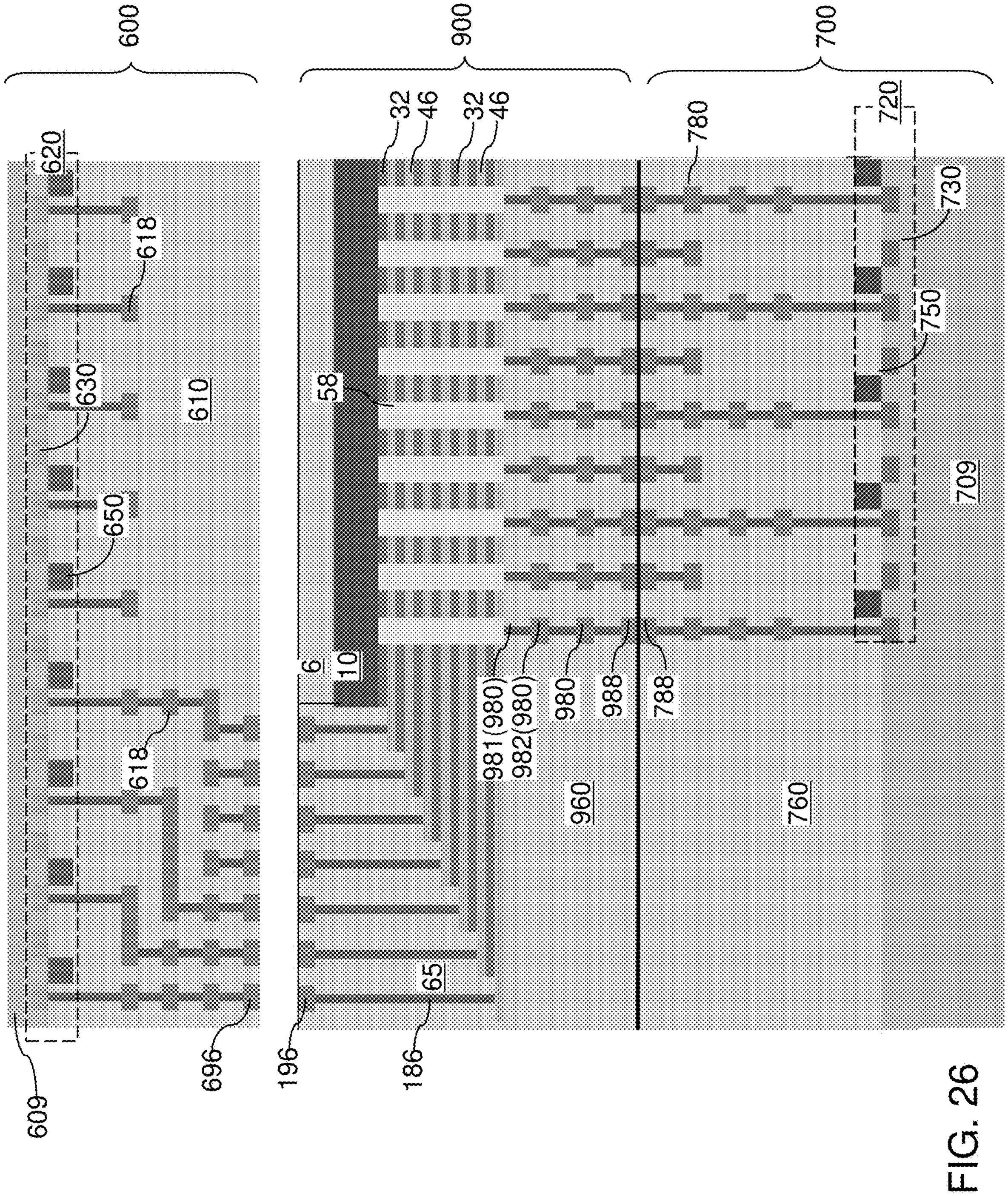
FIG. 26 is a schematic sequential vertical cross-sectional view of the third exemplary structure after aligning a second logic die to the memory die according to an embodiment of the present disclosure.

Referring to FIG. 26, a second logic die 600 can be provided. The second logic die 600 comprises a second logic-side substrate 609, a second logic-side peripheral circuit (e.g., driver circuit) which is herein referred to as a backside peripheral circuit 620, backside metal interconnect structures 618 and second logic-side bonding pads 696 embedded within backside dielectric material layers 610.

In one embodiment, the backside peripheral circuit 620 comprises a second subset of the logic devices configured to control operation of the three-dimensional memory array. The backside peripheral circuit 620 may control the operation of the word lines of the memory array and may include word line drivers, such as word line switching transistors. In one embodiment, the second logic-side substrate 609 comprises a second single crystalline semiconductor material layer, and the second subset of the logic devices within the backside peripheral circuit 620 comprises second field effect transistors including second source/drain regions 630 (which include second source regions and second drain regions) that are doped portions of the second single crystalline semiconductor material layer.

In one embodiment, the second logic die 600 comprises second logic-side bonding pads 696 that are embedded in the backside dielectric material layers 610, and the memory die 900 comprises second memory-side bonding pads 196 that are arranged in a mirror image pattern of the pattern of the second logic-side bonding pads 696.

Figure 27:
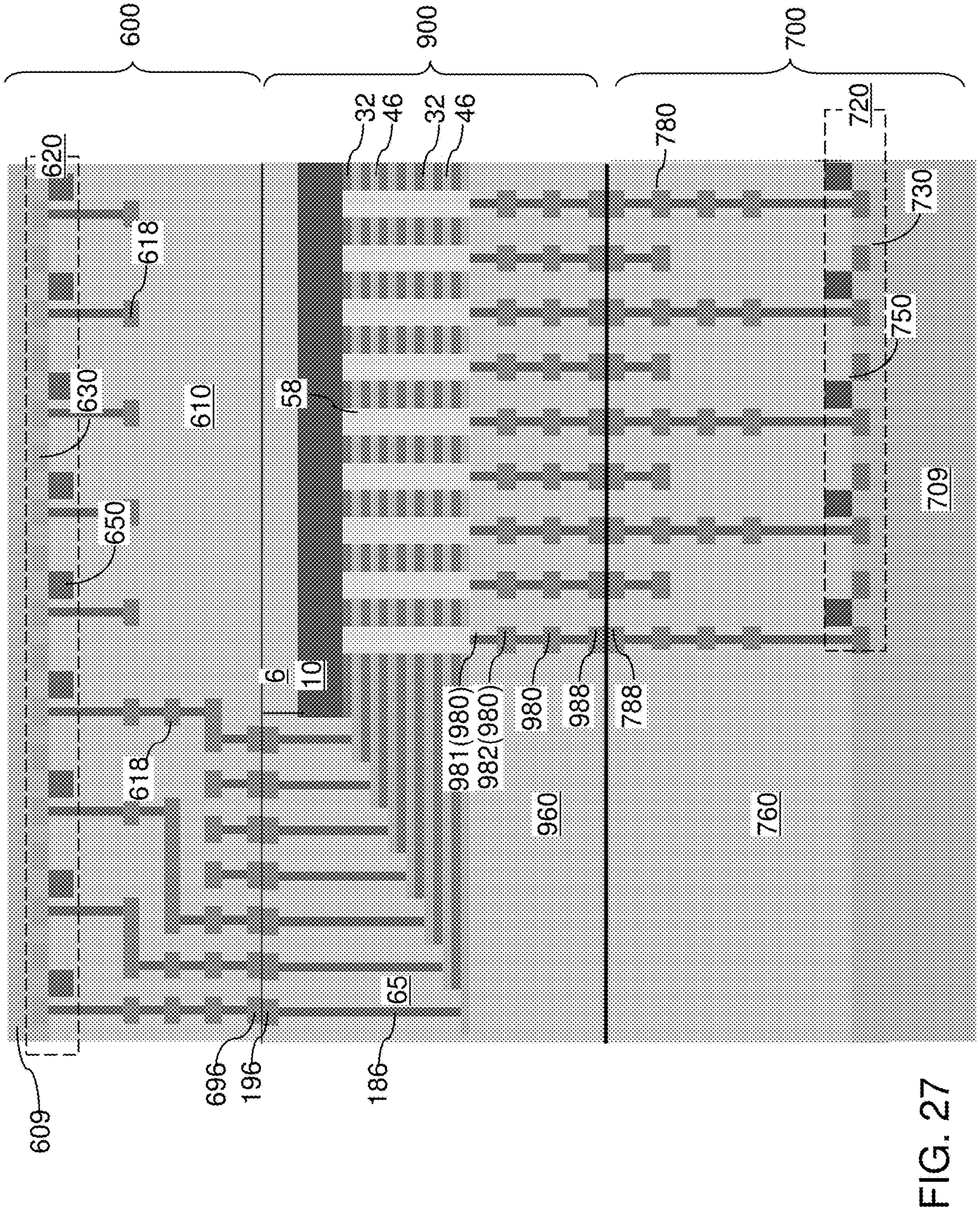
FIG. 27 is a schematic sequential vertical cross-sectional view of the third exemplary structure after bonding the second logic die to the memory die according to an embodiment of the present disclosure.

Referring to FIG. 27, the second logic die 600 can be bonded to the memory die 900 by bonding the second logic-side bonding pads 696 to the second memory-side bonding pads 196. In one embodiment, metal-to-metal bonding may be employed to bond the second logic-side bonding pads 696 with the second memory-side bonding pads 196.

Generally, a backside peripheral circuit (620 or 920) comprising a second subset of the logic devices configured to control operation of the three-dimensional memory array can be provided on a backside of the memory array, where the backside peripheral circuit is electrically connected to electrical nodes (e.g. word lines) of the three-dimensional memory array.

Figure 28:
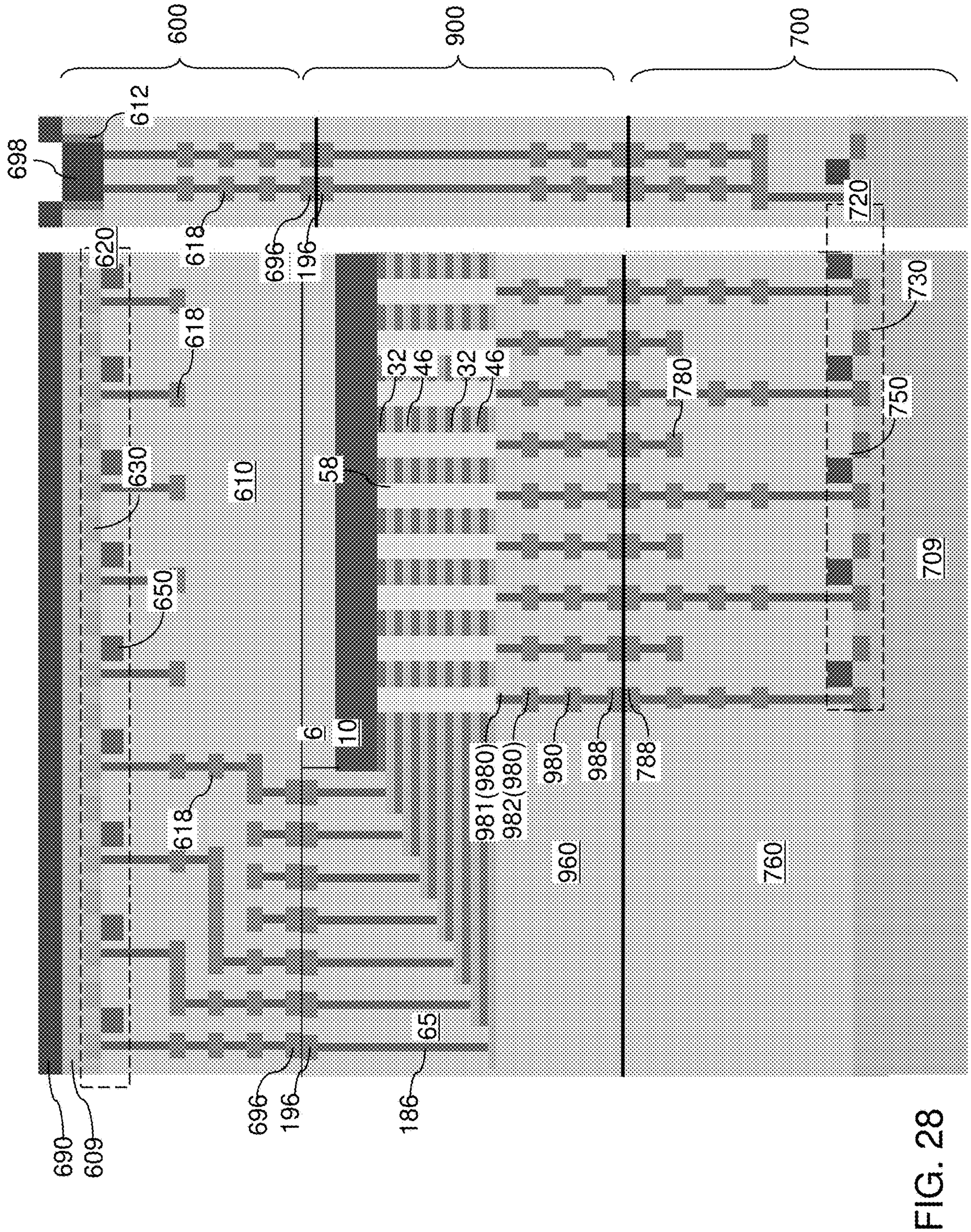
FIG. 28 is a schematic sequential vertical cross-sectional view of the third exemplary structure after formation of through-substrate via structures according to an embodiment of the present disclosure.

Referring to FIG. 28, the second logic-side substrate 609 (which is also referred to as a backside substrate) can be thinned to a thickness in a range from 10 microns to 300 microns, such as from 30 microns to 100 microns. The second logic-side substrate 609 can be thinned by grinding, polishing, an anisotropic etch process, and/or an isotropic etch process. Through-substrate via cavities can be formed through the thinned second logic-side substrate 609, and a combination of an insulating spacer 612 and a through-substrate via structure 698 can be formed in each of the through-substrate via cavities in electrical contact with the logic-side peripheral circuit 720. Optionally, a backside dielectric passivation layer 690 may be formed on the backside surface of the thinned second logic-side substrate 609.

Referring to all drawings and according to various embodiments of the present disclosure, a bonded assembly comprises a backside peripheral circuit (620 or 920), a memory die 900 and a first logic die 700. The memory die 900 comprises: a doped semiconductor material layer 10; a three-dimensional memory array comprising a two-dimensional array of memory stack structures 55 vertically extending through an alternating stack (32, 46) of insulating layers 32 and electrically conductive layers 46 that is located on a first side of the doped semiconductor material layer 10, memory-side dielectric material layers 960 located on a first side of the three-dimensional memory array, and memory-side metal interconnect structures 980 and first memory-side bonding pads 988 embedded in the memory-side dielectric material layers 960. The first logic die 700 that comprises: a logic-side peripheral circuit 720 comprising a first subset of logic devices configured to control operation of the three-dimensional memory array and located on a logic-side substrate 709, logic-side dielectric material layers 760 located between the logic-side substrate 709 and the memory die 900, and logic-side metal interconnect structures 780 and first logic-side bonding pads 788 that are bonded to a respective one of the first memory-side bonding pads 988 embedded in the logic-side dielectric material layers 760. The backside peripheral circuit (620 or 920) comprises a second subset of the logic devices configured to control operation of the three-dimensional memory array located on a second side of the doped semiconductor material layer 10 that is an opposite side of the first side of the doped semiconductor material layer 10.

In one embodiment, backside dielectric material layers 610 are located between the doped semiconductor material layer 10 and the backside peripheral circuit 620; and backside metal interconnect structures 618 that provide electrical connection between the three-dimensional memory array and the backside peripheral circuit 620 are embedded in the backside dielectric material layers 610.

In one embodiment, the backside peripheral circuit 620, the backside dielectric material layers 610, and the backside metal interconnect structures 618 are located in a second logic die 600 that is bonded to the memory die 900. In one embodiment, the second logic die 600 comprises second logic-side bonding pads 696 that are embedded in the backside dielectric material layers 610; and the memory die 900 comprises second memory-side bonding pads 196 that are bonded to the second logic-side bonding pads 696. In one embodiment, the memory die 900 comprises a backside insulating layer in contact with a backside surface of the doped semiconductor material layer 10 and in contact with the second logic die 600.

In one embodiment, the alternating stack (32, 46) comprises a staircase region in which the electrically conductive layers 46 have variable lateral extents that decrease with a vertical distance from a horizontal plane including bonding surfaces of the first memory-side bonding pads 988. In one embodiment, the memory die 900 comprises layer contact via structures 186 that contact horizontal surfaces of a respective one of the electrically conductive layers 46 within the staircase region, vertically extend from the respective one of the electrically conductive layers 46 along a vertical direction away from the horizontal plane including the bonding surfaces of the first memory-side bonding pads 988, and are electrically connected to a respective node of the backside peripheral circuit 620.

In one embodiment, the second subset of the logic devices comprises word line drivers configured to apply control voltages to the electrically conductive layers 46; and the electrically conductive layers 46 comprise word lines of the three-dimensional memory array. In one embodiment, the memory-side metal interconnect structures 980 comprise bit lines 982 of the three-dimensional memory array; the first subset of the logic devices comprises bit line drivers configured to drive the bit lines 982; and the memory-side metal interconnect structures 980, the logic-side metal interconnect structures 780, the first memory-side bonding pads 988, and the first logic-side bonding pads 788 comprise electrically conductive paths that provide electrical connection between the bit lines 982 and the bit line drivers.

In one embodiment, the first subset of the logic devices within the logic-side peripheral circuit 720 comprises first field effect transistors including first source regions 730 and first drain regions 730 that are doped portions of a first single crystalline semiconductor material layer; and first gate electrodes 750 of the first field effect transistors are more proximal to a horizontal plane including a bonding interface between the first logic die 700 and the memory die 900 than the first source regions 730 and the first drain regions 730 of the first field effect transistors are from the bonding interface.

In one embodiment, the second subset of the logic devices within the backside peripheral circuit 620 comprises second field effect transistors including second source regions 630 and second drain regions 630 that are doped portions of a second single crystalline semiconductor material layer; and second gate electrodes 650 of the second field effect transistors are more proximal to the horizontal plane than the second source regions 630 and the second drain regions 630 of the second field effect transistors are to the horizontal plane.

In one embodiment, the bonded assembly comprises: a through-substrate via structure 698 vertically extending through the second single crystalline semiconductor material layer and electrically connected to a subset of the memory-side metal interconnect structures 980; and an insulating spacer 612 laterally surrounding the through-substrate via structure 698 and located within an opening through the second single crystalline semiconductor material layer.

In one embodiment, the memory die 900 comprises: a two-dimensional array of memory openings 49 vertically extending through the alternating stack (32, 46); and a two-dimensional array of memory opening fill structures 58 located in the two-dimensional array of memory openings, wherein each of the memory opening fill structures 58 comprises a respective one of the memory stack structures 55.

In one embodiment, each of the memory stack structures 55 comprises a respective vertical semiconductor channel 60 and a respective vertical stack of memory elements; and the doped semiconductor material layer 10 is in contact with each of the vertical semiconductor channels 60.

The various embodiments of the present disclosure can be employed to distribute the peripheral circuit for driving a three-dimensional memory array on both sides of the three-dimensional memory array, i.e., above the three-dimensional memory array and below the three-dimensional memory array. Thus, the peripheral circuits do not extend laterally past the three-dimensional memory array. The various embodiments of the present disclosure can be employed to maximize the chip area for forming a three-dimensional memory array by providing sufficient device areas over and under the three-dimensional memory array for providing a peripheral circuit for driving the three-dimensional memory array.

Figure 29:
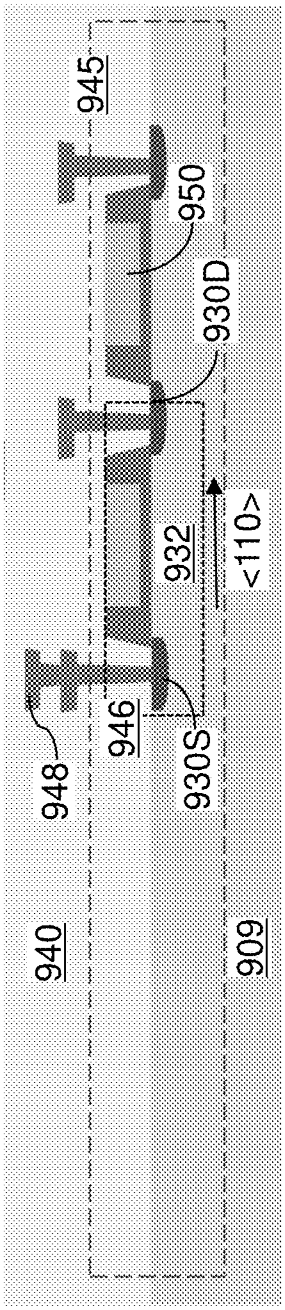
FIG. 29 is a schematic vertical cross-sectional view of a fourth exemplary structure including an in-process memory die according to an embodiment of the present disclosure.

FIG. 29 is a schematic vertical cross-sectional view of a fourth exemplary structure including an in-process memory die 900 according to an embodiment of the present disclosure. The in-process memory die 900 comprises a silicon substrate, which is herein referred to as a memory-side silicon substrate 909. The memory-side silicon substrate 909 may comprise a single crystalline silicon substrate, such as a portion of a commercially available single crystalline silicon wafer.

In one embodiment, the single crystalline silicon substrate 909 may comprise a (001) single crystalline silicon substrate. Standard Miller index notations are used herein to represent crystallographic directions and crystallographic planes. Thus, [h, k, l] represents a crystallographic direction that is defined by a vector $ha_1+ha_2+la_3$, in which $a_1$, $a_2$, and $a_3$ are first, second, and third vectors that define a unit lattice, i.e., a unit of repetition for a three-dimensional crystallographic structure. The notation <h, k, l> denotes the set of all directions that are equivalent to [h, k, l] by the symmetry of the lattice structure. The notation (h, k, l) denotes a plane that is perpendicular to the direction [h, k, l]. The notation {h, k, l} denotes the set of all planes that are equivalent to (h, k, l) by the symmetry of the lattice structure.

In one embodiment, the memory-side silicon substrate 909 may comprise a portion of a commercially available (001) single crystalline silicon wafer (which also referred to as a (100) wafer in the art). The memory-side silicon substrate 909 may comprise a zero degree (0°) notch silicon wafer in which the notch points at one of the <110> directions. The top surface of the memory-side silicon substrate 909 comprises one of the {100} planes, such as the (001) plane. A thickness of the memory-side silicon substrate 909 may be in a range from 400 microns to 1,200 microns. A peripheral circuit for controlling a second subset of electrical nodes of a three-dimensional memory array can be formed on a top surface of the memory-side silicon substrate 909. This peripheral circuit is herein referred to as an under-array peripheral circuit 945. The under-array peripheral circuit 945 comprises field effect transistors 946 (e.g., MOS field effect transistors in a CMOS configuration) and may comprise additional semiconductor devices (such as resistors, diodes, capacitors, inductors, etc.). The field effect transistors 946 may comprise gate structures (e.g., gate electrode and gate dielectric) 950 and active regions 930 (e.g., source regions 930S and drain regions 930D) separated by a silicon channel 932 located in the memory-side silicon substrate 909. Metal interconnect structures (herein referred to as under-array metal interconnect structures 948) embedded in dielectric material layers (herein referred to as under-array dielectric material layers) 940 can be formed over the under-array peripheral circuit 945. The under-array peripheral circuit 945 may comprise various control circuits such as word line drivers and/or bit line drivers for the three-dimensional memory array to be subsequently formed.

In one embodiment, the field effect transistors 946 in the under-array peripheral circuit 945 may be formed such that the channel 932 directions (i.e., lateral separation directions between the source region 930S and the drain region 930D) are aligned to a <110> crystallographic direction of the (001) single crystalline silicon substrate 909. In other words, the channels 932 of the field effect transistors 946 extend in the <110> direction parallel to the <110> direction pointed at by the zero degree notch in the substrate 909, when the notch is used to orient the substrate 909 in a lithography system used to expose one or more photoresist layers used to pattern the field effect transistors 946.

Figure 30:
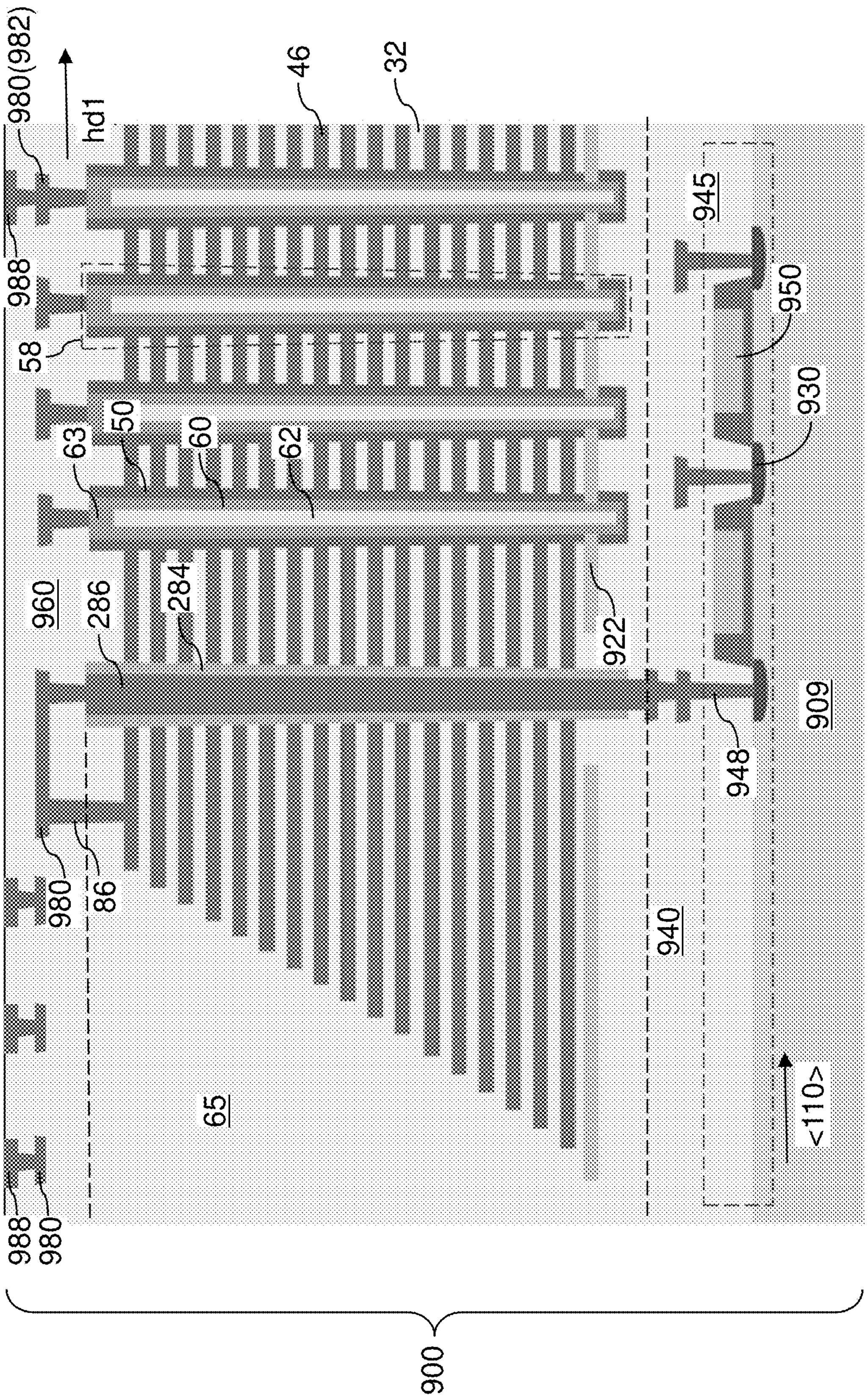
FIG. 30 is a schematic vertical cross-sectional view of the fourth exemplary structure after formation of a memory die according to an embodiment of the present disclosure.

Referring to FIG. 30, the processing steps described with reference to FIGS. 1-9 can be performed to form a three-dimensional memory array above the under-array dielectric material layers 940. Various modifications may be applied during manufacture of the three-dimensional memory array device. In this case, the semiconductor material layer 9 is replaced with the in-process memory die illustrated in FIG. 29, the combination of the backside insulating layer 6 and the doped semiconductor material layer 10 may be replaced with a horizontal source layer 922 including a semiconductor material having a doping of a second conductivity type (i.e., the opposite of a first conductivity type within the conductivity type of the vertical semiconductor channels 60). In some embodiments, through-stack via structures 284 that are laterally surrounded by through-stack insulating spacers 286 may be employed to provide electrically conductive paths that vertically extend through the alternating stacks (32, 46) of insulating layers 32 and electrically conductive layers 46. Memory-side dielectric material layers 960 embedding memory-side metal interconnect structures 980 and memory-side bonding pads 988 can be formed over the three-dimensional memory array to form a memory die 900.

In one embodiment, a two-dimensional periodic array of in-process memory dies can be formed on a (001) single crystalline silicon wafer (i.e., the substrate 909) such that a repetition directions of the two-dimensional periodic array of in-process memory dies is parallel to the <110> crystallographic direction of the (001) single crystalline silicon wafer, and another repetition direction of the two-dimensional periodic array of in-process memory dies is perpendicular to the <110> crystallographic direction of the (001) single crystalline silicon wafer (i.e., the substrate 909).

According to an aspect of the present disclosure, the alternating stacks (32, 46) in the three-dimensional memory array be laterally spaced from each other by backside trenches 79 that laterally extend along a first horizontal direction hd1 as illustrated, for example, in FIG. 5B. In this case, the three-dimensional memory array can be formed on a (001) single crystalline silicon substrate 909 such that the first horizontal direction hd1 of the memory die 900 (and the longest dimension of the backside trenches 79) is aligned to the <110> crystallographic direction of the (001) single crystalline silicon substrate. Generally, in-plane <110> directions of a (001) single crystalline silicon substrate provide a higher Young's modulus (i.e., higher stiffness) than in-plane <100> directions of the (001) single crystalline silicon substrate. The effective Young's modulus for the purpose of deformation along a <110> direction in a (001) single crystalline silicon wafer is about 170 GPa, while the effective Young's modulus for the purpose of deformation along a <100> direction in a (001) single crystalline silicon wafer is about 130 GPa. Thus, formation of the backside trenches 79 and fill structures therein (which are herein referred to as backside trench fill structures or lateral isolation trench fill structures) along a <110> direction is advantageous for the purpose of reducing overall deformation (i.e., warping) of the memory die 900 due to stress generated by the electrically conductive layers 46 in the alternating stacks (32, 46).

The backside trenches 79 may be filled with combinations of an insulating spacer 74 and a backside contact via structure 76, or may be filled with backside trench fill structures 176 consisting of at least one dielectric material. Generally, a memory die 900 in the fourth exemplary structure may comprise a three-dimensional memory array comprising alternating stacks (32, 46) of respective insulating layers 32 and respective electrically conductive layers (comprising word lines and select gate electrodes) 46. The memory array further comprises memory opening fill structures 58 (e.g., vertical NAND strings) each comprising a vertical semiconductor channel 60 and a vertical stack of memory elements (e.g., portions of the memory film 50) embedded in a respective one of the alternating stacks (32, 46). The alternating stacks (32, 46) are laterally spaced apart from each other by lateral isolation trench fill structures {(74, 76), 176} that laterally extend along a first horizontal direction hd1 (as illustrated in FIGS. 5B and 8).

Generally, the under-array peripheral circuit 945 can be located on a horizontal surface of the memory-side silicon substrate 909, and can be configured to operate a second set of electrical nodes of the three-dimensional memory array. In one embodiment, the memory die 900 comprises: first metal interconnect structures (such as under-array metal interconnect structures 948) embedded in first dielectric material layers (such as under-array dielectric material layers 940) located between the memory-side silicon substrate 909 and the three-dimensional memory array; and second metal interconnect structures (such as memory-side metal interconnect structures 980) embedded in second dielectric material layers (such as memory-side dielectric material layers 960) located between the three-dimensional memory array in the memory die 900 and a first logic die 700 (shown in FIG. 31). A subset of the electrically conductive layers 46 in the alternating stacks (32, 46) can function as word lines of the three-dimensional memory array. In one embodiment, the word lines have variable lateral extents along the first horizontal direction hd1 as a function of vertical distance from the memory-side silicon substrate 909.

Figure 31:
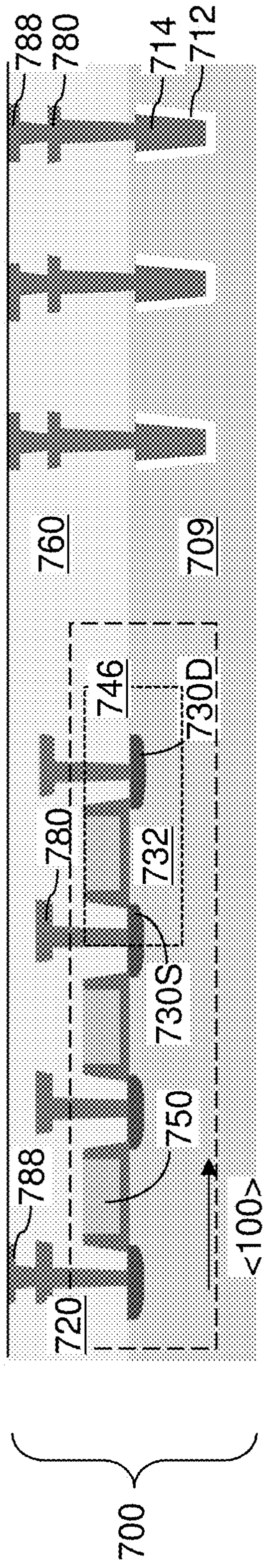
FIG. 31 is a schematic vertical cross-sectional view of a first logic die according to an embodiment of the present disclosure.

Referring to FIG. 31, the first logic die 700 according to an embodiment of the present disclosure is illustrated. The first logic die 700 comprises a first logic-side silicon substrate 709, which may be a (001) single crystalline silicon substrate. In one embodiment, the (001) single crystalline silicon substrate may be a portion of a commercially available (001) single crystalline silicon wafer. The thickness of the (001) single crystalline silicon substrate may be in a range from 400 microns to 1,200 microns, although lesser and greater thicknesses may also be employed.

Optional through-substrate via structures 714 embedded in insulating spacers 712 can be formed in an upper portion of the first logic-side silicon substrate 709. A first peripheral circuit 720 can be formed on the horizontal top surface of the first logic-side silicon substrate 709. The first peripheral circuit 720 is configured to control operation of a first set of electrical nodes of the three-dimensional memory array. The first peripheral circuit 720 comprises field effect transistors 746 and may comprise additional semiconductor devices (such as resistors, diodes, capacitors, inductors, etc.). The field effect transistors 746 may comprise gate structures 750 and active regions 730, such as source regions 730S and drain regions 730D separated by a respective semiconductor channels 732. Metal interconnect structures (herein referred to as first logic-side metal interconnect structures 780) embedded in dielectric material layers (herein referred to as first logic-side dielectric material layers 760) can be formed over the first peripheral circuit 720. The first peripheral circuit 720 may comprise various control circuits such as word line drivers, bit line drivers, sense amplifiers, and/or data latches for the three-dimensional memory array. In one embodiment, the first peripheral circuit 720 may comprise the bit line drivers, sense amplifiers, and data latches electrically connected to bit lines of the three-dimensional memory array, while the under-array peripheral circuit 945 may comprise the word line drivers electrically connected to word lines of the three-dimensional memory array.

In one embodiment, the field effect transistors 746 in the first peripheral circuit 720 may be formed such that the channel 732 directions (i.e., lateral separation directions between the source region 732S and the drain region 732D) of field effect transistors 746 are aligned to a <100> crystallographic direction of the (001) single crystalline silicon substrate 709 of the first logic die 700. In one embodiment, a two-dimensional periodic array of first logic dies 700 can be formed on a (001) single crystalline silicon wafer 709. A repetition direction of the two-dimensional periodic array of in-process memory dies is parallel to the <100> crystallographic direction of the (001) single crystalline silicon wafer 909, and another repetition direction of the two-dimensional periodic array of first logic dies 700 is perpendicular to the <100> crystallographic direction of the (001) single crystalline silicon wafer of the (001) single crystalline silicon wafer 709.

Generally, p-type field effect transistors 746 employing a portion of a (001) single crystalline silicon substrate 709 as channel regions 732 have a higher on-current if the channel direction is parallel to a <100> direction compared to p-type field effect transistors having a same structure and oriented such that the channel direction is parallel to a <110> direction. Thus, by selecting a repetition direction of a two-dimensional array of first logic dies 700 and the direction of the channel directions of field effect transistors in the first logic dies 700 on a (001) single crystalline silicon wafer 709 to be parallel to a <100> direction, the on-current for the p-type field effect transistors in the first logic dies 700 can be enhanced compared to a case in which the channel directions of the p-type field effect transistors are parallel to a <110> direction. Thus, performance of the first peripheral circuit 720 can be enhanced through alignment of the channel 732 directions of the field effect transistors 746 in the first peripheral circuit 720 along a <100> direction of the (001) single crystalline silicon substrate in the first logic die 700. In contrast, the electrically conductive layers 46 of the memory die 900 extend along the higher Young's modulus <110> direction of the (001) single crystalline silicon substrate 909 in the memory die 900 to reduce stress induced memory die 900 warpage.

Logic-side bonding pads 788 can be formed in the topmost layer among the logic-side dielectric material layers 760. The pattern of the logic-side bonding pads 788 can be a mirror image pattern of the pattern of the memory-side bonding pads 988 of the memory die 900 illustrated in FIG. 30.

Figure 32:
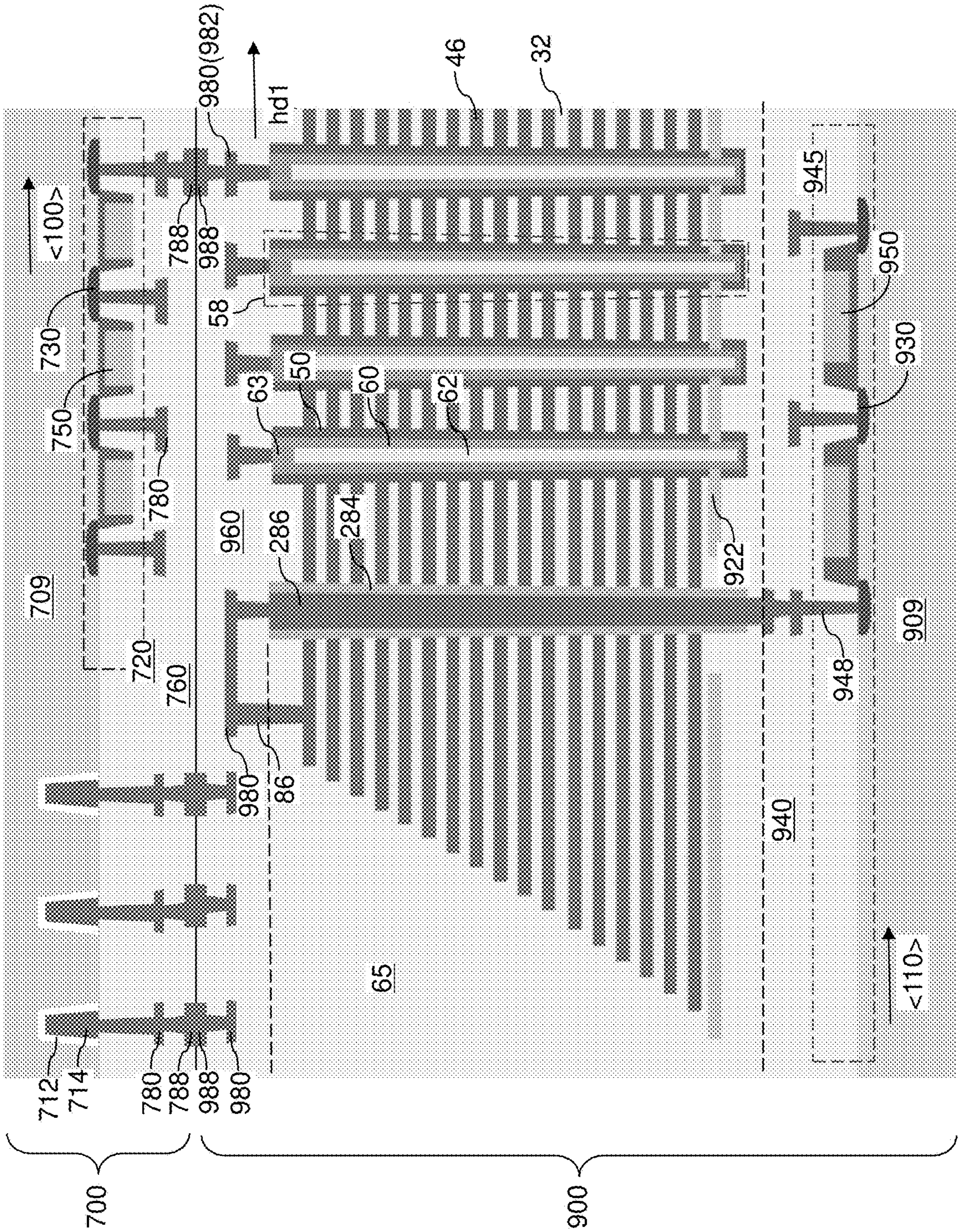
FIG. 32 is a vertical cross-sectional view of the fourth exemplary structure after bonding the memory die and the first logic die according to an embodiment of the present disclosure.
Figure 33B:
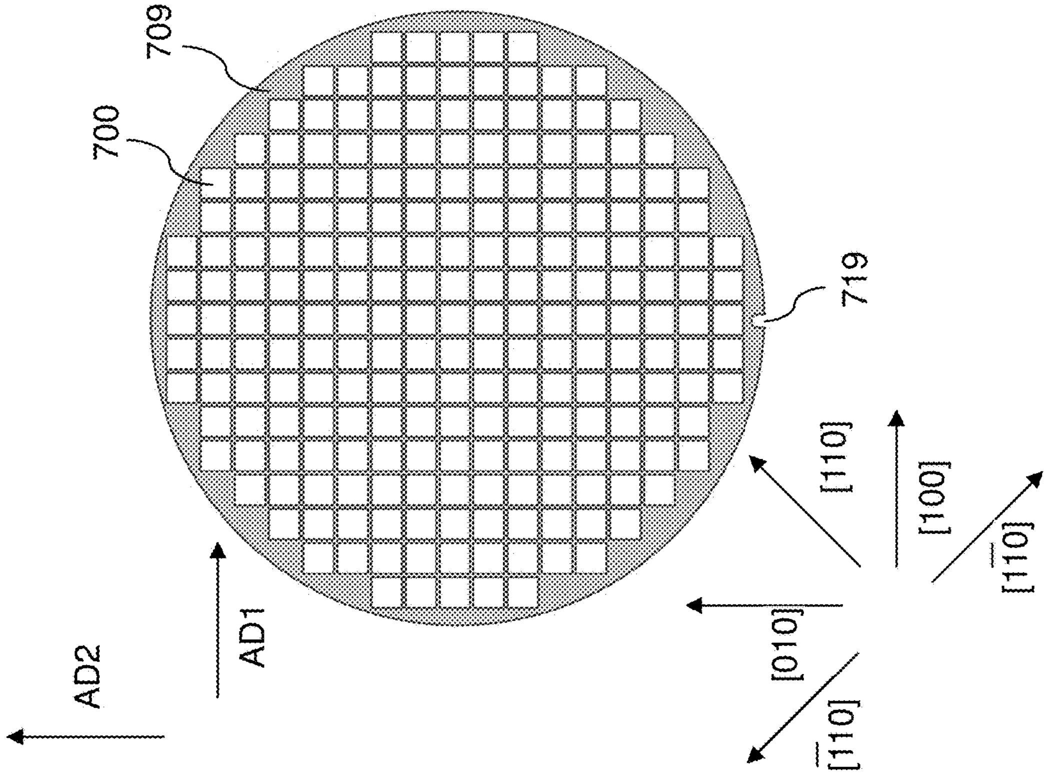
FIG. 33B is a top-down view of a second wafer including a two-dimensional array of first logic dies after the processing steps of FIG. 32 according to an embodiment of the present disclosure.
Figure 33A:
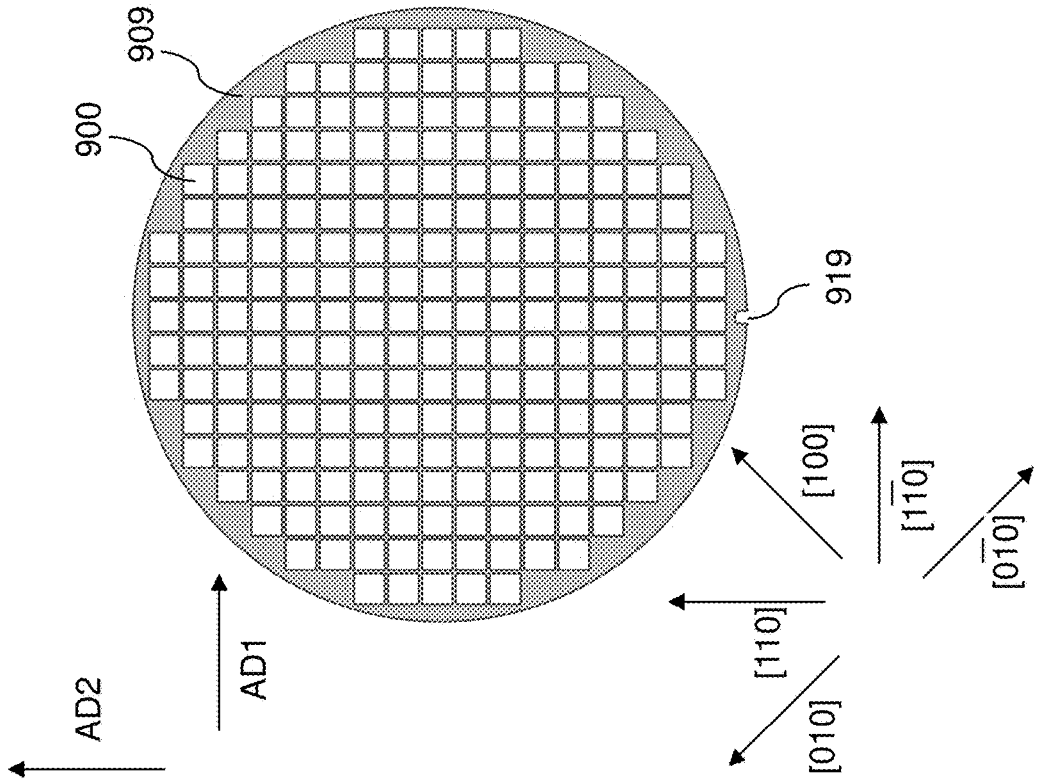
FIG. 33A is a top-down view of a first wafer including a two-dimensional array of memory dies after the processing steps of FIG. 32 according to an embodiment of the present disclosure.

Referring to FIGS. 32, 33A, and 33B, the fourth exemplary structure is illustrated after bonding the first logic die 700 to the memory die 900. FIG. 32 is a vertical cross-sectional view of the fourth exemplary structure after bonding the memory die 900 and the first logic die 700. FIG. 33A is a top-down view of a first wafer (i.e., substrate 909) including a two-dimensional array of memory dies 900 after the bonding process that forms bonded assemblies of the first logic die 700 and the memory die 900. FIG. 33B is a top-down view of a second wafer (i.e., substrate 709) including a two-dimensional array of first logic dies 700 after the bonding process.

The relative orientations of the first wafer and the second wafer are shown after the bonding process. The first wafer 909 includes a two-dimensional array of memory dies 900, and the second wafer 709 includes a two-dimensional array of first logic dies 700. After bonding, a first alignment direction AD1 of the first wafer 909 is aligned to a first alignment direction AD1 of the second wafer 709, and a second alignment direction AD2 of the first wafer 909 is aligned to a second alignment direction AD2 of the second wafer 709. The first alignment direction AD1 of the first wafer 909 can be parallel to a <110> direction (such as a $[1\bar{1}0]$ direction) of the (001) single crystalline silicon material of the first wafer 909, and the first alignment direction AD1 of the second wafer 709 including a two-dimensional array of first logic dies 700 can be parallel to a <100> direction (such as a [100] direction) of the (001) single crystalline silicon material of the second wafer 709. However, the first wafer 909 and the second wafer 709 have different respective notch (919, 719) orientations. The first wafer 909 comprises a zero degree notch wafer 909 in which the zero degree notch 919 points along a <110> (e.g., [110]) direction. The second wafer 709 comprises a forty five degree notch wafer 709 in which the zero degree notch 719 points along a <100> (e.g., [010]) direction.

Generally, an assembly including the memory die 900 and the first logic die 700 can be formed such that channel 732 directions of field effect transistors 746 in the first peripheral circuit 720 are aligned to a <100> crystallographic direction of a (001) single crystalline silicon substrate 709 of the first logic die 700, and is parallel or perpendicular to the first horizontal direction hd1 of the memory die 900. Each first logic die 700 may be bonded directly to a memory die 900, for example, by metal-to-metal bonding between a set of memory-side bonding pads 988 and a set of logic-side bonding pads 788. In one embodiment, the electrically conductive layers 46 of the memory die 900 may have variable lateral extents along the first horizontal direction hd1 as a function of a vertical distance from the first logic die 700.

Figure 34:
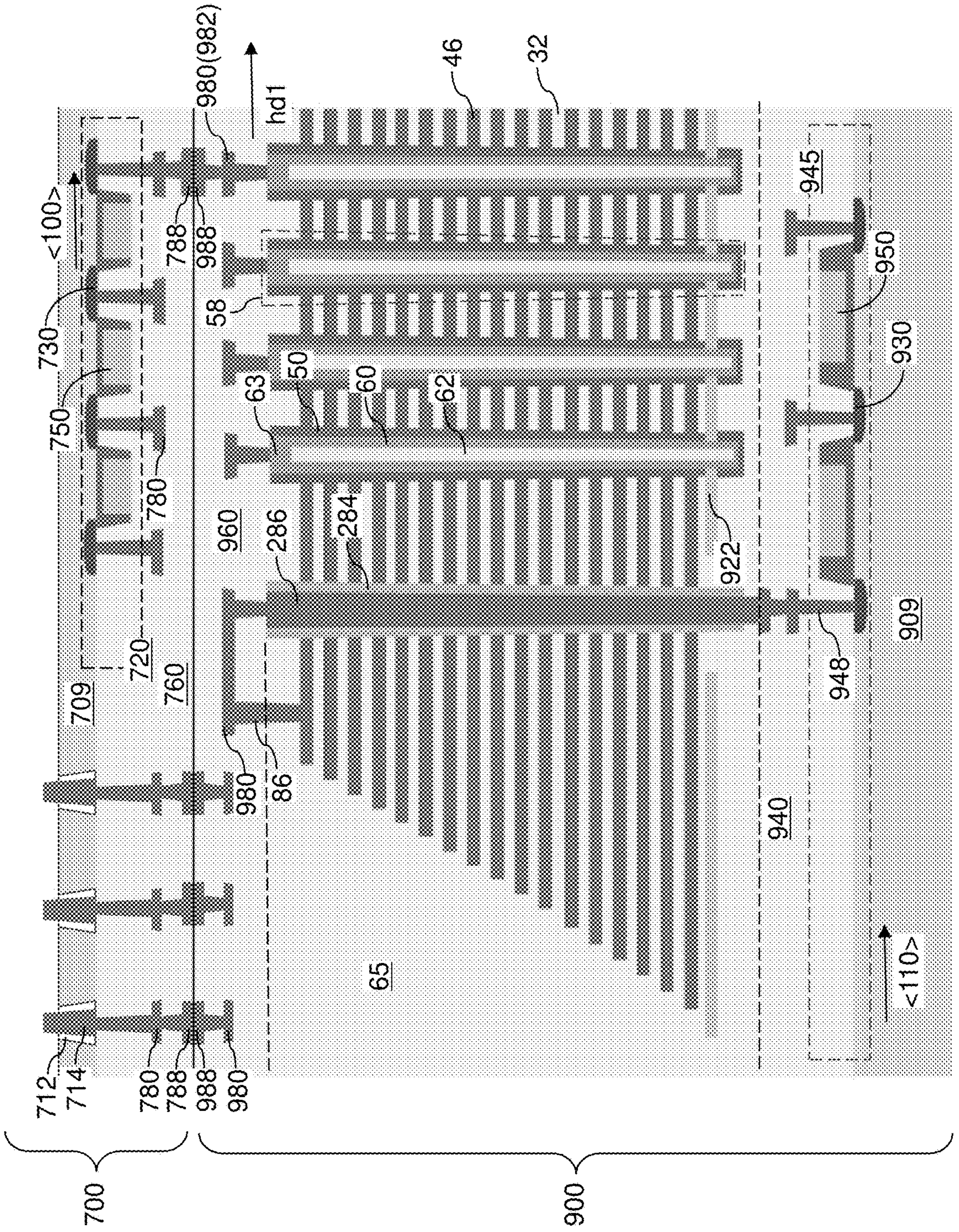
FIG. 34 is a vertical cross-sectional view of the fourth exemplary structure after thinning the backside of the logic-side silicon substrate of the first logic die according to an embodiment of the present disclosure.

Referring to FIG. 34, the logic-side silicon substrate 709 of the first logic die 700 can be thinned from the backside, for example, by grinding, polishing, an anisotropic etch process, and/or an isotropic etch process. The logic-side silicon substrate 709 can be thinned at least until end portions of the insulating spacers 712 are removed and surfaces of the through-substrate via structures 714 (if present) are exposed. The logic-side silicon substrate 709 may be further recessed by a recess distance in a range from 100 nm to 1,000 nm after exposure of the end surfaces of the through-substrate via structures 714.

The thickness of the first logic-side silicon substrate 709 after the thinning process may be in a range from 2 microns to 40 microns. In contrast, the thickness of the memory-side silicon substrate 909 is not changed, and thus, may be in a range from 400 microns to 1,200 microns. Thus, the memory-side silicon substrate 909 may have a thickness that is greater than a thickness of the first logic-side silicon substrate 709 at least by a factor of 5. Due to the greater thickness of the memory-side silicon substrate 909 relative to the thickness of the first logic-side silicon substrate 709, the pattern of mechanical stress and deformation of the alternating stacks (32, 46) is substantially the same as the pattern of mechanical stress and deformation prior to bonding the memory dies 900 to the logic dies 700. Thus, use of the <100> direction of the first logic-side silicon substrate 709 as a direction that is parallel to the <110> direction of the memory-side silicon substrate 909 does not degrade the warpage of the memory dies 900, while the transistors 746 in first peripheral circuit 720 in each first logic die 700 have an improved drive current.

Figure 35:
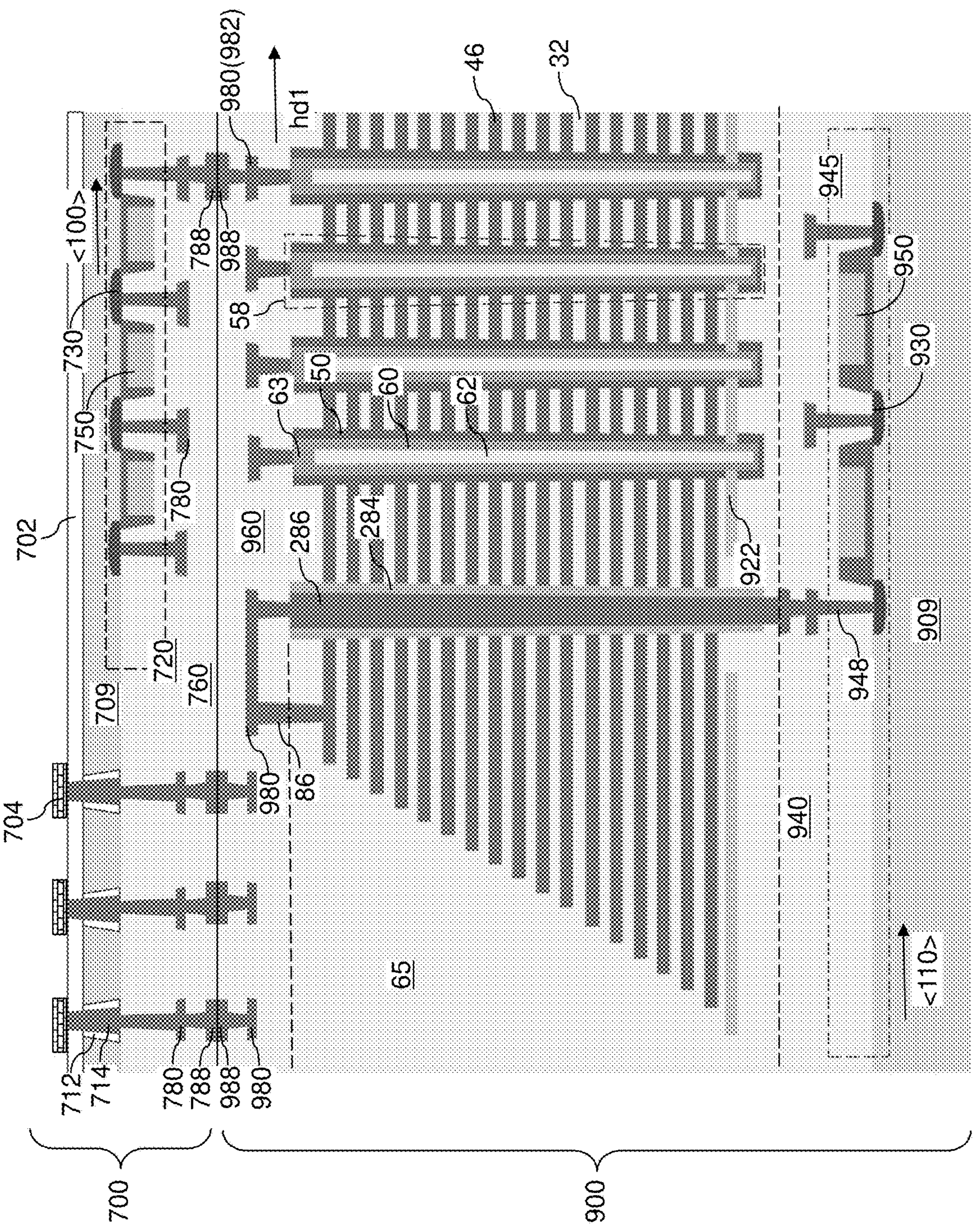
FIG. 35 is a vertical cross-sectional view of the fourth exemplary structure after formation of backside bonding pads according to an embodiment of the present disclosure.

Referring to FIG. 35, a backside insulating layer 702 can be formed on the backside surface of the thinned first logic-side silicon substrate 709. Backside bonding pads 704 can be formed over the backside insulating layer 702 on a physically exposed surface of a respective one of the through-substrate via structures 714, which can be electrically connected to electrical nodes (e.g., bit lines 982) of the three-dimensional memory array through the logic-side metal interconnect structures 780, the logic-side bonding pads 788, the memory-side bonding pads 988, and the memory-side metal interconnect structures 980.

In summary, in one embodiment, the memory die 900 comprises memory-side bonding pads 988, and the first logic die 700 comprises first logic-side bonding pads 788 that are bonded to the memory-side bonding pads 988 by metal-to-metal bonding. In one embodiment, the bonded assembly comprises through-substrate via structures 714 vertically extending through the first logic-side silicon substrate 709, and backside bonding pads 704 located on a backside on the first logic-side silicon substrate 709 and in electrical contact with a respective one of the through-substrate via structures 714. Connection via structures 880 vertically extend through the stepped dielectric material portion 65.

In one embodiment, the memory die 900 is free of any through-substrate via structure that extends through the memory-side silicon substrate 909. In one embodiment, a second peripheral circuit (such as an under-array peripheral circuit 945) can be located on a horizontal surface of the memory-side silicon substrate 909 facing the logic die 700, and can be configured to operate an additional set of electrical nodes (e.g., the electrically conductive layers 46) of the three-dimensional memory array. In one embodiment, the memory die 900 comprises: first metal interconnect structures (such as under-array metal interconnect structures 948) embedded in first dielectric material layers (such as under-array dielectric material layers 940) located between the memory-side silicon substrate 909 and the three-dimensional memory array; and second metal interconnect structures (such as memory-side metal interconnect structures 980) embedded in second dielectric material layers (such as memory-side dielectric material layers 960) located between the three-dimensional memory array of the first logic die 700.

Figure 36:
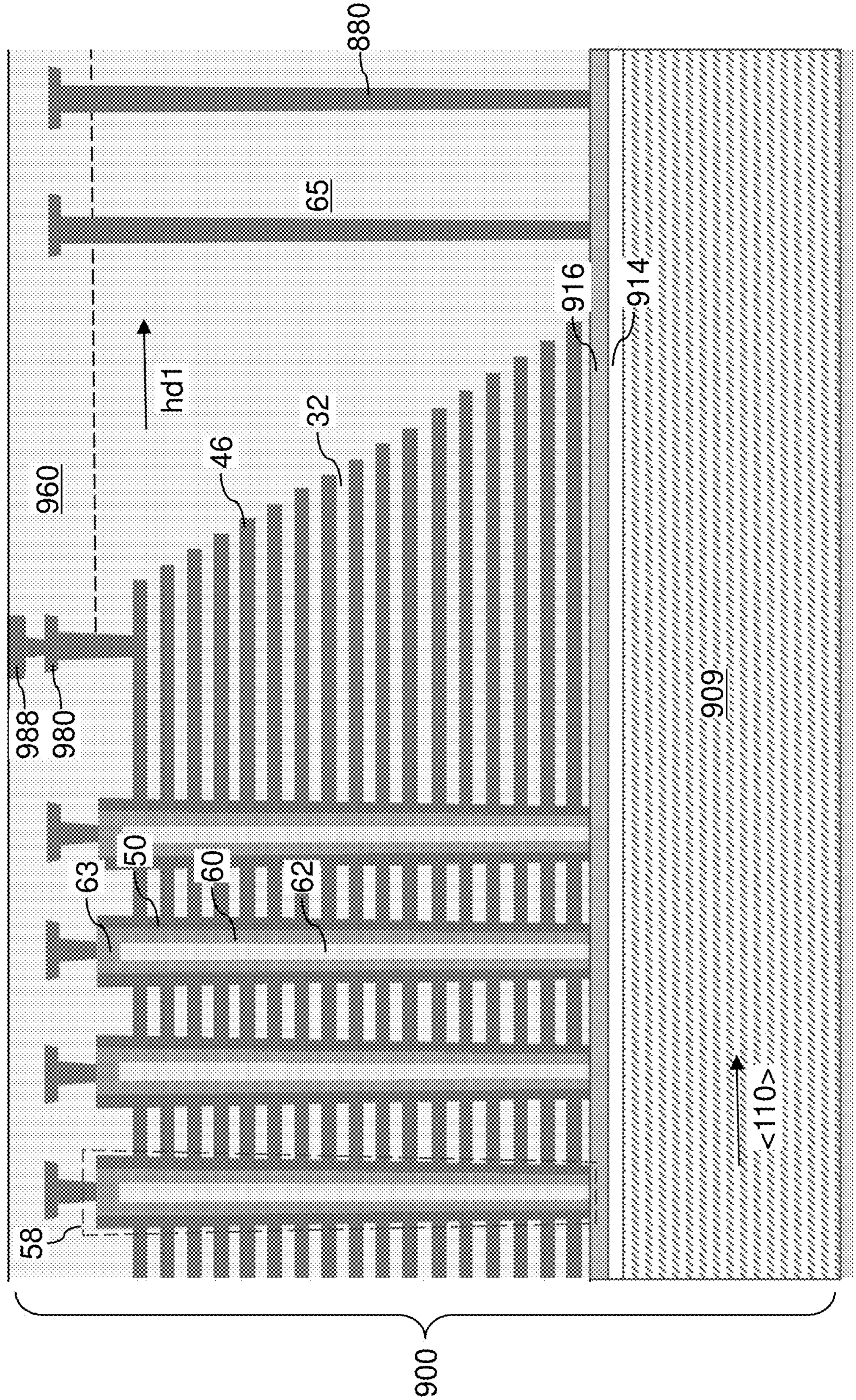
FIG. 36 is a vertical cross-sectional view of a fifth exemplary structure including a memory die according to an embodiment of the present disclosure.

Referring to FIG. 36, a fifth exemplary structure according to an embodiment of the present disclosure comprises a memory die 900, which can be derived from the memory die 900 illustrated in FIG. 30 by employing an optional planarization stopper layer 914 and a planar sacrificial layer 916 in lieu of a combination of the source layer 922, the under-array peripheral circuit 945, and the under-array metal interconnect structures 948 embedded in under-array dielectric material layers 940. The planarization stopper layer 914, if present, may comprise a silicon oxide layer having a thickness in a range from 100 nm to 2,000 nm. The planar sacrificial layer 916 may comprise a semiconductor material, a carbon-based material, a metallic material, or a dielectric material, and may have a thickness in a range from 50 nm to 300 nm, although lesser and greater thicknesses may also be employed. In one embodiment, the three-dimensional memory array of the memory die 900 may be formed on the zero degree notch (001) single crystalline silicon wafer 909 such that the first horizontal direction hd1 of the memory die 900 is aligned to a <110> crystallographic direction of the zero degree notch (001) single crystalline silicon wafer 909.

As described above, the memory die 900 comprises a three-dimensional memory array comprising alternating stacks (32, 46) of respective insulating layers 32 and respective electrically conductive layers 46, and the memory opening fill structures 58 extending through the respective alternating stacks (32, 46). In one embodiment, the alternating stacks (32, 46) are laterally spaced apart from each other by lateral isolation trench fill structures {(74, 76), 176} that laterally extend along a first horizontal direction hd1 as described with reference to FIG. 30.

Figure 37:
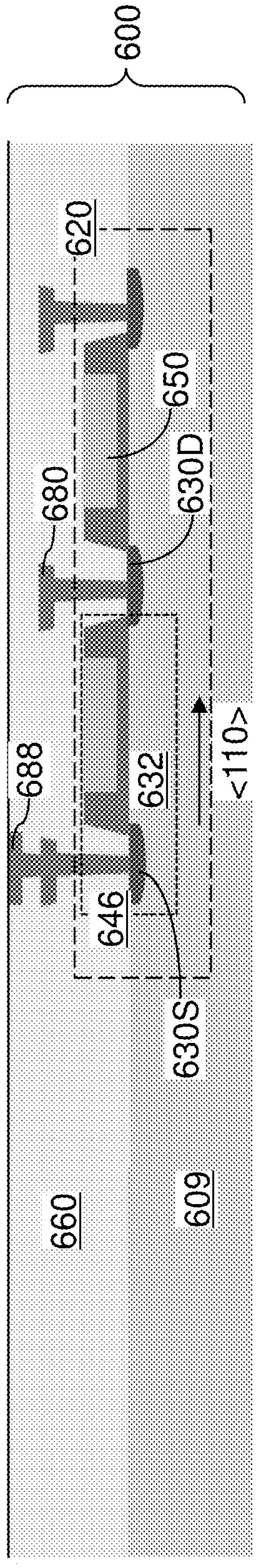
FIG. 37 is a vertical cross-sectional view of a second logic die according to an embodiment of the present disclosure.

Referring to FIG. 37, a second logic die 600 according to an embodiment of the present disclosure is illustrated. The second logic die 600 comprises a second logic-side silicon substrate 609, which may be a (001) single crystalline silicon substrate. In one embodiment, the (001) single crystalline silicon substrate may be a portion of a commercially available zero degree notch (001) single crystalline silicon wafer. The thickness of the (001) single crystalline silicon substrate may be in a range from 400 microns to 1,200 microns, although lesser and greater thicknesses may also be employed.

A second peripheral circuit 620 is formed over the horizontal top surface of the second logic-side silicon substrate 609. The second peripheral circuit 620 is configured to control operation of another set of electrical nodes of the three-dimensional memory array in the memory die 900 of FIG. 37. The second peripheral circuit 620 comprises field effect transistors 646 and may comprise additional semiconductor devices (such as resistors, diodes, capacitors, inductors, etc.). The field effect transistors 646 may comprise gate structures 650 and active regions 630 (e.g., source regions 630S and drain regions 630D) separated by a silicon channel 632 located in the second logic-side silicon substrate 609. Metal interconnect structures (herein referred to as second logic-side metal interconnect structures 680) embedded in dielectric material layers (herein referred to as second logic-side dielectric material layers 660) can be formed over the second peripheral circuit 620. The second peripheral circuit 620 may comprise various control circuits such as word line drivers for the three-dimensional memory array.

In one embodiment, the field effect transistors 646 in the second peripheral circuit 620 may be formed such that the channel 632 directions (i.e., lateral separation directions between the source region 630S and the drain region 630D) are aligned to a <110> crystallographic direction of the (001) single crystalline silicon substrate 609 of the second logic die 600. In other words, the channels 632 of the field effect transistors 646 extend in the <110> direction parallel to the <110> direction pointed at by the zero degree notch in the substrate 609, when the notch is used to orient the substrate

609 in a lithography system used to expose one or more photoresist layers used to pattern the field effect transistors 646.

In this case, the second logic die 600 can be formed such that the channel 632 directions and the die repetition directions are parallel or perpendicular to the <110> crystallographic direction of the zero degree notch (001) single crystalline silicon wafer of the second logic die 600. The second logic die 600 can be subsequently bonded to the memory die 900 illustrated in FIG. 36 such that the <110> crystallographic direction of the (001) single crystalline silicon wafer 609 of the second logic die 600 is parallel to the first horizontal direction hd1 (i.e., the lengthwise direction of the backside trenches 79 that laterally separate neighboring pairs of alternating stacks (32, 46)) in the memory die 900.

Logic-side bonding pads 688 can be formed in the topmost layer among the logic-side dielectric material layers 660. The pattern of the logic-side bonding pads 688 can be a mirror image pattern of the pattern of the memory-side bonding pads 988 of the memory die 900 illustrated in FIG. 36. Generally, the second logic die 600 comprises a second peripheral circuit 620 configured to control operation of a second set of electrical nodes of the three-dimensional memory array of the memory die 900 of FIG. 36.

Figure 38:
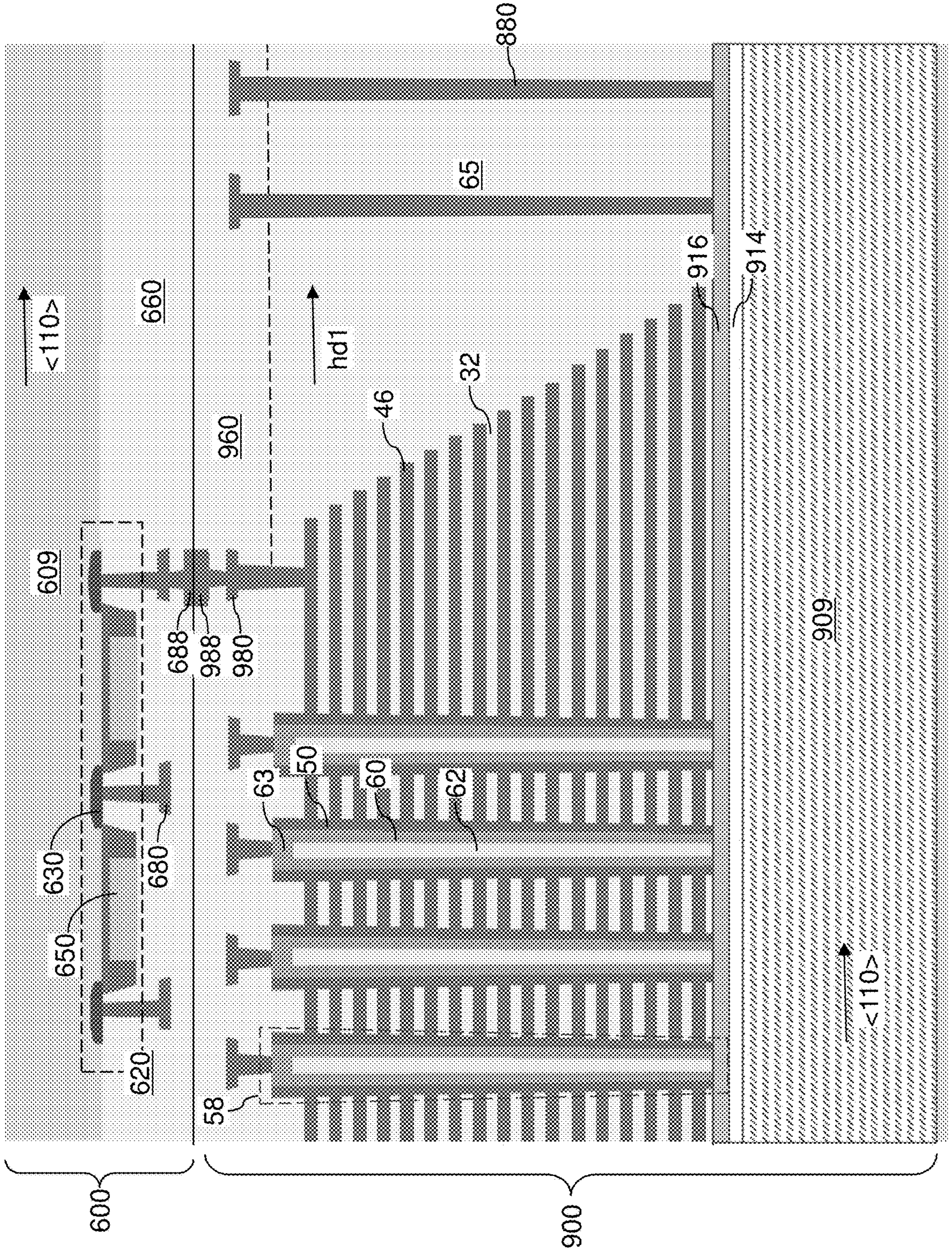
FIG. 38 is a vertical cross-sectional view of the fifth exemplary structure after bonding the memory die and the second logic die according to an embodiment of the present disclosure.

Referring to FIG. 38, the second logic die 600 can be bonded to the memory die 900. The memory-side bonding pads 988 of the memory die 900 can be bonded to the logic-side bonding pads 688 of the second logic die 600, for example, by metal-to-metal bonding. In one embodiment, a <110> direction of the (001) single crystalline silicon substrate 909 of the memory die 900 can be aligned to a <110> direction of the (001) single crystalline silicon substrate 609 of the second logic die 600. In one embodiment, the channel 632 directions of field effect transistors 646 in the second peripheral circuit 620 may be aligned to a <110> crystallographic direction of the (001) single crystalline silicon substrate 609 of the second logic die 600, and may be parallel or perpendicular to the first horizontal direction hd1 of the memory die 900.

Figure 39:
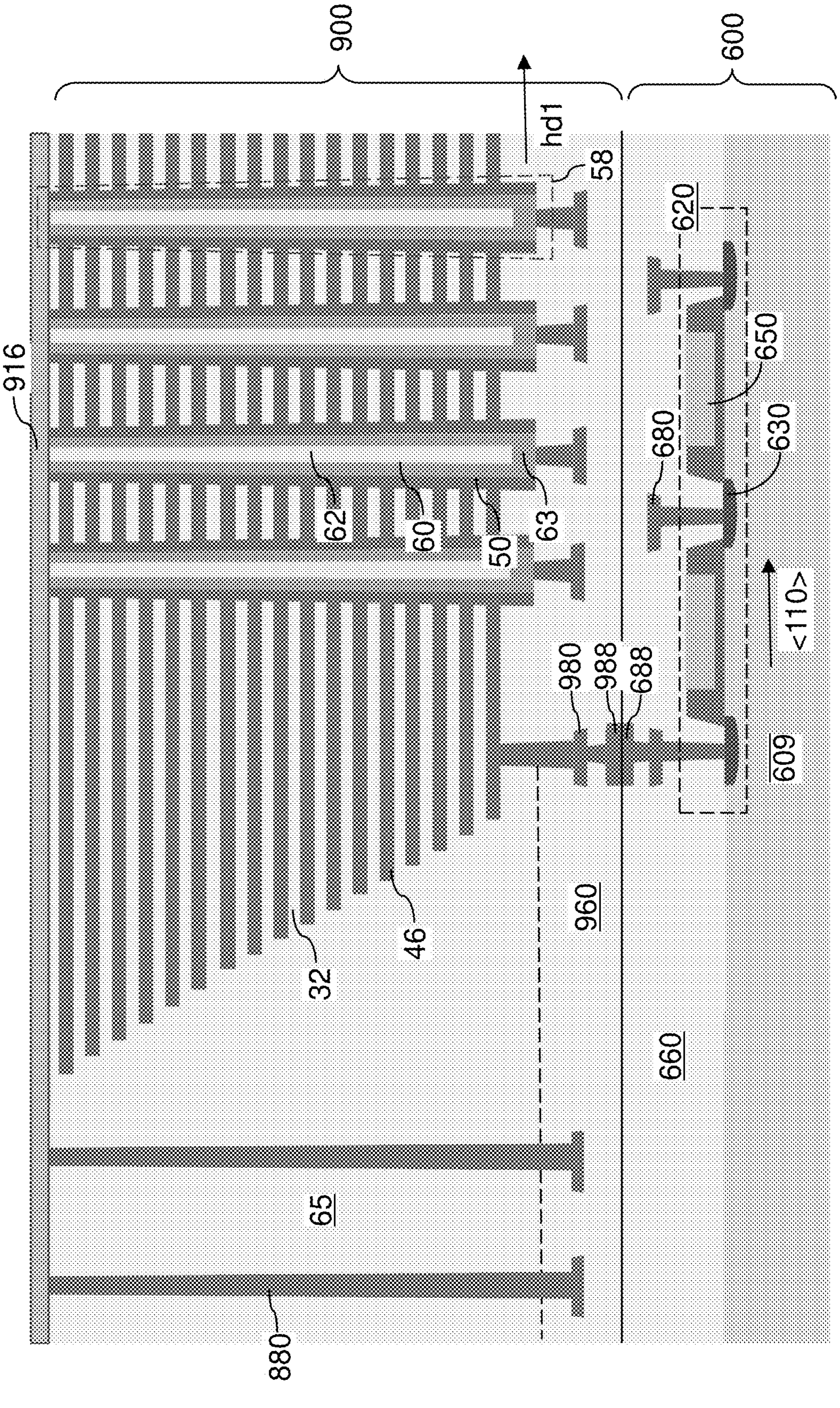
FIG. 39 is a vertical cross-sectional view of the fifth exemplary structure after removing a carrier substrate from the memory die according to an embodiment of the present disclosure.

Referring to FIG. 39, the memory-side silicon substrate 909 can be removed, for example, by cleaving, grinding, polishing, an anisotropic etch process, and/or an isotropic etch process. The planarization stopper layer 914, if present, may be employed as a stopper structure for an etch process, a grinding process, and/or a polishing process during removal of the memory-side silicon substrate 909.

If the <110> direction of the (001) single crystalline silicon substrate of the second logic die 600 is aligned to the <110> direction of the (001) single crystalline silicon substrate of the memory die 900, the (001) single crystalline silicon substrate 609 of the second logic die 600 provides substantially the same warpage resistance characteristics to the alternating stacks (32, 46) as the (001) single crystalline silicon substrate 909 of the memory die 900 that is removed during the processing steps of FIG. 39. Thus, mechanical distortion in remaining portions of the memory die 900 induced by removal of the memory-side silicon substrate 909 can be minimized by matching the <110> direction of the (001) single crystalline silicon substrate 609 of the second logic die 600 to the <110> direction of the (001) single crystalline silicon substrate 909 of the memory die 900 at the processing steps of FIG. 38.

FIGS. 40A-40D are sequential vertical cross-sectional views of a region of the fifth exemplary structure during formation of a source layer according to an embodiment of the present disclosure.

Figure 40B:
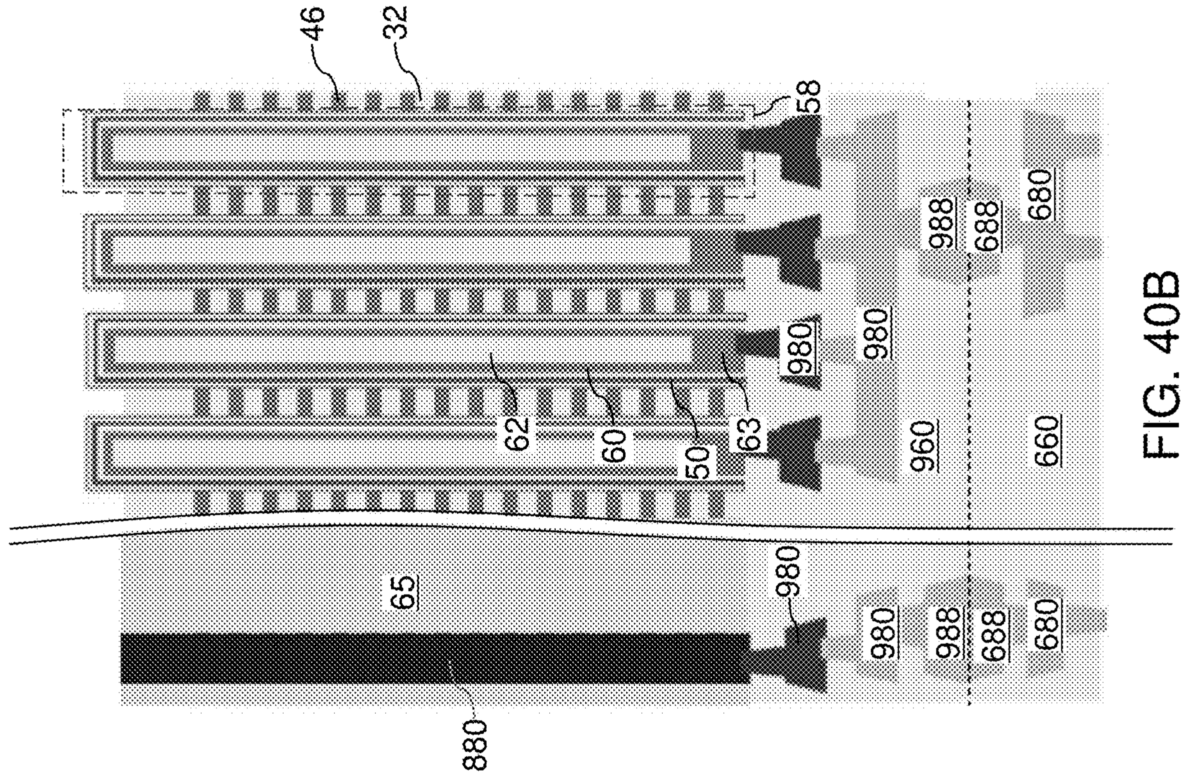
FIGS. 40A-40D are sequential vertical cross-sectional views of a region of the fifth exemplary structure during formation of a source layer according to an embodiment of the present disclosure.
Figure 40A:
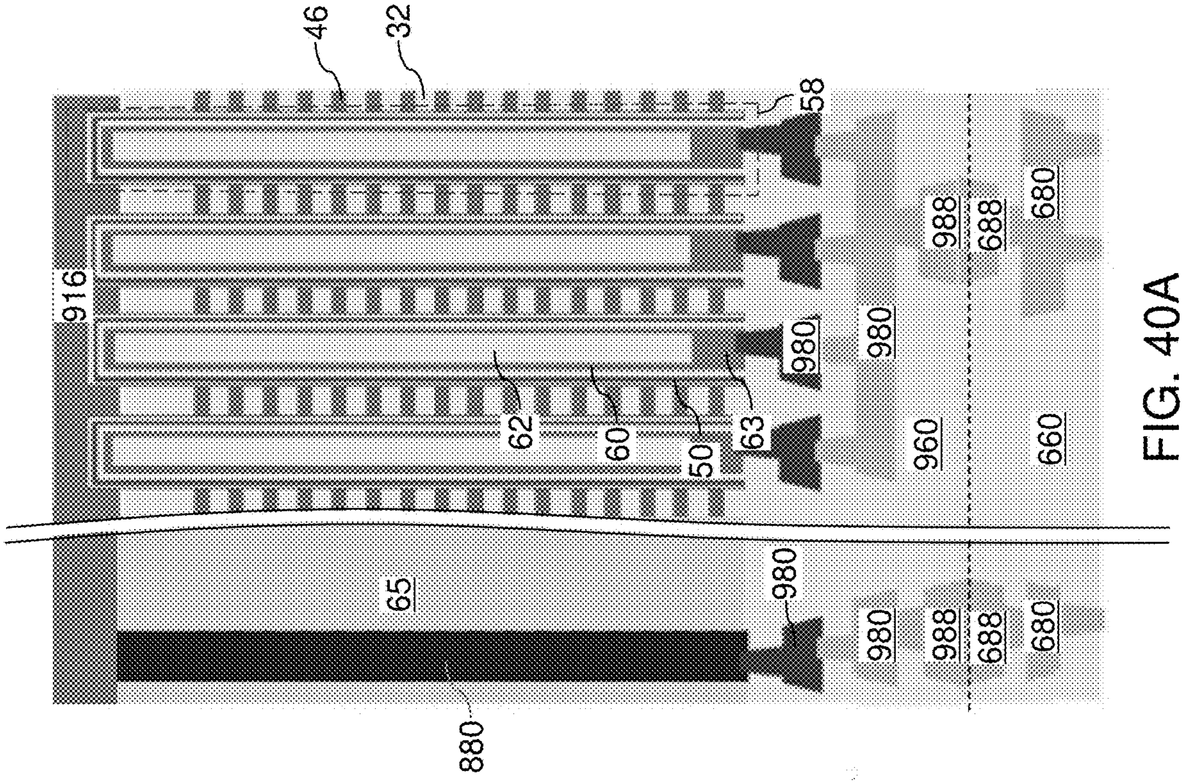

Referring to FIG. 40A, a region of the fifth exemplary structure is illustrated after the processing steps of FIG. 39. A connection via structure 880 vertically extending through the stepped dielectric material portion 65 is illustrated.

Referring to FIG. 40B, the planar sacrificial layer 916 can be removed by removing the material of the planar sacrificial layer 916 selective to the materials of the memory films 50, the stepped dielectric material portion 65, and the connection via structures 880. For example, a selective isotropic etch process, such as a selective wet etch process, may be employed to remove the material of the planar sacrificial layer 916 selective to the materials of the memory films 50, the stepped dielectric material portion 65, and the connection via structures 880.

Figure 40D:
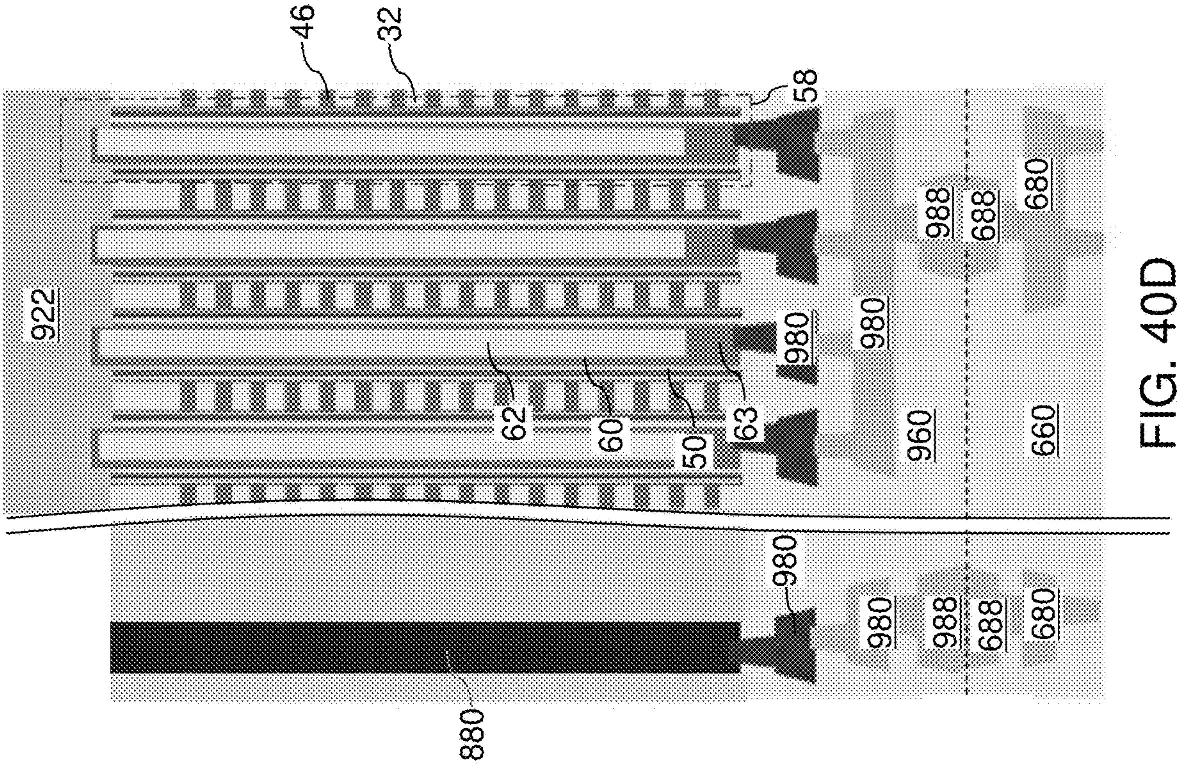
Figure 40C:
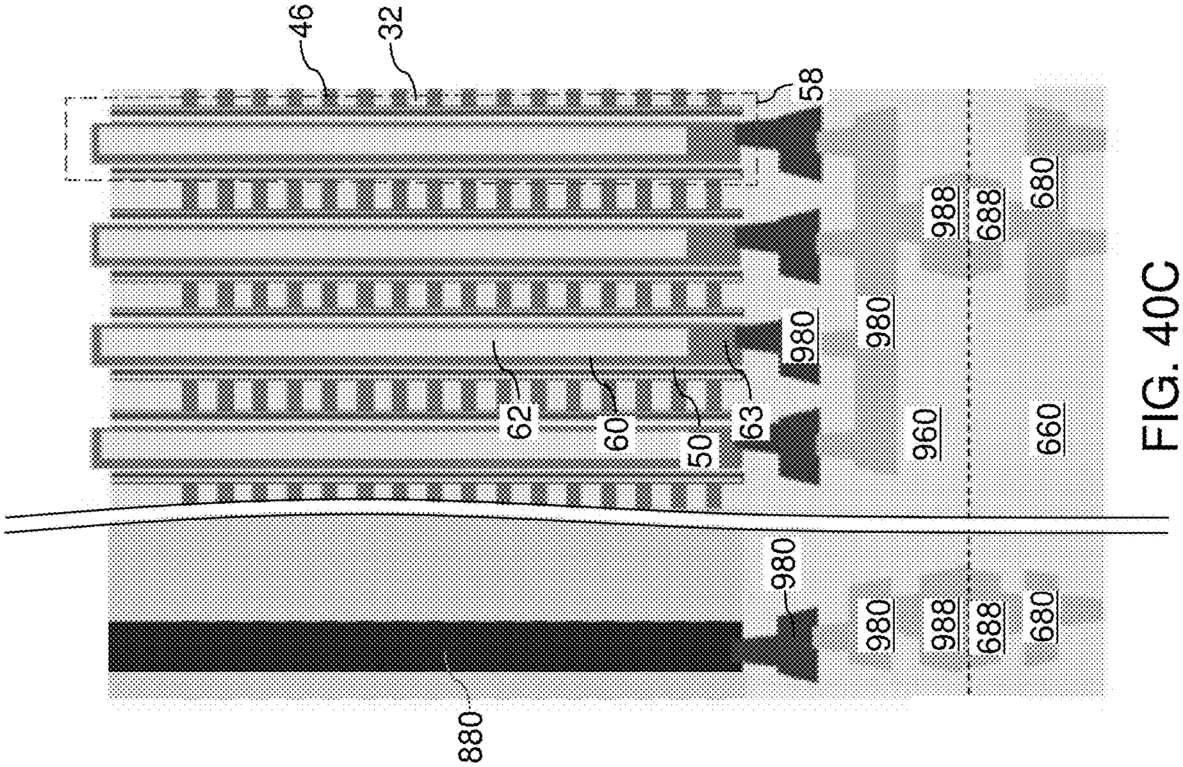

Referring to FIG. 40C, end portions of the memory films 50 can be removed by performing a sequence of selective etch processes, such as a sequence of wet etch processes. End surfaces of the vertical semiconductor channels 60 can be physically exposed.

Referring to FIG. 40D, a doped semiconductor material having a doping of a second conductivity type can be deposited to form a source layer 922.

Figure 41:
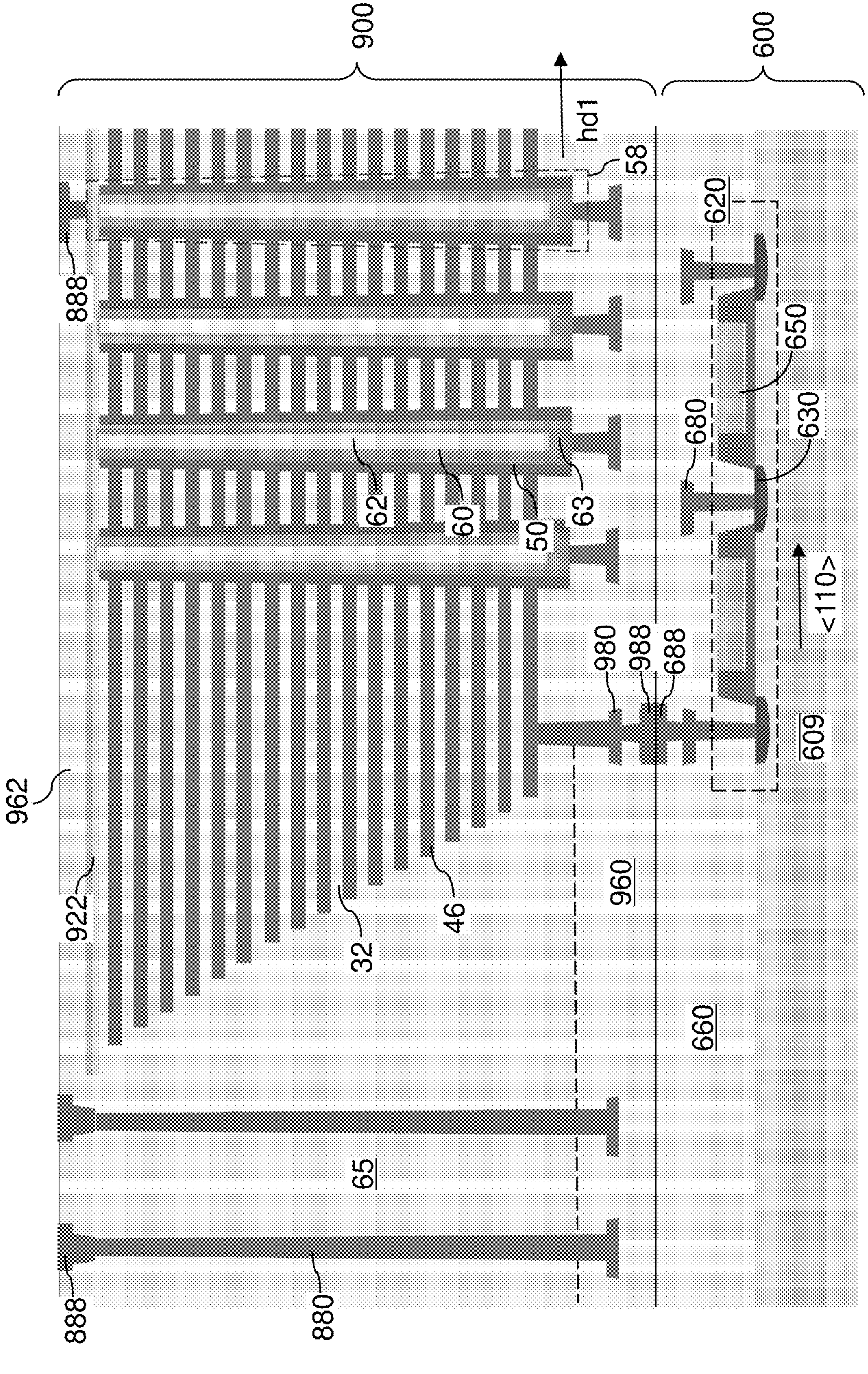
FIG. 41 is a vertical cross-sectional view of the fifth exemplary structure after formation of backside bonding pads on the memory die according to an embodiment of the present disclosure.

Referring to FIG. 41, a backside insulating layer 962 can be formed over the source layer 922. Additional via structures and backside bonding pads 888 on the backside of the memory die 900.

Figure 42:
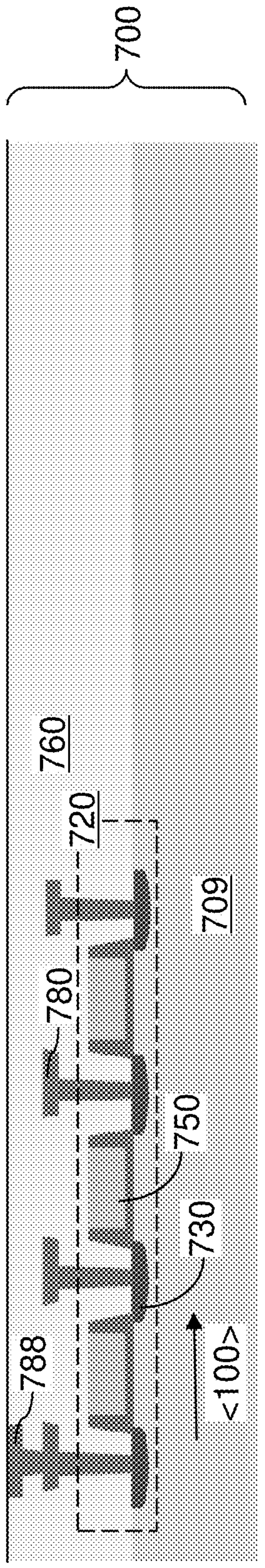
FIG. 42 is a vertical cross-sectional view of a first logic die according to an embodiment of the present disclosure.

Referring to FIG. 42, the first logic die 700 can be provided, which may be the same as the first logic die 700 described with reference to FIG. 31. The pattern of the logic-side bonding pads 788 in the first logic die 700 may have a mirror image pattern of the pattern of the backside bonding pads 888 of the memory die 900 illustrated in FIG. 41.

Figure 43:
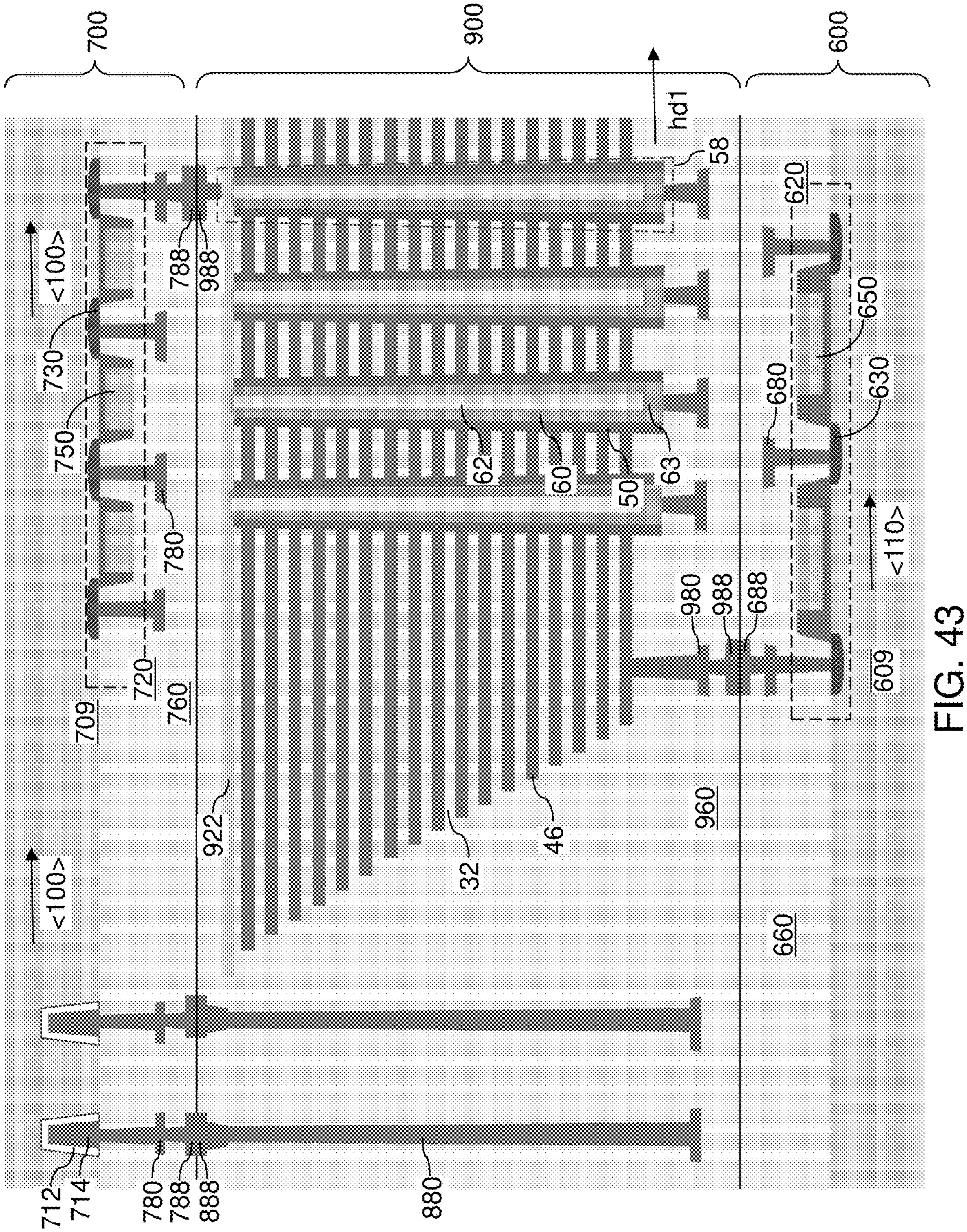
FIG. 43 is a vertical cross-sectional view of the fifth exemplary structure after formation of a bonded assembly of a memory die, a first logic die, and a second logic die according to an embodiment of the present disclosure.
Figure 44B:
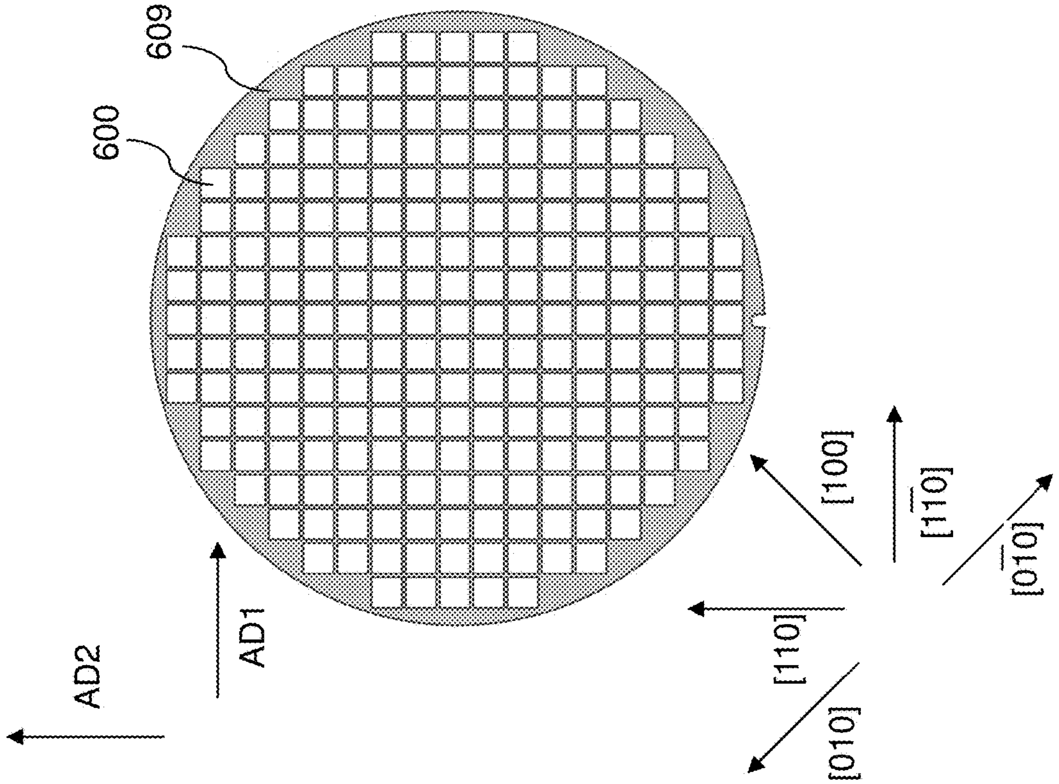
FIG. 44B is a top-down view of a second wafer including a two-dimensional array of second logic dies after the processing steps of FIG. 43 according to an embodiment of the present disclosure.
Figure 44A:
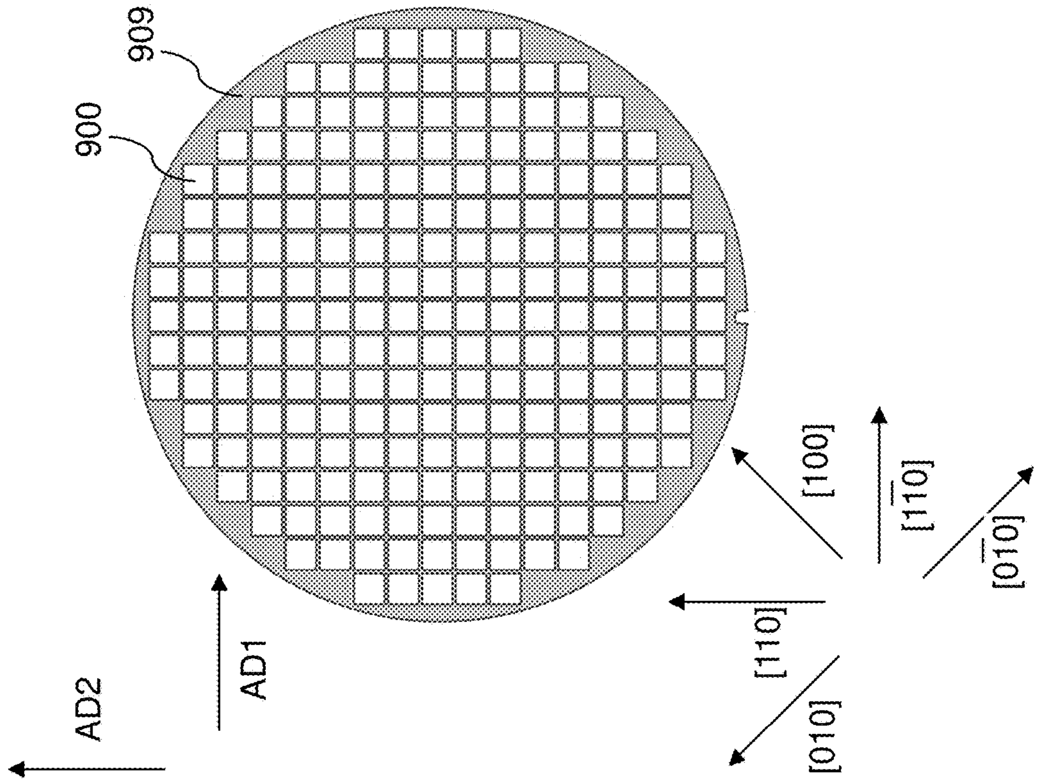
FIG. 44A is a top-down view of a first wafer including a two-dimensional array of memory dies after the processing steps of FIG. 43 according to an embodiment of the present disclosure.
Figure 44C:
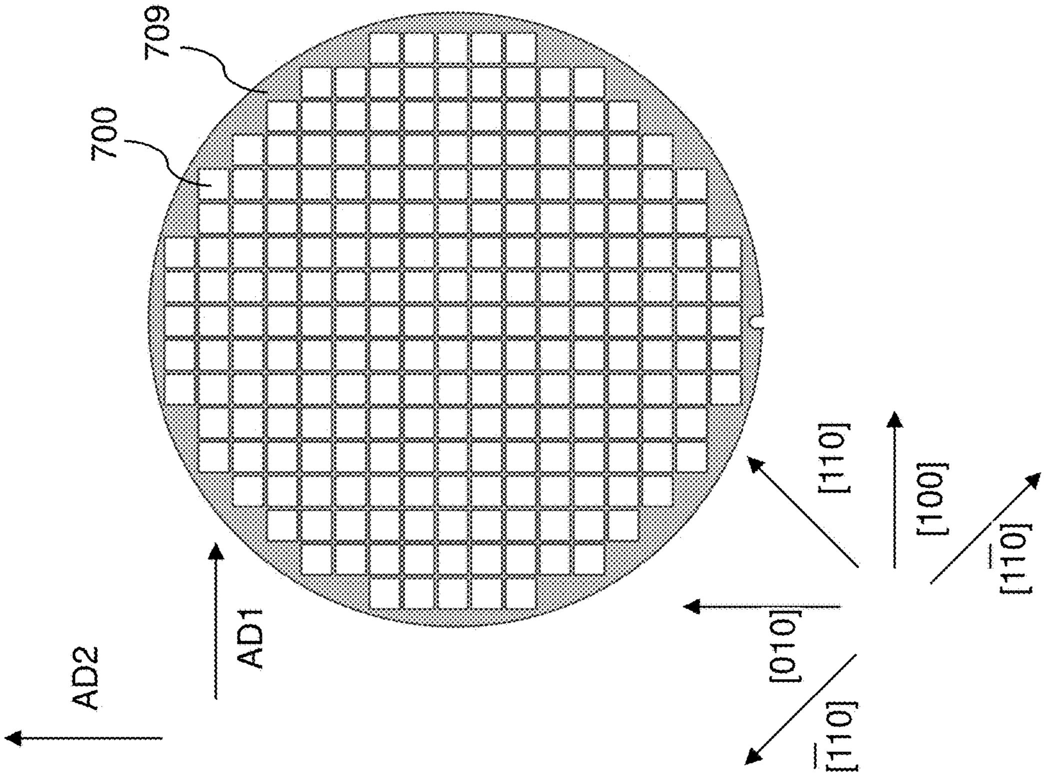
FIG. 44C is a top-down view of a third wafer including a two-dimensional array of first logic dies after the processing steps of FIG. 43 according to an embodiment of the present disclosure.

Referring to FIGS. 43 and 44A-44C, the first logic die 700 is bonded to the memory die 900. FIG. 43 is a vertical cross-sectional view of the fifth exemplary structure after bonding the first logic die 700 to the assembly of the memory die 900 and the second logic die 600. FIG. 44A is a top-down view of a first wafer 900 including a two-dimensional array of memory dies 900 after the bonding process that forms assemblies of a memory die 900, a first logic die 700, and a second logic die 600. FIG. 44B is a top-down view of a second wafer 609 including a two-dimensional array of second logic dies 600 after the bonding process. FIG. 44C is a top-down view of a third wafer 709 including a two-dimensional array of first logic dies 700 after the bonding process.

The relative orientations of the first wafer 909, the second wafer 609, and the third wafer 709 are shown after the bonding process. The first wafer 909 includes a two-dimensional array of memory dies 900, the second wafer 609 includes a two-dimensional array of second logic dies 600, and the third wafer 709 includes a two-dimensional array of first logic dies 700. After bonding, a first alignment direction AD1 of the first wafer is aligned to a first alignment direction AD1 of the second wafer and to a first alignment direction AD1 of the third wafer, and a second alignment direction AD2 of the first wafer is aligned to a second alignment direction AD2 of the second wafer and to a second alignment direction AD2 of the third wafer. The first alignment direction AD1 of the first wafer can be parallel to a <110> direction (such as a $[1\bar{1}0]$ direction) of the (001) single crystalline silicon substrate of the first wafer, the first alignment direction AD1 of the second wafer can be parallel to a <110> direction (such as a $[1\hat{1}0]$ direction) of the (001) single crystalline silicon substrate of the second wafer, and the first alignment direction AD1 of the third wafer including a two-dimensional array of first logic dies 700 can be parallel to a <100> direction (such as a [100] direction) of the (001) single crystalline silicon substrate of the third wafer.

Generally, an assembly including the memory die 900 and the first logic die 700 can be formed such that channel 732 directions of field effect transistors 746 in the first peripheral circuit 720 are aligned to a <100> crystallographic direction of a (001) single crystalline silicon substrate of the first logic die 700, and is parallel or perpendicular to the first horizontal direction hd1 of the memory die 900. Each first logic die 700 may be bonded directly to a memory die 900, for example, by metal-to-metal bonding between a set of backside bonding pads 888 and a set of logic-side bonding pads 788. In one embodiment, the word lines (as embodied as the electrically conductive layers 46) may have variable lateral extents along the first horizontal direction hd1 that decrease with a vertical distance from the first logic die 700.

During formation of the fifth exemplary structure illustrated in FIGS. 43 and 44A-44C, a second logic die 600 can be bonded to the memory die 900. The first logic die 700 is bonded to the memory die 900 on an opposite side of the second logic die 600. Generally, an assembly including the memory die 900, the first logic die 700 and the second logic die 600 can be formed such that channel 732 directions of field effect transistors 764 in the first peripheral circuit 720 are aligned to a <100> crystallographic direction of the first (001) single crystalline silicon substrate 709, and is parallel or perpendicular to the first horizontal direction hd1 of the memory die 900.

Figure 45:
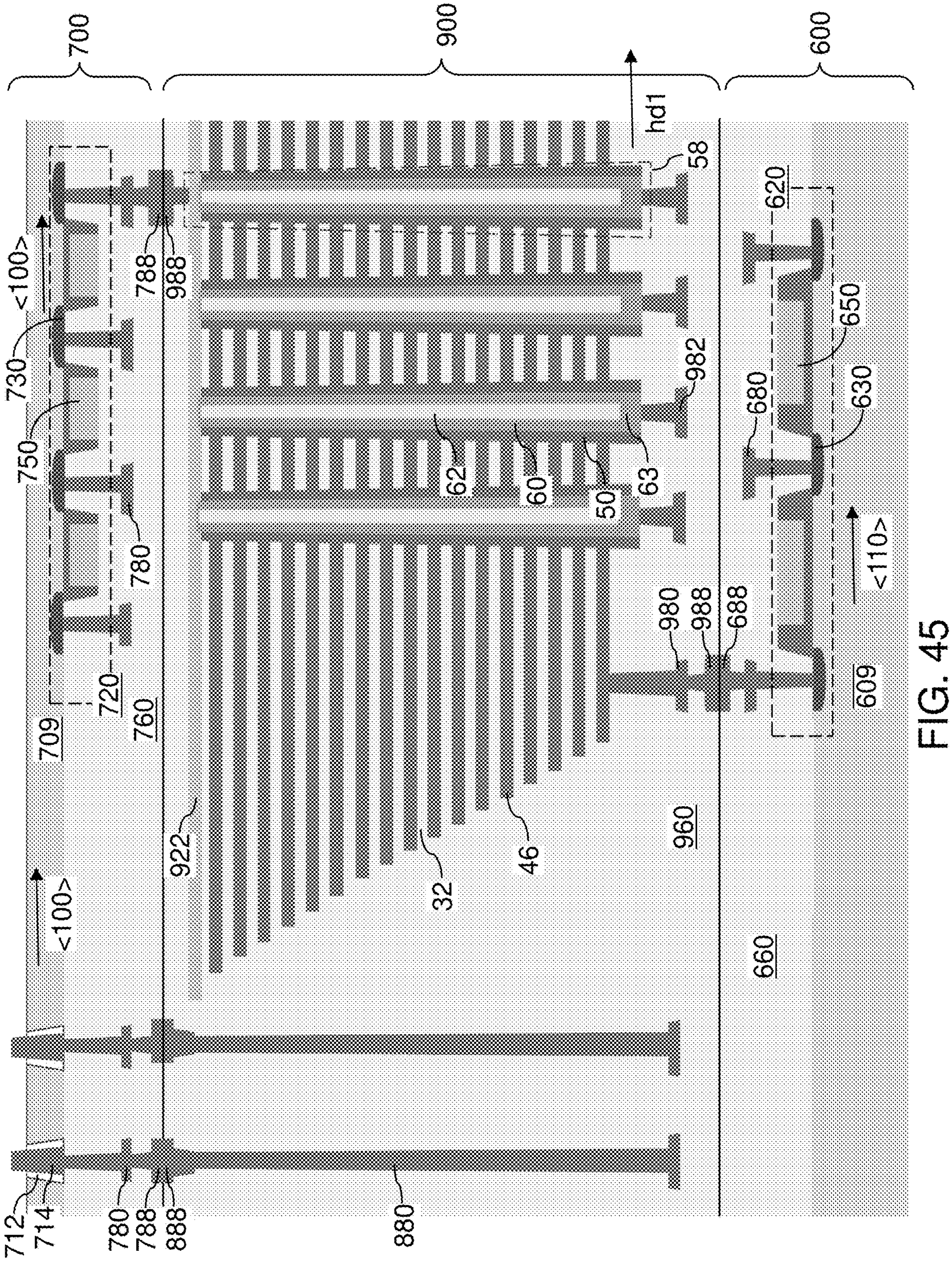
FIG. 45 is a vertical cross-sectional view of the fifth exemplary structure after thinning the backside of the logic-side silicon substrate of the first logic die according to an embodiment of the present disclosure.

Referring to FIG. 45, the logic-side silicon substrate 709 of the first logic die 700 can be thinned from the backside, for example, by grinding, polishing, an anisotropic etch process, and/or an isotropic etch process. The logic-side silicon substrate 709 can be thinned at least until end portions of the insulating spacers 712 are removed and surfaces of the through-substrate via structures 714 (if present) are exposed. The logic-side silicon substrate 709 may be further recessed by a recess distance in a range from 100 nm to 1,000 nm after exposure of the end surfaces of the through-substrate via structures 714.

The thickness of the first logic-side silicon substrate 709 after the thinning process may be in a range from 2 microns to 40 microns. In contrast, the thickness of the memory-side silicon substrate 909 is not changed, and thus, may be in a range from 400 microns to 1,200 microns. Thus, the memory-side silicon substrate 909 may have a thickness that is greater than a thickness of the first logic-side silicon substrate 709 at least by a factor of 5. Due to the greater thickness of the memory-side silicon substrate 909 relative to the thickness of the first logic-side silicon substrate 709, the pattern of mechanical stress and deformation of the alternating stacks (32, 46) is substantially the same as the pattern of mechanical stress and deformation prior to bonding the memory dies 900 to the logic dies 700.

Figure 46:
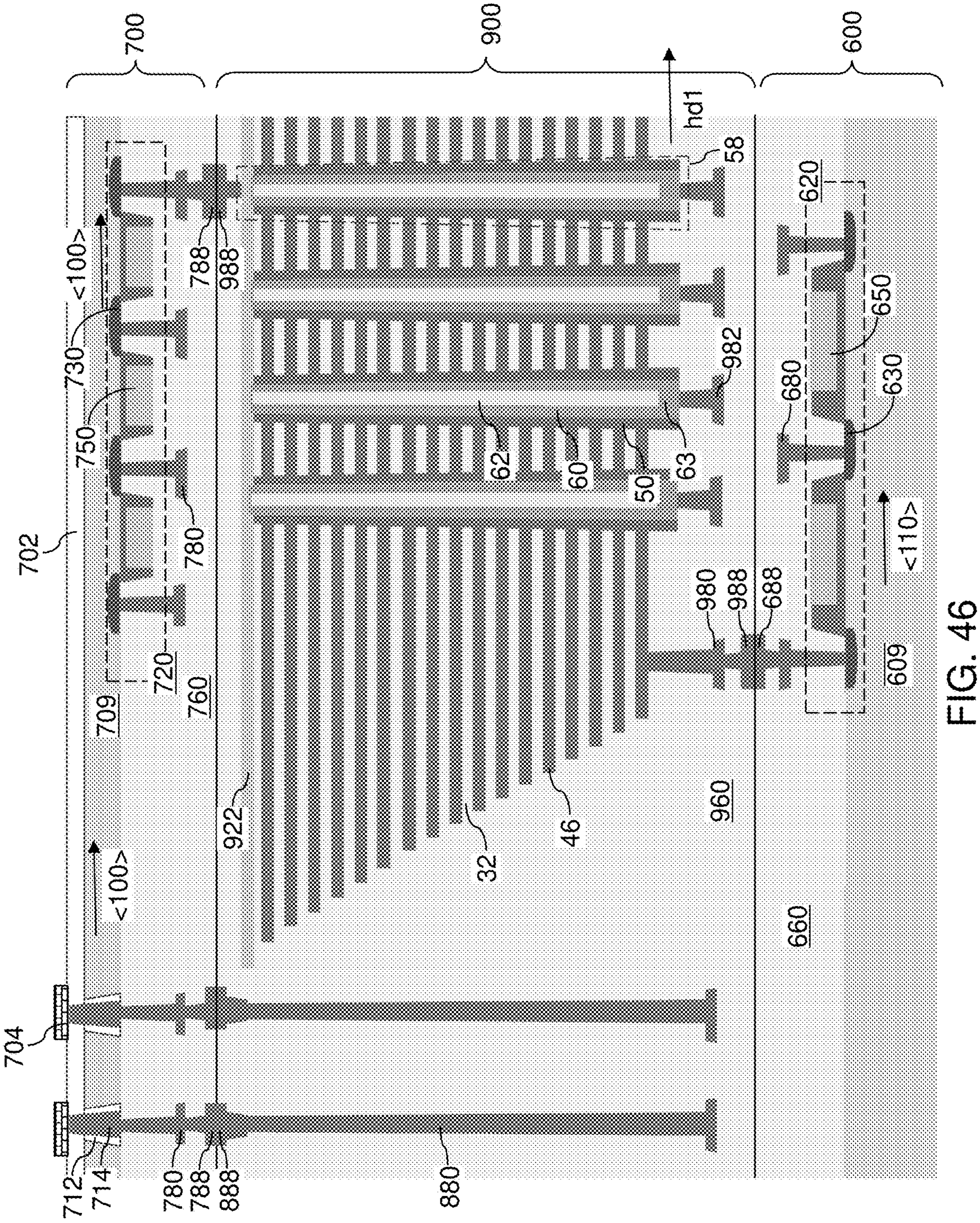
FIG. 46 is a vertical cross-sectional view of the fifth exemplary structure after formation of backside bonding pads according to an embodiment of the present disclosure.

Referring to FIG. 46, a backside insulating layer 702 can be formed on the backside surface of the thinned first logic-side silicon substrate 709. Backside bonding pads 704 can be formed over the backside insulating layer 702 on a physically exposed surface of a respective one of the through-substrate via structures 714, which can be electrically connected to electrical nodes (e.g., bit lines 982) of the three-dimensional memory array through the logic-side metal interconnect structures 780, the logic-side bonding pads 788, the memory-side bonding pads 988, and the memory-side metal interconnect structures 980. In one embodiment, the memory die 900 comprises backside bonding pads 888; and the first logic die 700 comprises first logic-side bonding pads 788 that are bonded to the backside bonding pads 888 by metal-to-metal bonding.

Figure 47:
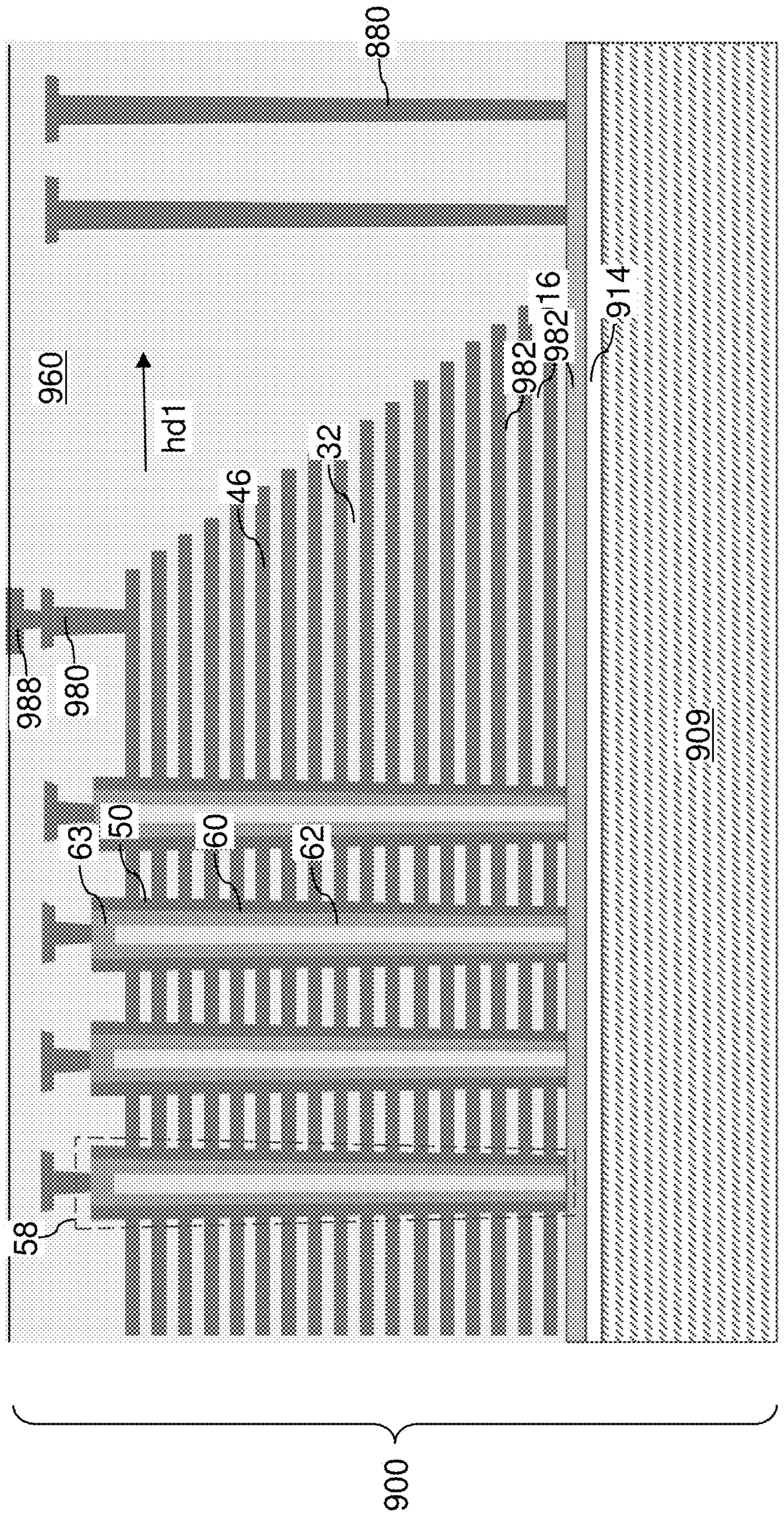
FIG. 47 is a vertical cross-sectional view of a sixth exemplary structure including a memory die according to an embodiment of the present disclosure.

Referring to FIG. 47, a sixth exemplary structure according to an embodiment of the present disclosure comprises a memory die 900, which may be the same as the memory die 900 illustrated in FIG. 36.

Figure 48:
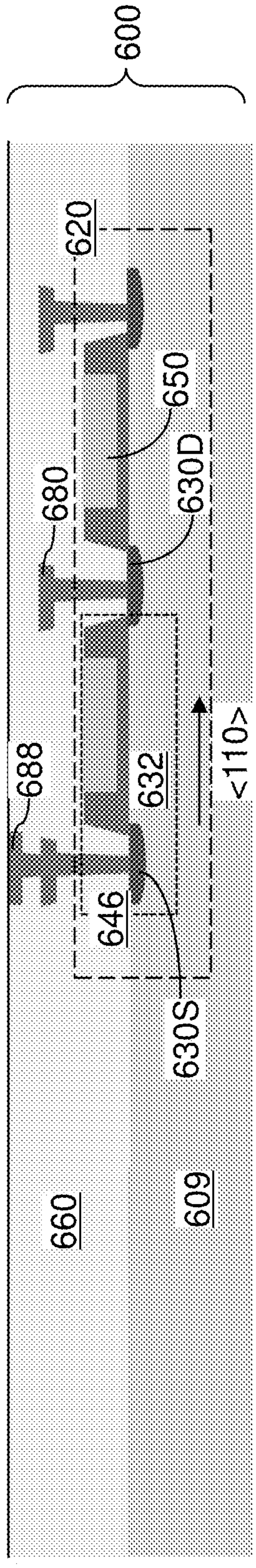
FIG. 48 is a vertical cross-sectional view of a second logic die according to an embodiment of the present disclosure.

Referring to FIG. 48, the second logic die 600 is illustrated, which may be the same as the second logic die 600 illustrated in FIG. 37.

Figure 49:
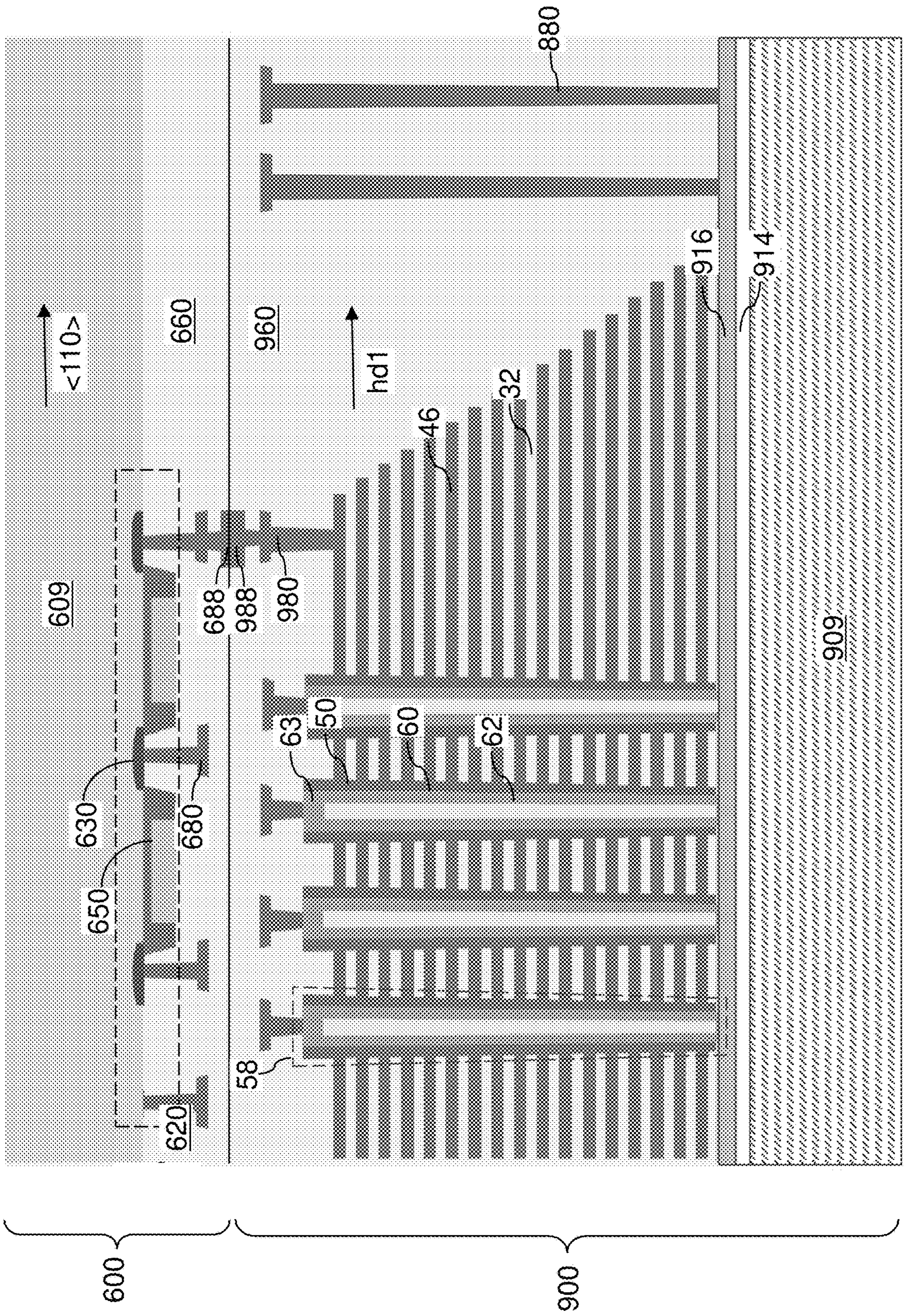
FIG. 49 is a vertical cross-sectional view of the sixth exemplary structure after bonding the memory die and the second logic die according to an embodiment of the present disclosure.

Referring to FIG. 49, the processing steps described with reference to FIG. 38 can be performed to form a bonded assembly of a memory die 900 and a second logic die 600.

Figure 50:
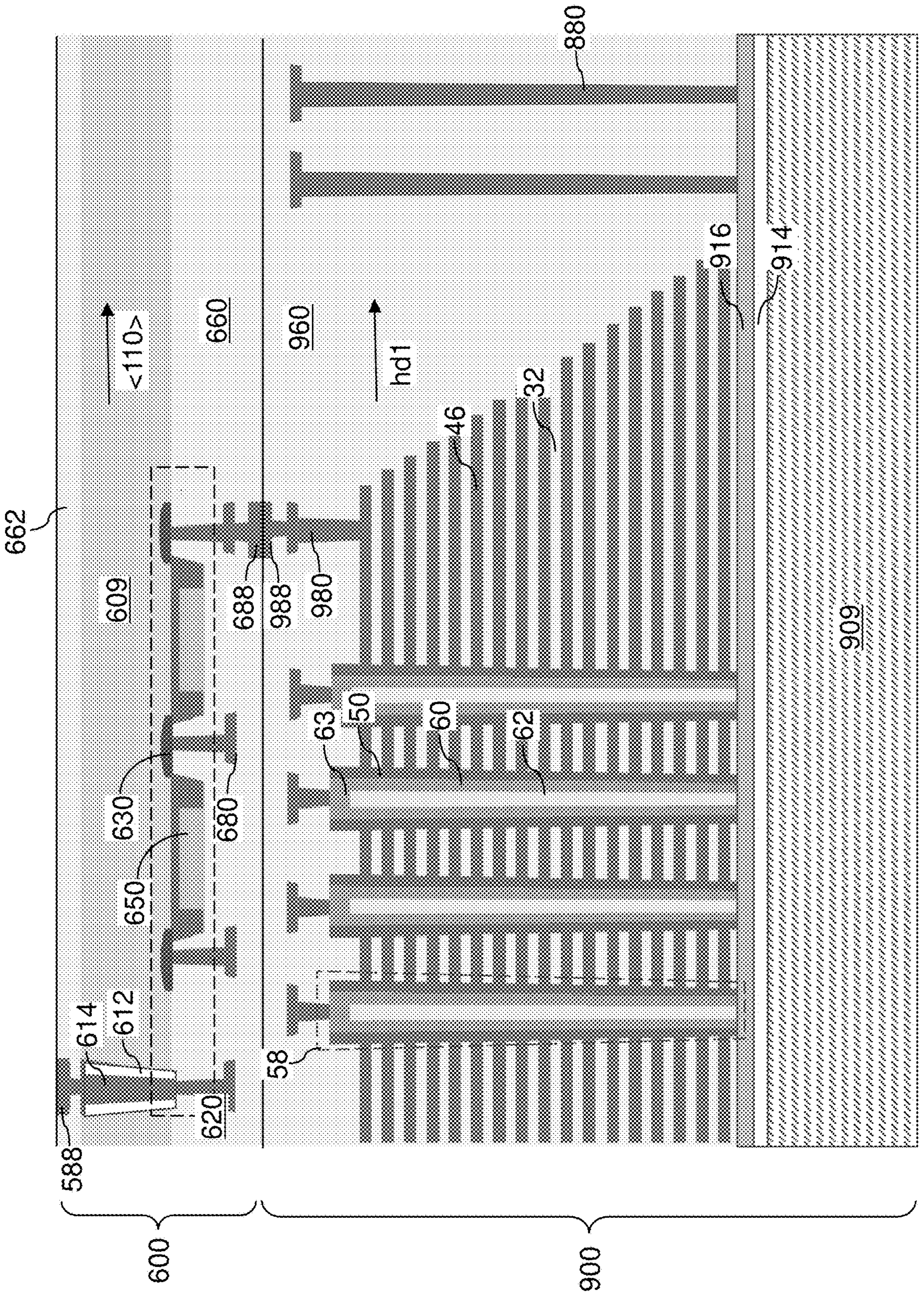
FIG. 50 is a vertical cross-sectional view of the sixth exemplary structure after thinning the logic-side silicon substrate and forming through-substrate via structures and backside bonding pads according to an embodiment of the present disclosure.

Referring to FIG. 50, the second logic-side silicon substrate 609 of the second logic die 600 can be thinned from the backside, for example, by grinding, polishing, an anisotropic etch process, and/or an isotropic etch process. The thinned second logic-side silicon substrate 609 may have a thickness in a range from 2 microns to 40 microns, although lesser and greater thicknesses may also be employed. Through-substrate via structures 614 embedded in insulating spacers 612 can be formed through the second logic-side silicon substrate 609 on a respective one of the second logic-side metal interconnect structures 680. Subsequently, a backside insulating layer 662 can be formed on the backside surface of the second logic-side silicon substrate 609, and backside bonding pads 588 can be formed in the backside insulating layer such that each of the backside bonding pads 588 is electrically connected to a respective one of the through-substrate via structures 614.

Figure 51:
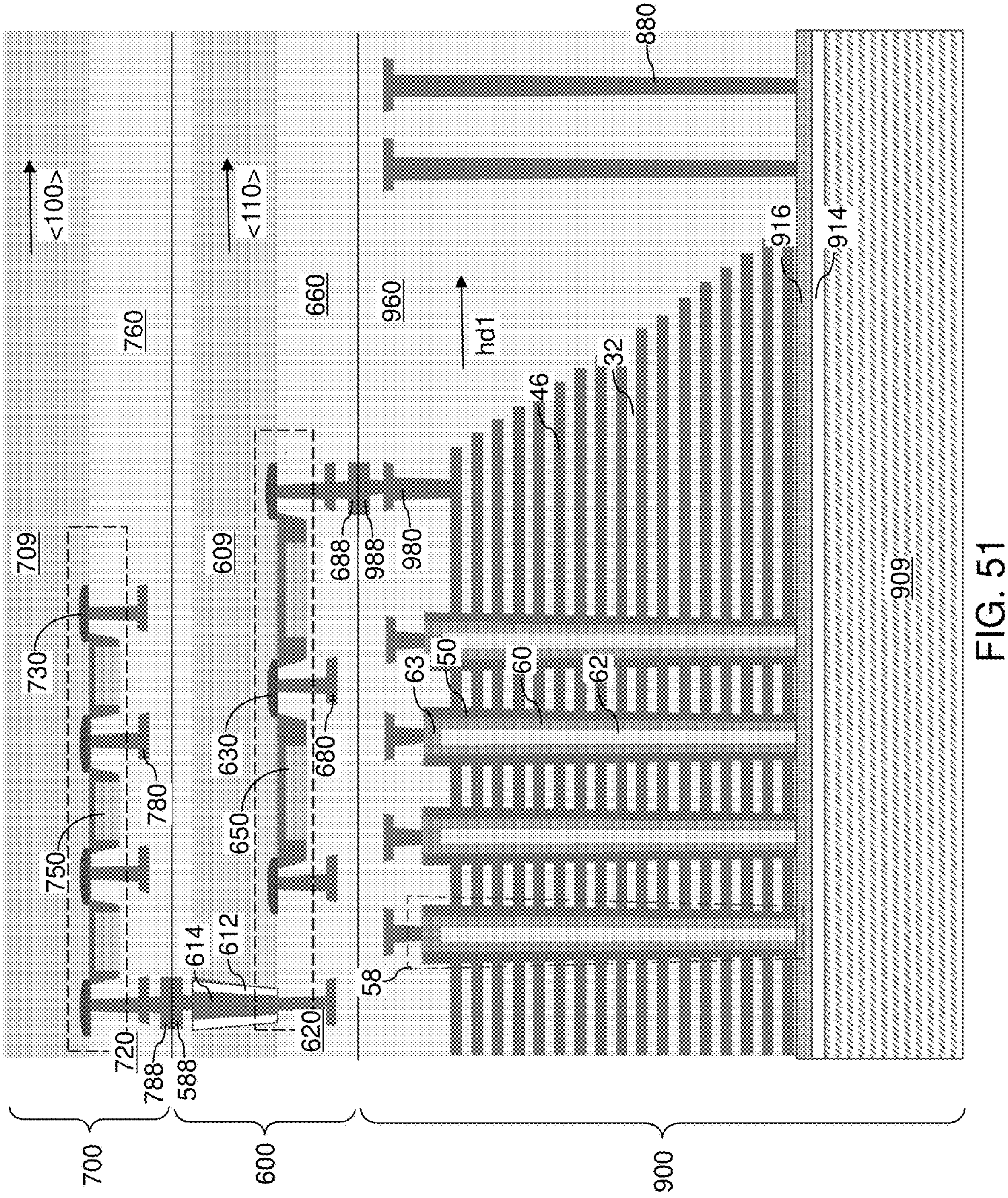
FIG. 51 is a vertical cross-sectional view of the sixth exemplary structure after formation of a bonded assembly of a memory die, a first logic die, and a second logic die according to an embodiment of the present disclosure.

Referring to FIG. 51, the first logic die 700, which may have a same set of structural components as the first logic die 700 illustrated in FIG. 42, may be bonded to the second logic die 600. In the sixth exemplary structure, a from side of the second logic die 600 can be bonded directly to the memory die 900 and the first logic die 700 can be bonded directly to the backside of the second logic die 600. Thus, the first logic die 700 is indirectly bonded to the memory die 900 in this embodiment. In this case, the second logic die 600 can be interposed between the memory die 900 and the first logic die 700, and both logic dies (600, 700) are located over the same side of the memory die 900.

Figure 52:
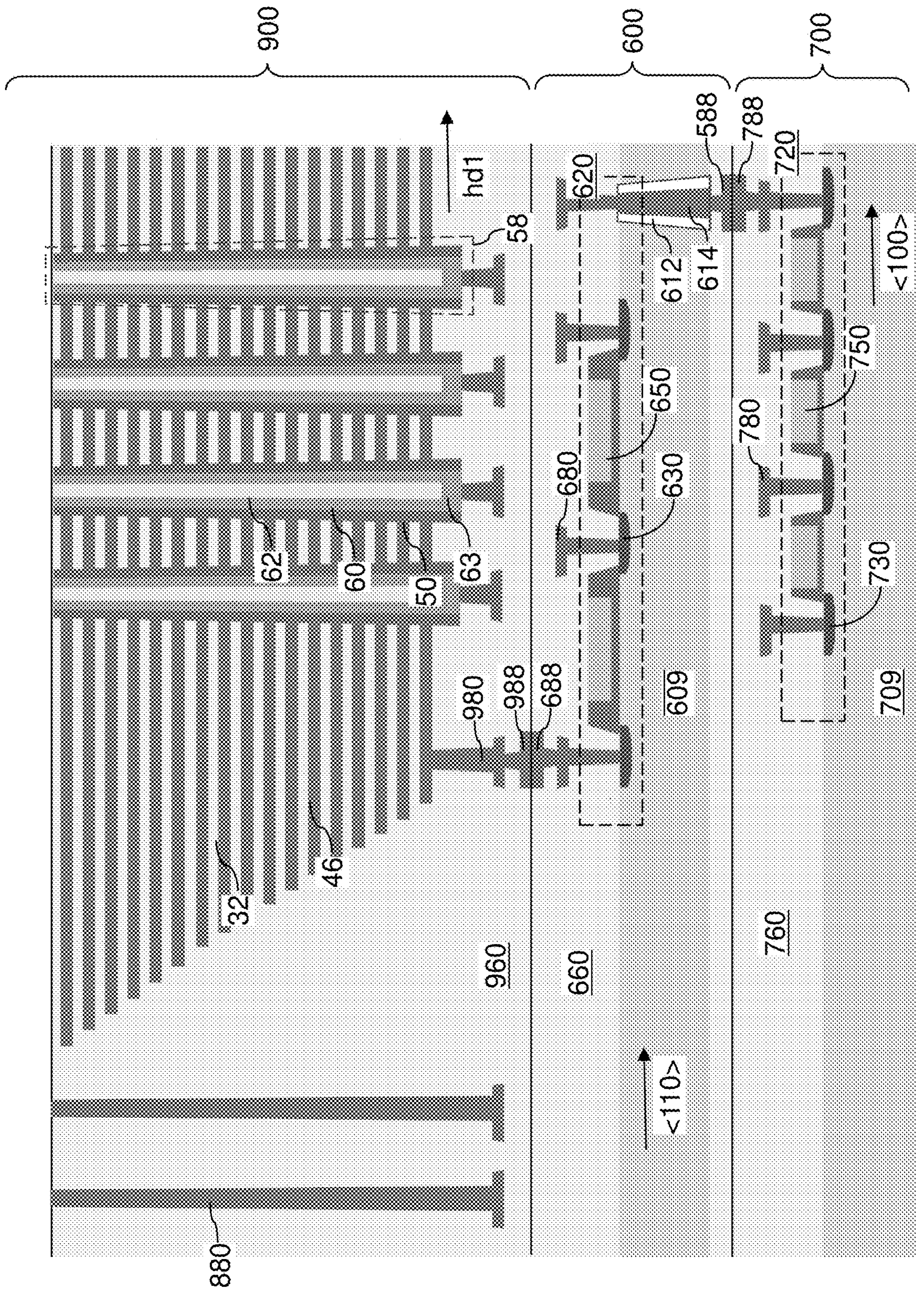
FIG. 52 is a vertical cross-sectional view of the sixth exemplary structure after removal of a carrier substrate of the memory die according to an embodiment of the present disclosure.

Referring to FIG. 52, the processing steps described with reference to FIGS. 39 and 40A can be optionally performed to remove the memory-side silicon substrate 909. The planarization stopper layer 914, if present, may be subsequently removed. Subsequently, the processing steps described with reference to FIG. 40B can be performed to remove the planar sacrificial layer 916. The processing steps described with reference to FIG. 40C can be performed thereafter to physically expose end portions of the vertical semiconductor channels 60.

Figure 53:
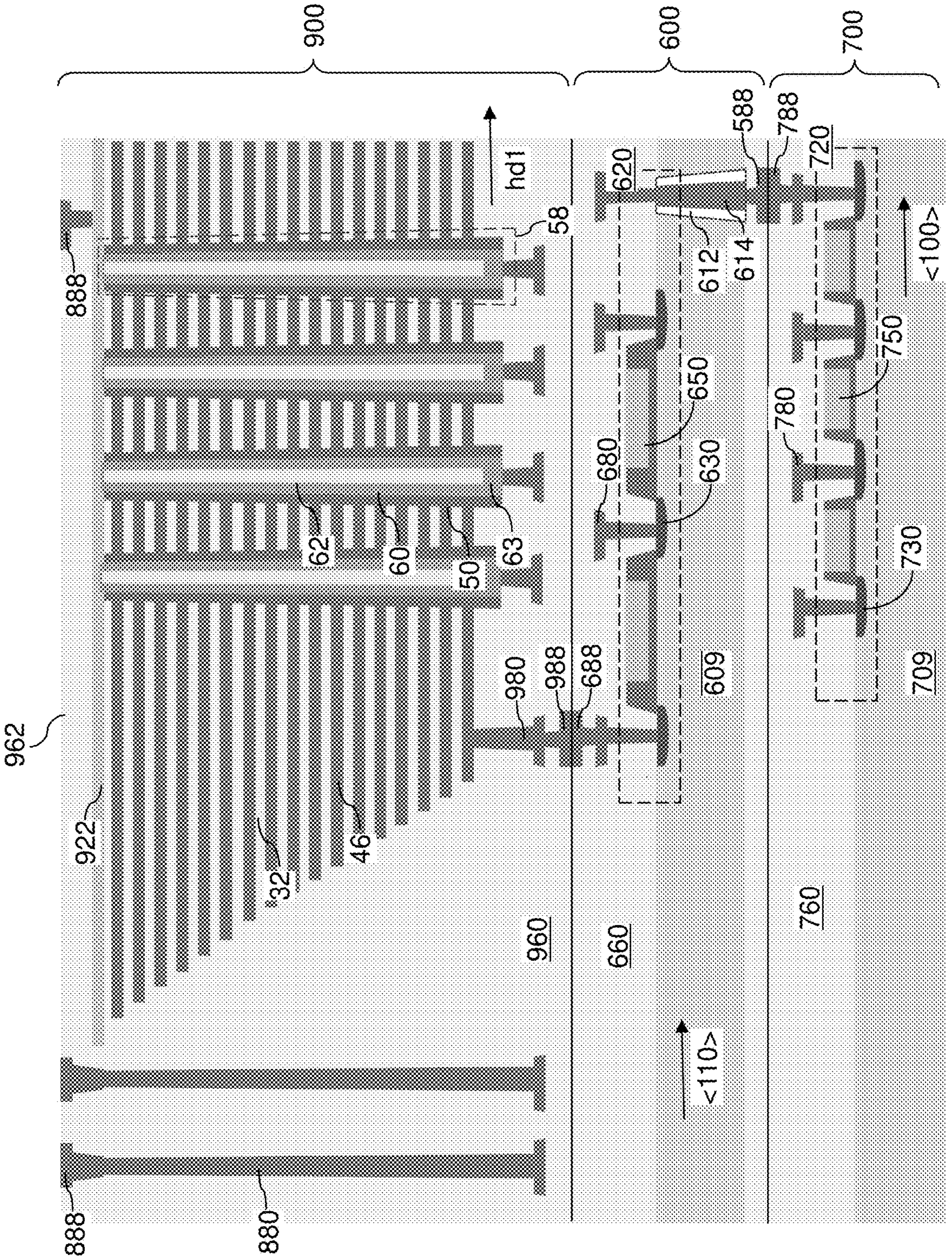
FIG. 53 is a vertical cross-sectional view of the sixth exemplary structure after formation of a source layer and backside bonding pads according to an embodiment of the present disclosure.

Referring to FIG. 53, the processing steps described with reference to FIG. 40D can be performed to form a source layer 922 on the physically exposed surfaces of the vertical semiconductor channels 60. The processing steps described with reference to FIG. 41 can be performed to form a backside insulating layer 962 over the source layer 922. Additional via structures and backside bonding pads 888 on the backside of the memory die 900. Alternatively, the steps shown in FIGS. 52 and 53 may be omitted if the source layer 922 is formed over the substrate 906 during a prior step.

Referring to FIGS. 1-53 and according to various embodiments of the present disclosure, a bonded assembly comprising a memory die 900 and a first logic die 700 is provided. The memory die 900 contains a three-dimensional memory array. The first logic die 700 is directly or indirectly bonded to the memory die 900. A first peripheral circuit 720 is located in the logic die 900 and configured to control operation of a first set of electrical nodes (e.g., bit lines 982) of the three-dimensional memory array, and a second peripheral circuit (945 or 620) configured to control operation of a second set of electrical nodes (e.g., word lines 46) of the three-dimensional memory array, where the second peripheral circuit is located at a different vertical level than the first peripheral circuit relative to the three-dimensional-memory array.

In one embodiment, the three-dimensional memory array comprises alternating stacks (32, 46) of respective insulating layers 32 and respective electrically conductive layers 46; memory opening fill structures 58 extending through the respective alternating stack and each comprising a vertical semiconductor channel 60 and a vertical stack of memory elements (e.g., portions of the memory film 50); and lateral isolation trench fill structures (74, 76), 176} that laterally extend along a first horizontal direction hd1 and that are located between adjacent alternating stacks.

In one embodiment the first logic die 700 further comprises a first logic-side silicon substrate 709 which is a first (001) single crystalline silicon substrate. The first peripheral circuit 720 is located on a horizontal surface of the first logic-side silicon substrate 709. Channel 732 directions of field effect transistors 746 in the first peripheral circuit 720 are aligned to a <100> crystallographic direction of the first (001) single crystalline silicon substrate 709, and are parallel or perpendicular to the first horizontal direction hd1 of the memory die 900.

In one embodiment, the memory die 900 further comprises a memory-side silicon substrate 909 which is a second (001) silicon substrate, which is more distal from the first logic die 700 than the three-dimensional memory array is from the first logic die 700; and the memory-side silicon substrate 909 has a thickness that is greater than a thickness of the first logic-side silicon substrate 709 at least by a factor of 5. In one embodiment, the thickness of the memory-side silicon substrate 909 is in a range from 400 microns to 1,200 microns; and the thickness of the first logic-side silicon substrate 709 is in a range from 2 microns to 40 microns.

In one embodiment, the memory die 900 is free of any through-substrate via structure that extends through the memory-side silicon substrate 909. In one embodiment, the second peripheral circuit (such as the under-array peripheral circuit 945) is located on a horizontal surface of the memory-side silicon substrate 909.

In one embodiment, the memory die 900 comprises: first metal interconnect structures (such as under-array metal interconnect structures 948) embedded in first dielectric material layers (such as under-array dielectric material layers 940) located between the memory-side silicon substrate 909 and the three-dimensional memory array; and second metal interconnect structures (such as memory-side metal interconnect structures 980) embedded in second dielectric material layers (such as memory-side dielectric material layers 960) located between the three-dimensional memory array of the first logic die 700.

In one embodiment, the memory die 900 further comprises and a source layer 922 that is electrically connected to end portions of the vertical semiconductor channels 60, wherein the source layer 922 is more distal from the first logic die 700 than the alternating stacks (32, 46) are from the first logic die 700. In one embodiment, the memory die 900 comprises memory-side bonding pads 988; and the first logic die 700 comprises first logic-side bonding pads 788 that are bonded to the memory-side bonding pads 988 by metal-to-metal bonding.

In one embodiment, the bonded assembly comprises: through-substrate via structures 714 vertically extending through the first logic-side silicon substrate 709; and backside bonding pads 704 located on a backside on the first logic-side silicon substrate 709 and in electrical contact with a respective one of the through-substrate via structures 714.

In one embodiment, the bonded assembly comprises a second logic die 600 that is bonded to the memory die 900, wherein the second peripheral circuit 620 is located in the second logic die 600. In one embodiment, the second logic die 600 is bonded to a second side of the memory die 900, and the first logic die 700 is bonded to a first side of the memory die 900 which is opposite to the second side.

In one embodiment, the second logic die 600 is interposed between the memory die 900 and the first logic die 700; the memory die 900 is bonded to a front side of the second logic die 600; and the first logic die 700 is bonded to a backside of the second logic die 600. In one embodiment, the word lines have variable lateral extents along the first horizontal direction hd1 that increase with a vertical distance from the first logic die 700.

In one embodiment, the second logic die 600 comprises a second logic-side silicon substrate 609 which is a second (001) single crystalline silicon substrate; the second peripheral circuit 620 is located on the second logic-side silicon substrate 609; and channel directions of field effect transistors in the second peripheral circuit 620 are aligned to a <110> crystallographic direction of the second (001) single crystalline silicon substrate.

The various embodiments of the present disclosure can be employed to provide a bonded assembly including a memory die 900 and at least a first logic die 700 that is configured to minimize warpage or structural deformation of the alternating stacks (32, 46) while improving the drive current of the transistors 746 in the first logic die 700. Specifically, a (001) single crystalline silicon substrate is provided adjacent to the alternating stacks (32, 46) of insulating layers 32 and electrically conductive layers 46 such that a <110> direction of the (001) single crystalline silicon substrate is parallel to lengthwise direction of backside trenches 79, such as the first horizontal direction hd1. The (001) single crystalline silicon substrate providing the <110> direction that is parallel to the lengthwise direction of the backside trenches 79 may comprise substrate 909 of the memory die 900 as illustrated in FIG. 35, or may comprise substrate 609 of the second logic die 600 as illustrated in FIG. 46 or in FIG. 53.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A bonded assembly, comprising:

a memory die comprising a three-dimensional memory array;

a first logic die bonded to the memory die;

a first peripheral circuit located in the logic die and configured to control operation of a first set of electrical nodes of the three-dimensional memory array; and a second peripheral circuit configured to control operation of a second set of electrical nodes of the three-dimensional memory array, wherein the second peripheral circuit is located at a different vertical level than the first peripheral circuit relative to the three-dimensional-memory array, wherein the first logic die further comprises a first logic-side silicon substrate which is a first (001) single crystalline silicon substrate, the first peripheral circuit is located on a horizontal surface of the first single crystalline silicon substrate, and channel directions of field effect transistors in the first peripheral circuit are aligned to a <100> crystallographic direction of the first (001) single crystalline silicon substrate, and are parallel or perpendicular to a first horizontal direction of the memory die;

wherein the memory die further comprises a memory-side silicon substrate which is a second (001) silicon substrate, the second (001) silicon substrate is more distal from the first logic die than the three-dimensional memory array is from the first logic die, and the second (001) silicon substrate has a thickness that is greater than a thickness of the first (001) silicon substrate at least by a factor of 5.

2. The bonded assembly of claim 1, wherein the three-dimensional memory array comprises:

alternating stacks of respective insulating layers and respective electrically conductive layers;

memory opening fill structures extending through the respective alternating stack and each comprising a vertical semiconductor channel and a vertical stack of memory elements; and lateral isolation trench fill structures that laterally extend along the first horizontal direction and that are located between adjacent alternating stacks.

3. The bonded assembly of claim 2, wherein:

the memory die is free of any through-substrate via structure that extends through the memory-side silicon substrate; and the second peripheral circuit is located on a horizontal surface of the memory-side silicon substrate.

4. The bonded assembly of claim 3, wherein the memory die further comprises:

first metal interconnect structures embedded in first dielectric material layers located between the memory-side silicon substrate and the three-dimensional memory array; and second metal interconnect structures embedded in second dielectric material layers located between the three-dimensional memory array of the first logic die.

5. The bonded assembly of claim 2, wherein the memory die further comprises a source layer that is electrically connected to end portions of the vertical semiconductor channels, wherein the source layer is more distal from the first logic die than the alternating stacks are from the first logic die.

6. The bonded assembly of claim 2, wherein:

the memory die comprises memory-side bonding pads; and the first logic die comprises first logic-side bonding pads that are bonded to the memory-side bonding pads by metal-to-metal bonding.

7. The bonded assembly of claim 2, further comprising: through-substrate via structures vertically extending through the first logic-side silicon substrate; and backside bonding pads located on a backside on the first logic-side silicon substrate and in electrical contact with a respective one of the through-substrate via structures.

8. The bonded assembly of claim 1, wherein the electrically conductive layers have variable lateral extents along the first horizontal direction with respect to a vertical distance from the first logic die.

* * * * *